United States Patent [19]
Dykstal et al.

[11] Patent Number: 6,000,019
[45] Date of Patent: Dec. 7, 1999

[54] SDRAM DATA ALLOCATION SYSTEM AND METHOD UTILIZING DUAL BANK STORAGE AND RETRIEVAL

[75] Inventors: John Dykstal; Byron A. Alcorn; Darel N. Emmot, all of Fort Collins, Colo.

[73] Assignee: Hewlett-Packard Company, Palo Alto, Calif.

[21] Appl. No.: 08/841,187

[22] Filed: Apr. 29, 1997

Related U.S. Application Data

[63] Continuation of application No. 08/466,865, Jun. 6, 1995, abandoned.

[51] Int. Cl.⁶ .............................. G06F 13/00; G06F 12/00
[52] U.S. Cl. ...................... 711/157; 711/104; 711/127; 711/118
[58] Field of Search .................. 364/DIG. 1, DIG. 2, 364/130; 711/104, 127, 157, 154, 3, 755, 200

[56] References Cited

U.S. PATENT DOCUMENTS

| | | | |
|---|---|---|---|
| 4,924,375 | 5/1990 | Fung et al. | 395/484 |
| 5,051,889 | 9/1991 | Fung et al. | 395/484 |
| 5,161,221 | 11/1992 | Van Nostrand | 395/484 |
| 5,274,788 | 12/1993 | Kolke | 395/484 |
| 5,293,607 | 3/1994 | Brockmann et al. | 395/484 |
| 5,341,486 | 8/1994 | Castle | 395/484 |
| 5,388,206 | 2/1995 | Poulton et al. | 395/163 |
| 5,412,788 | 5/1995 | Collins et al. | 395/484 |
| 5,440,713 | 8/1995 | Lin et al. | 395/485 |
| 5,446,691 | 8/1995 | North et al. | 365/189.02 |
| 5,450,364 | 9/1995 | Stephens, Jr. et al. | 365/222 |
| 5,461,712 | 10/1995 | Chelstowski et al. | 395/164 |
| 5,495,563 | 2/1996 | Winser | 395/130 |
| 5,511,029 | 4/1996 | Sawada et al. | 365/201 |
| 5,519,345 | 5/1996 | Farrell et al. | 327/108 |

FOREIGN PATENT DOCUMENTS

0438194A2  7/1991  European Pat. Off. ........ G06F 15/72

*Primary Examiner*—Tuan V. Thai

[57] ABSTRACT

A system and method for allocating data among first and second banks of at least one SDRAM, the data including first, second and third words to be accessed during consecutive read operations. The method includes the following steps: storing the first and third words within the first bank, and storing the second word within the second bank. The texture mapping computer graphics system includes a host computer with a main memory that stores texture data including a plurality of texels, and a local memory that stores at least a portion of the texture data. The local memory includes at least one SDRAM.

15 Claims, 25 Drawing Sheets

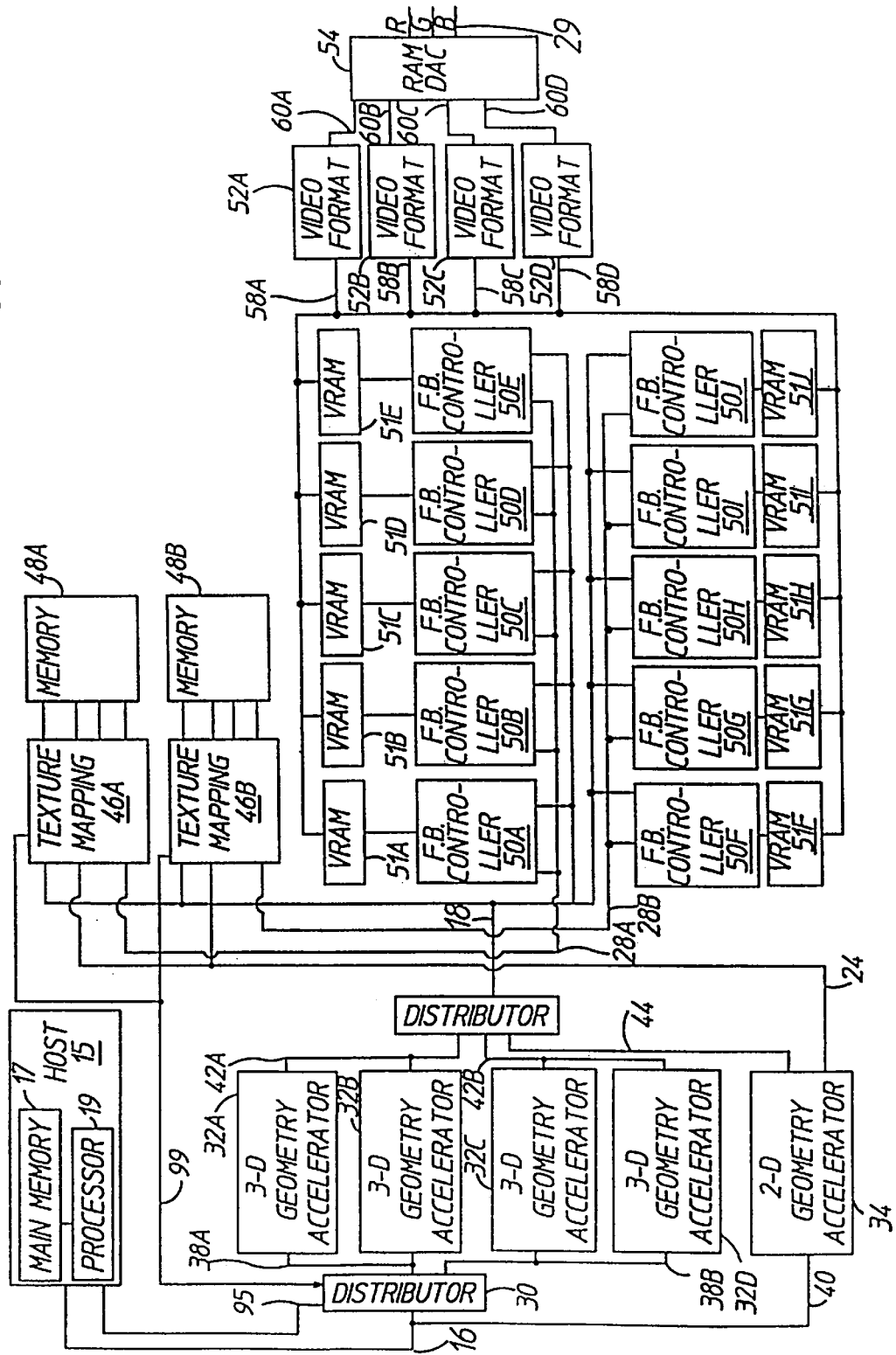

FIG 14

| $S_8, T_8 = 1, 0$<br>BLOCK 2, BANK 0 | $S_8, T_8 = 1, 1$<br>BLOCK 4, BANK 0 |
|---|---|
| $S_8, T_8 = 0, 0$<br>BLOCK 1, BANK 1 | $S_8, T_8 = 0, 1$<br>BLOCK 3, BANK 1 |

MAP 9

FIG 15

| ST0 | ST1 | ST2 | ST3 |
|---|---|---|---|
| ST4 | ST5 | ST6 | ST7 |
| ST8 | ST9 | ST10 | ST11 |
| ST12 | ST13 | ST14 | ST15 |

BLOCK 2, BANK 0

| ST0 | ST4 | ST8 | ST12 |
|---|---|---|---|
| ST1 | ST5 | ST9 | ST13 |
| ST2 | ST6 | ST10 | ST14 |
| ST3 | ST7 | ST11 | ST15 |

BLOCK 1, BANK 1

| MAP NUMBER | MAP BIT | BLOCK TAG [22:0]=(TEXTURE ID [1:0], MAP BIT, T [14:8],S[14:8]) | | BANK |
|---|---|---|---|---|
| | | T PARAMETER AXIS MSBs | S PARAMETER AXIS MSBs | |
| 15 | 0 | t14 t13 t12 t11 t10 t09 t08 | s14 s13 s12 s11 s10 s09 s08 | !t14^s14 |
| 14 | 1 | 0 t13 t12 t11 t10 t09 t08 | 0 s13 s12 s11 s10 s09 s08 | !t13^s13 |
| 13 | 1 | 1 0 t12 t11 t10 t09 t08 | 0 0 s12 s11 s10 s09 s08 | !t12^s12 |
| 12 | 1 | 1 1 0 t11 t10 t09 t08 | 0 0 0 s11 s10 s09 s08 | !t11^s11 |
| 11 | 1 | 1 1 1 0 t10 t09 t08 | 0 0 0 0 s10 s09 s08 | !t10^s10 |
| 10 | 1 | 1 1 1 1 0 t09 t08 | 0 0 0 0 0 s09 s08 | !t9^s9 |
| 9 | 1 | 1 1 1 1 1 0 t08 | 0 0 0 0 0 0 s08 | !t8^s8 |
| =8 | 1 | 1 1 1 1 1 1 0 | 0 0 0 0 0 0 0 | tag[7] |
| <8 | 1 | 1 1 1 1 1 1 1 | 0 0 0 0 0 0 0 | tag[7] |

FIG 16

| TEXEL_COMMAND REGISTER | | | | | | | |
|---|---|---|---|---|---|---|---|
| 31:9 | 8 | 7 | 6:4 | 3 | 2 | 1 | 0 |
| UNUSED | HALT | INTERRUPT ENABLED | UNUSED | WRITE LOKI 1 | WRITE LOKI 0 | UNUSED | LOKI READ |

350, 352, 356, 359, 358

| TEXEL_STATUS REGISTER | | | | | | | |
|---|---|---|---|---|---|---|---|
| 31:7 | 6 | 5 | 4 | 3 | 2 | 1 | 0 |
| UNUSED | DUAL LOKI | UNUSED | INTERRUPT VALID | INTERRUPT ENABLED | HALTED | HALT ENABLED | UNUSED |

360, 364, 362, 368, 366

| PIPE_TAG REGISTER | |
|---|---|
| 31:23 | 22:0 |
| UNUSED | BLOCK TAG |

370

| TEXEL_DATA REGISTER | | | |
|---|---|---|---|
| 31:24 | 23:16 | 15:8 | 7:0 |
| ALPHA | RED | GREEN | BLUE |

372, 374, 376, 378

| TEXEL_CACHE_ADD REGISTER | | |
|---|---|---|
| 32:22 | 21:16 | 15:0 |
| UNUSED | BLOCK INDEX | BLOCK ADDRESS |

380, 382

| TEXEL_DIR_TAG REGISTER | |
|---|---|
| 31:23 | 22:0 |
| UNUSED | BLOCK TAG |

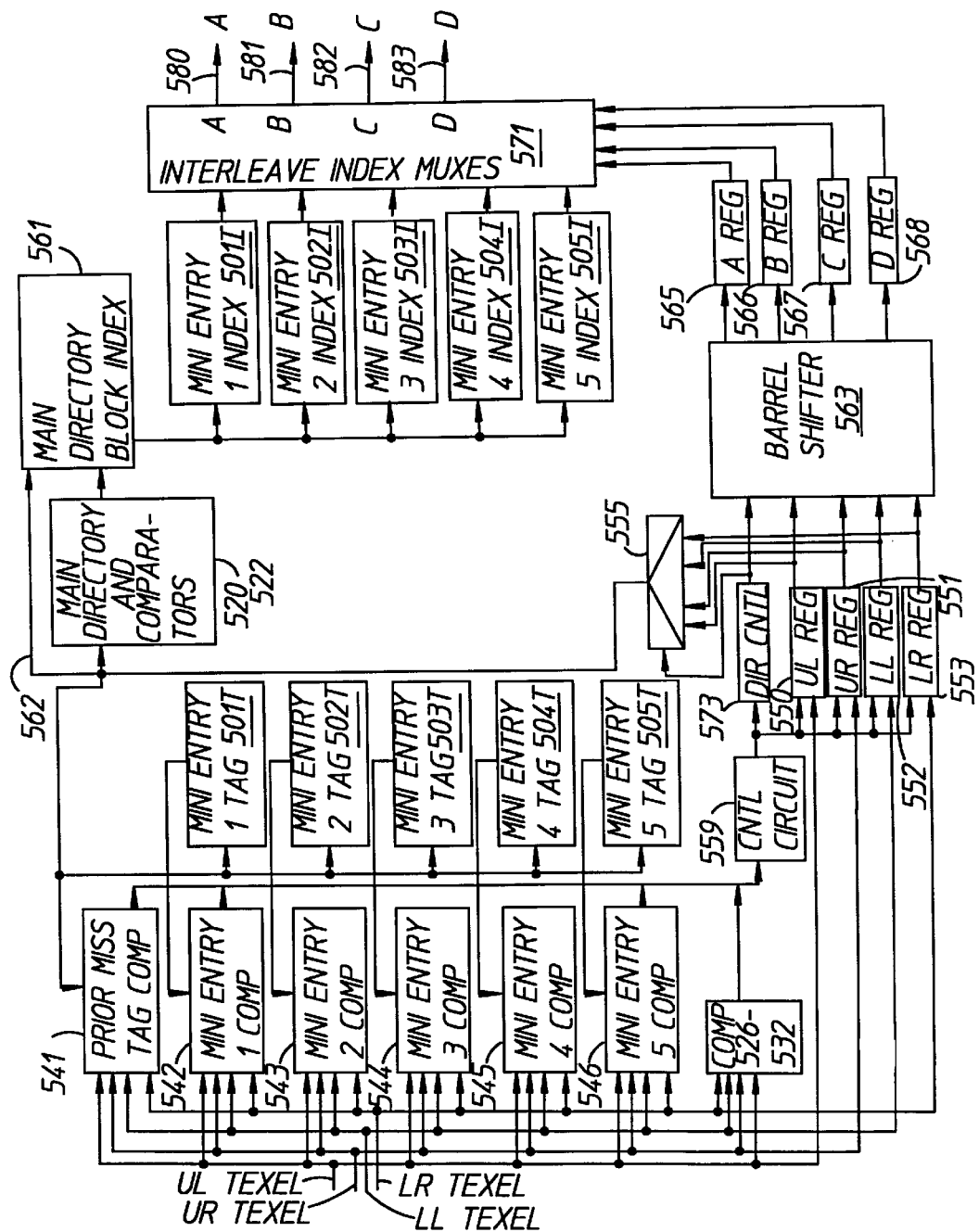

SDRAM DATA ALLOCATION SYSTEM AND METHOD UTILIZING DUAL BANK STORAGE AND RETRIEVAL

CROSS REFERENCE TO RELATED APPLICATION(S)

This is a continuation of application Ser. No. 08/466,865 filed on Jun. 6, 1995, now abandoned.

FIELD OF THE INVENTION

The present invention relates generally to a hardware memory system and, more particularly, to an SDRAM data allocation system and method.

BACKGROUND OF THE INVENTION

Computer graphics systems commonly are used for displaying graphical representations of objects on a two dimensional display screen. Current computer graphics systems can provide highly detailed representations and are used in a variety of applications.

In typical computer graphics systems, an object to be represented on the display screen is broken down into a plurality of graphics primitives. Primitives are basic components of a graphics picture and may include points, lines, vectors and polygons, such as triangles. Typically, a hardware/software scheme is implemented to render, or draw, on the two-dimensional display screen, the graphics primitives that represent the view of one or more objects being represented on the screen.

Typically, the primitives that define the three-dimensional object to be rendered are provided from a host computer, which defines each primitive in terms of primitive data. For example, when the primitive is a triangle, the host computer may define the primitive in terms of the x,y,z coordinates of its vertices, as well as the R,G,B color values of each vertex. Rendering hardware interpolates the primitive data to compute the display screen pixels that are turned on to represent each primitive, and the R,G,B values for each pixel.

Early graphics systems failed to display images in a sufficiently realistic manner to represent or model complex three-dimensional objects. The images displayed by such systems exhibited extremely smooth surfaces absent textures, bumps, scratches, shadows and other surface details present in the object being modeled.

As a result, methods were developed to display images with improved surface detail. Texture mapping is one such method that involves mapping a source image, referred to as a texture, onto a surface of a three-dimensional object, and thereafter mapping the textured three-dimensional object to the two-dimensional graphics display screen to display the resulting image. Surface detail attributes commonly texture mapped include color, specular reflection, vector perturbation, specularity, transparency, shadows, surface irregularities and grading.

Texture mapping involves applying one or more point elements (texels) of a texture to each point element (pixel) of the displayed portion of the object to which the texture is being mapped. Texture mapping hardware is conventionally provided with information indicating the manner in which the texels in a texture map correspond to the pixels on the display screen that represent the object. Each texel in a texture map is defined by S and T coordinates which identify its location in the two-dimensional texture map. For each pixel, the corresponding texel or texels that map to it are accessed from the texture map, and incorporated into the final R,G,B values generated for the pixel to represent the textured object on the display screen.

It should be understood that each pixel in an object primitive may not map in one-to-one correspondence with a single texel in the texture map for every view of the object. For example, the closer the object is to the view port represented on the display screen, the larger the object will appear. As the object appears larger on the display screen, the representation of the texture becomes more detailed. Thus, when the object consumes a fairly large portion of the display screen, a large number of pixels is used to represent the object on the display screen, and each pixel that represents the object may map in one-to-one correspondence with a single texel in the texture map, or a single texel may map to multiple pixels. However, when the object takes up a relatively small portion of the display screen, a much smaller number of pixels is used to represent the object, resulting in the texture being represented with less detail, so that each pixel may map to multiple texels. Each pixel may also map to multiple texels when a texture is mapped to a small portion of an object. Resultant texel data is calculated for each pixel that maps to more than one texel, and typically represents an average of the texels that map to that pixel.

Texture mapping hardware systems typically include a local memory that stores data representing a texture associated with the object being rendered. As discussed above, a pixel may map to multiple texels. If it were necessary for the texture mapping hardware to read a large number of texels that map to a pixel from the local memory to generate an average value, then a large number of memory reads and the averaging of many texel values would be required, which would be time consuming and would degrade system performance.

To overcome this problem, a scheme has been developed that involves the creation of a series of MIP maps for each texture, and storing the MIP maps of the texture associated with the object being rendered in the local memory of the texture mapping hardware. A MIP map for a texture includes a base map that corresponds directly to the texture map, as well as a series of filtered maps, wherein each successive map is reduced in size by a factor of two in each of the two texture map dimensions. An illustrative example of a set of MIP maps is shown in FIG. 1. The MIP (multum in parvo-many things in a small place) maps include a base map 100 that is eight-by-eight texels in size, as well as a series of maps 102, 104 and 108 that are respectively four-by-four texels, two-by-two texels, and one texel in size.

The four-by-four map 102 is generated by box filtering (decimating) the base map 100, such that each texel in the map 102 corresponds to an average of four texels in the base map 100. For example, the texel 110 in map 102 equals the average of the texels 112–115 in map 100, and texels 118 and 120 in map 102 respectively equal the averages of texels 121–124 and 125–128 in map 100. The two-by-two map 104 is similarly generated by box filtering map 102, such that texel 130 in map 104 equals the average of texels 110 and 118–120 in map 102. The single texel in map 108 is generated by averaging the four texels in map 104.

Conventional graphics systems generally download, from the main memory of the host computer to the local memory of the texture mapping hardware, the complete series of MIP maps for any texture that is to be used with the primitives to be rendered on the display screen. Thus, the texture mapping hardware can access texture data from any of the series of MIP maps. The determination of which map to access to provide the texel data for any particular pixel is based upon the number of texels to which the pixel maps. For example, if the pixel maps in one-to-one correspondence with a single texel in the texture map, then the base map 100 is accessed. However, if the pixel maps to four, sixteen or sixty-four texels, then the maps 102, 104 and 108 are respectively accessed because those maps respectively store texel data representing an average of four, sixteen and sixty-four texels in the texture map.

A pixel may not map directly to any one texel in the selected map, and may fall between two or more texels. Some graphics systems employ bi-linear interpolation to accurately produce texel data when this occurs. If a pixel maps into a MIP map between two or more texel entries, then the resulting texel data used is a weighted average of the closest texel entries. Thus, the texel data corresponding to any pixel can be the weighted average of as many as four texel entries in a single map. For example, if a pixel maps to a location in map 102 indicated at 132, the resulting texel data mapping to that pixel would be the weighted average of the texels 110 and 118–120.

Pixels may also not map directly into any one of the maps in the series of MIP maps, and may fall between two maps. For example, a pixel may map to a number of texels in the texture map that is greater than one but less than four. Some graphics systems address this situation by interpolating between the two closest MIP maps to achieve the resultant texel data. For the example above wherein a pixel maps to greater than one but less than four texels in the texture map, the texel data provided by maps 100 and 102 would be interpolated to achieve the resultant texel data for the pixel. When combined with the above-described interpolation of multiple texel entries in a single map, this scheme is known as tri-linear interpolation, and can lead to resultant texel data for any one pixel being generated as a weighted average of as many as eight texels, i.e., the four closest texels in each of the two closest maps.

As discussed above, conventional texture mapping systems download the entire series of MIP maps for any texture associated with primitives to be rendered by the system, even if some of the MIP maps will not be accessed. The downloading of MIP maps that will not be accessed, as well as portions of accessed maps that are not used, is a waste of the system's resources and reduces its bandwidth. Furthermore, some texture mapping systems are pipelined so that various operations are performed simultaneously on different object primitives. However, a series of MIP maps for a texture can be large. Most systems employ a local memory that is capable of storing only one such large series of MIP maps at a time. Thus, when there is a switch in the texture used in rendering primitives, the system must download a new series of MIP maps. Typically, the data path used to load the new texture data into the local memory in the texture mapping hardware passes through the system's primitive rendering pipeline. Therefore, when a new texture is to be mapped, the primitive rendering pipeline must be allowed to empty out before the new series of MIP maps can be downloaded. Once the series of MIP maps is downloaded, the pipeline must again be filled. The necessity of flushing the primitive rendering pipeline each time a new texture is required reduces the system's bandwidth.

SUMMARY OF THE INVENTION

In one embodiment of the invention, a method is provided for allocating data among first and second banks of at least one SDRAM, the data includes first, second and third words to be accessed during consecutive read operations. The method includes the following steps: storing the first and third words within the first bank, and storing the second word within the second bank. The step of storing within the first bank includes the step of storing common texture data from every other MIP map of at least one series of texture MIP maps. The step of storing within the second bank includes the step of storing texture data common to the texture data stored in the first bank and from MIP maps adjacent to the every other MIP map.

In one embodiment, the method further includes dividing each MIP map of the at least one series of MIP maps into at least two map portions. In this embodiment, the method further includes, after the step of dividing, the step of allocating the map portions of all of the maps into a plurality of equally-size blocks of texture data.

In another embodiment of the invention, a method is provided for accessing first, second and third words from a data storage system respectively during first, second and third consecutive read operations. The method includes the following steps: accessing the first word from a first bank of at least one SDRAM during the first read operation; accessing the second word from the second bank of the at least one SDRAM during the second read operation; and accessing the third word from the first bank of the at least one SDRAM during the third read operation. In one embodiment of the invention, each step of accessing includes separately accessing a plurality of words from at least one SDRAM within each of a plurality of interleaves of the data storage system.

In another embodiment of the invention, a texture mapping computer graphics system is provided. The system includes a host computer with a main memory that stores texture data including a plurality of texels. A local memory stores at least a portion of the texture data, wherein the local memory includes at least one SDRAM. In one embodiment, the local memory further includes a plurality of separately accessible interleaves, each interleave including at least one SDRAM.

BRIEF DESCRIPTION OF THE DRAWINGS

For a better understanding of the present invention, reference is made to the accompanying drawings, which are incorporated herein by reference and in which:

FIG. 2A is a block diagram of another embodiment of the overall computer graphics system of the present invention;

FIG. 14 is a diagram of a MIP map illustrating how the MIP map is partitioned according to a memory storage scheme of the present invention;

FIG. 15 is a more detailed diagram of portions of the map shown in FIG. 14 illustrating how the map is further partitioned according to a memory storage scheme of the present invention;

FIG. 16 is a diagram illustrating the manner in which the cache block tag is generated;

FIG. 19 is a diagram illustrating the texel port registers provided in the texture mapping chip

FIG. 24 is a block diagram of an illustrative implementation of the cache directory of the present invention.

DETAILED DESCRIPTION

I. System Overview

Figure 2:
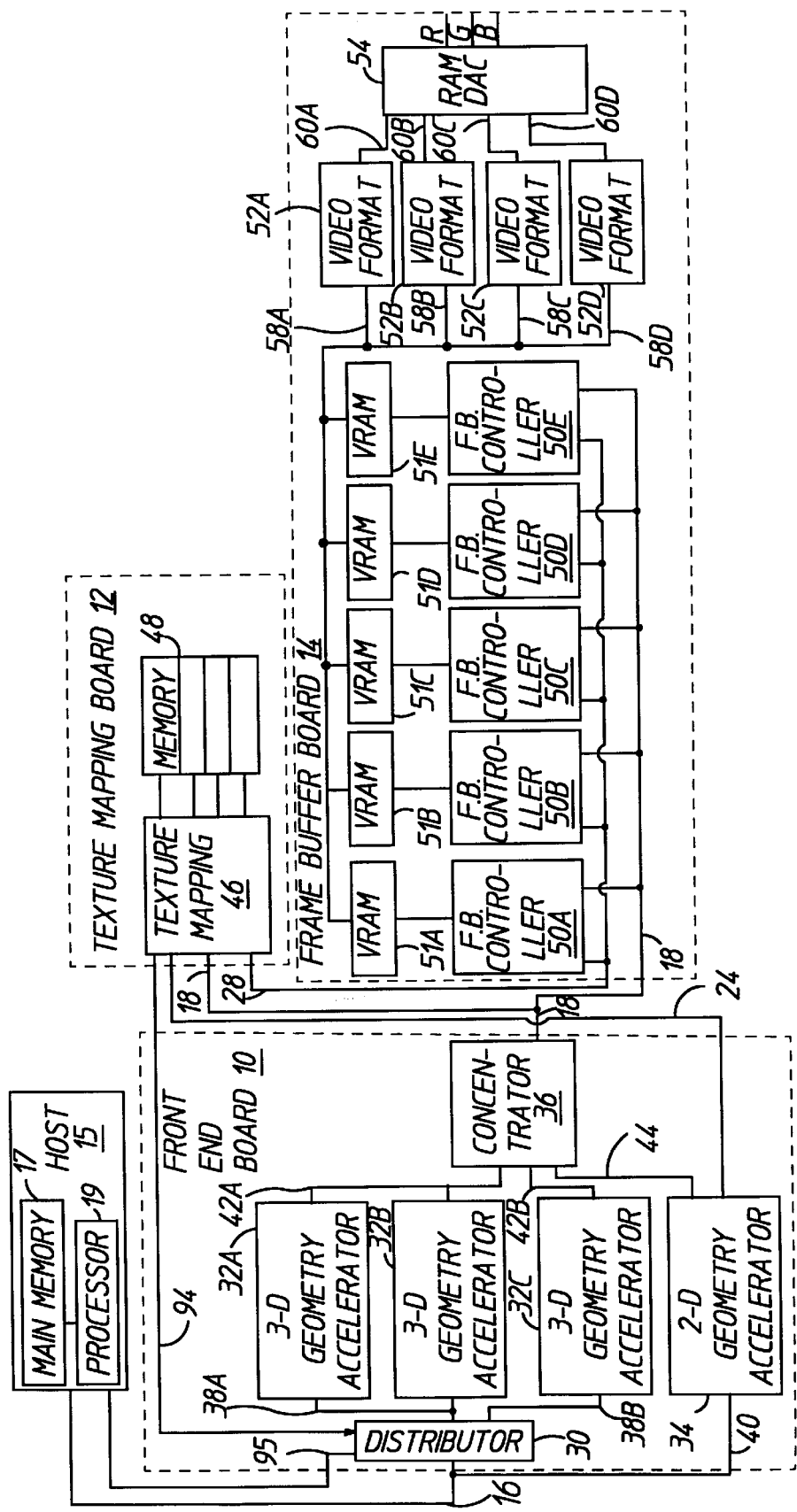
FIG. 2 is a block diagram of one embodiment of the overall computer graphics system of the present invention.

FIG. 2 is a block diagram of one embodiment of a graphics system of the present invention that includes texture mapping hardware having a cache memory for storing texture data locally. It should be understood that the illustrative implementation shown is merely exemplary with respect to the number of boards and chips, the manner in which they are partitioned, the bus widths, and the data transfer rates. Numerous other implementations can be employed. As shown, the system includes a front end board 10, a texture mapping board 12, and a frame buffer board 14. The front end board communicates with a host computer 15 over a 52-bit bus 16. The front end board receives primitives to be rendered from the host computer over bus 16. The primitives are specified by x,y,z vector coordinate data, R,G,B color data and texture S,T coordinates, all for portions of the primitives, such as for the vertices when the primitive is a triangle. Data representing the primitives in three dimensions then is provided by the front end board 10 to the texture mapping board 12 and the frame buffer board 14 over 85-bit bus 18. The texture mapping board interpolates the primitive data received to compute the screen display pixels that will represent the primitive, and determines corresponding resultant texture data for each primitive pixel. The resultant texture data is provided to the frame buffer board over five 55-bit buses 28, which are shown in FIG. 2 as a single bus to clarify the figure.

The frame buffer board 14 also interpolates the primitive data received from the front end board 10 to compute the pixels on the display screen that will represent each primitive, and to determine object color values for each pixel. The frame buffer board then combines, on a pixel by pixel basis, the object color values with the resultant texture data provided from the texture mapping board, to generate resulting image R,G,B values for each pixel. R,G,B color control signals for each pixel are respectively provided over R,G,B lines 29 to control the pixels of the display screen (not shown) to display a resulting image on the display screen that represents the texture mapped primitive.

The front end board 10, texture mapping board 12 and frame buffer board 14 each is pipelined and operates on multiple primitives simultaneously. While the texture mapping and frame buffer boards operate on primitives previously provided by the front end board, the front end board continues to operate upon and provide new primitives until the pipelines in the boards 12 and 14 become full.

The front end board 10 includes a distributor chip 30, three three-dimensional (3-D) geometry accelerator chips 32A, 32B and 32C, a two-dimensional (2-D) geometry accelerator chip 34 and a concentrator chip 36. The distributor chip 30 receives the X,Y,Z coordinate and color primitive data over bus 16 from the host computer, and distributes 3-D primitive data evenly among the 3-D geometry accelerator chips 32A, 32B and 32C. In this manner, the system bandwidth is increased because three groups of primitives are operated upon simultaneously. Data is provided over 40-bit bus 38A to the 3-D geometry accelerator chips 32A and 32B, and over 40-bit bus 38B to chip 32C. Both buses 38A and 38B transfer data at a rate of 60 MHz and provide sufficient bandwidth to support two 3-D geometry accelerator chips. 2-D primitive data is provided over a 44-bit bus 40 to the 2-D geometry accelerator chip 34 at a rate of 40 MHz.

Each 3-D geometry accelerator chip transforms the x,y,z coordinates that define the primitives received into corresponding screen space coordinates, determines object R,G,B values and texture S,T values for the screen space coordinates, decomposes primitive quadrilaterals into triangles, and computes a triangle plane equation to define each triangle. Each 3-D geometry accelerator chip also performs view clipping operations to ensure an accurate screen display of the resulting image when multiple windows are displayed, or when a portion of a primitive extends beyond the view volume represented on the display screen. Output data from the 3-D geometry accelerator chips 32A, 32B and 32C respectively is provided over 44-bit buses 42A, 42B and 42C to concentrator chip 36 at a rate of 60 MHz. Two-dimensional geometry accelerator chip 34 also provides output data to concentrator chip 36 over a 46-bit bus 44 at a rate of 45 MHz. Concentrator chip 36 combines the 3-D primitive output data received from the 3-D geometry accelerator chips 32A–C, re-orders the primitives to the original order they had prior to distribution by the distributor chip 30, and provides the combined primitive output data over bus 18 to the texture mapping and frame buffer boards.

Texture mapping board 12 includes a texture mapping chip 46 and a local memory 48 which is preferably arranged as a cache memory. In a preferred embodiment of the invention, the local memory is formed from a plurality of SDRAM (synchronous dynamic random access memory) chips for reasons discussed below. As described in greater detail below, the cache memory 48 stores texture MIP map data associated with the primitives being rendered in the frame buffer board. The texture MIP map data is downloaded from a main memory 17 of the host computer 15, over bus 40, through the 2-D geometry accelerator chip 34, and over 24-bit bus 24.

The texture mapping chip 46 successively receives primitive data over bus 18 representing the primitives to be rendered on the display screen. As discussed above, the primitives provided from the 3-D geometry accelerator chips 32A–C include points, lines and triangles. The texture mapping board does not perform texture mapping of points or lines, and operates only upon triangle primitives. The data representing the triangle primitives includes the x,y,z object pixel coordinates for at least one vertex, the object color R,G,B values of the at least one vertex, the coordinates in S,T of the portions of the texture map that correspond to the at least one vertex, and the plane equation of the triangle. The texture mapping chip 46 ignores the object pixel z coordinate and the object color R,G,B values. The chip 46 interpolates the x,y pixel coordinates and interpolates S and T coordinates that correspond to each x,y screen display pixel that represents the primitive. For each pixel, the texture mapping chip accesses the portion of the texture MIP map that corresponds thereto from the cache memory, and computes resultant texture data for the pixel, which may include a weighted average of multiple texels.

In one exemplary embodiment, the cache stores sixty-four blocks of 256×256 texels. Unlike the local memory employed in the texture mapping hardware of prior art systems, the cache memory of the present invention may not store the entire series of MIP maps of the texture that maps to the primitive being rendered, such as for large textures. Rather, the cache memory stores at any one time only the particular portions of the series of MIP maps actually used in currently rendering the primitive. Therefore, for most applications, only a portion of the complete texture data for the image being rendered will be stored in the cache memory at any one time.

The complete series of MIP maps for each texture is arranged and stored in the main memory 17 of the host computer 15. For each pixel of the primitive being rendered, the texture mapping chip 46 accesses a directory of the cache memory 48 to determine whether the corresponding texel or texels of the texture MIP maps are currently present in the cache. If the corresponding texels are stored in the cache memory at the time of the access, a cache hit occurs, and the texels are read from the cache and operated upon by the texture mapping chip 46 to compute the resultant texture data which is passed to the frame buffer board. However, if the corresponding texels for the primitive pixel are not stored in the cache memory when accessed by the texture mapping chip 46, a cache miss occurs. When a cache miss occurs, the portion of the texture MIP map data needed to render the primitive is downloaded from the main memory 17 of the host computer 15 into the cache memory 48, possibly replacing some data previously stored therein. However, unlike conventional texture mapping systems that download the entire series of MIP maps for any primitive being rendered, the present invention downloads only the portion of the series of MIP maps actually needed to currently render the primitive or the currently rendered portion thereof. As is explained in greater detail below, when a cache miss occurs, an interrupt control signal is generated by the texture mapping chip 46 to initiate a texture interrupt manager in the host computer 15. The interrupt control signal is provided over line 94 to the distributor chip 30, which in turn provides an interrupt signal over line 95 to the host computer.

The requested texture data is retrieved by the host computer from its main memory and is downloaded to the texture mapping board 48 over bus 24, bypassing the 3-D primitive rendering pipeline through the front end board and the texture mapping chip. Thus, when a cache miss interrupt occurs, the front end board can continue to operate upon 3-D primitives and provide output primitive data over bus 18 to the texture mapping chip and the frame buffer board, while the texture data associated with a primitive that caused the cache miss is being downloaded from main memory 17. In contrast to conventional texture mapping systems, the downloading of texture data to the texture mapping hardware does not require a flushing of the 3-D primitive pipeline, thereby increasing the bandwidth and performance of the system. The resultant texture data for each pixel is provided by the texture mapping chip 46 to the frame buffer board over five buses 28. The five buses 28 are respectively coupled to five frame buffer controller chips 50A, 50B, 50C, 50D and 50E provided on the frame buffer board, and provide resultant texture data to the frame buffer controller chips in parallel. The frame buffer controller chips 50A–E are respectively coupled to groups of associated VRAM (video random access memory) chips 51A–E. The frame buffer board further includes four video format chips, 52A, 52B, 52C and 52D, and a RAMDAC (random access memory digital-to-analog converter) 54. The frame buffer controller chips control different, non-overlapping segments of the display screen. Each frame buffer controller chip receives primitive data from the front end board over bus 18, and resultant texture mapping data from the texture mapping board over bus 28. The frame buffer controller chips interpolate the primitive data to compute the screen display pixel coordinates in their respective segments that represent the primitive, and the corresponding object R,G,B color values for each pixel coordinate. For those primitives (i.e., triangles) for which resultant texture data is provided from the texture mapping board, the frame buffer controller chips combine, on a pixel by pixel basis, the object color values and the resultant texture data to generate final R,G,B values for each pixel to be displayed on the display screen.

The manner in which the object and texture color values are combined can be controlled in a number of different ways. For example, in a replace mode, the object color values can be simply replaced by the texture color values, so that only the texture color values are used in rendering the pixel. Alternatively, in a modulate mode, the object and texture color values can be multiplied together to generate the final R,G,B values for the pixel. Furthermore, a color control word can be stored for each texel that specifies a ratio defining the manner in which the corresponding texture color values are to be combined with the object color values. A resultant color control word can be determined for the resultant texel data corresponding to each pixel and provided to the frame buffer controller chips over bus 28 so that the controller chips can use the ratio specified by the corresponding resultant control word to determine the final R,G,B values for each pixel.

The resulting image video data generated by the frame buffer controller chips 50A–E, including R,G,B values for each pixel, is stored in the corresponding VRAM chips 51A–E. Each group of VRAM chips 51A–E includes eight VRAM chips, such that forty VRAM chips are located on the frame buffer board. Each of video format chips 52A–D is connected to, and receives data from, a different set of ten VRAM chips. The video data is serially shifted out of the VRAM chips and is respectively provided over 64-bit buses 58A, 58B, 58C, and 58D to the four video format chips 52A,

52B, 52C and 52D at a rate of 33 MHZ. The video format chips format the video data so that it can be handled by the RAMDAC and provide the formatted data over 32-bit buses 60A, 60B, 60C and 60D to RAMDAC 54 at a rate of 33 MHZ. RAMDAC 54, in turn, converts the digital color data to analog R,G,B color control signals and provides the R,G,B control signals for each pixel to a screen display (not shown) along R,G,B control lines 29.

In one embodiment of the invention, hardware on the texture mapping board 12 and the frame buffer board 14 is replicated so that certain primitive rendering tasks can be performed on multiple primitives in parallel, thereby increasing the bandwidth of the system. An example of such an alternate embodiment of the present invention is shown in FIG. 2A, which is a block diagram of a computer graphics system of the present invention having certain hardware replicated. The system of FIG. 2A includes four 3-D geometry accelerator chips 32A, 32B, 32C and 32D, two texture mapping chips 46A and 46B respectively associated with cache memories 48A and 48B, and ten frame buffer chips 50A–50J, each with an associated group of VRAM chips. The operation of the system of FIG. 2A is similar to that of the system of FIG. 2, described above. The replication of the hardware in the embodiment of FIG. 2A allows for increased system bandwidth because certain primitive rendering operations can be performed in parallel on multiple primitives.

II. Texture Mapping Chip Overview

Figure 3:
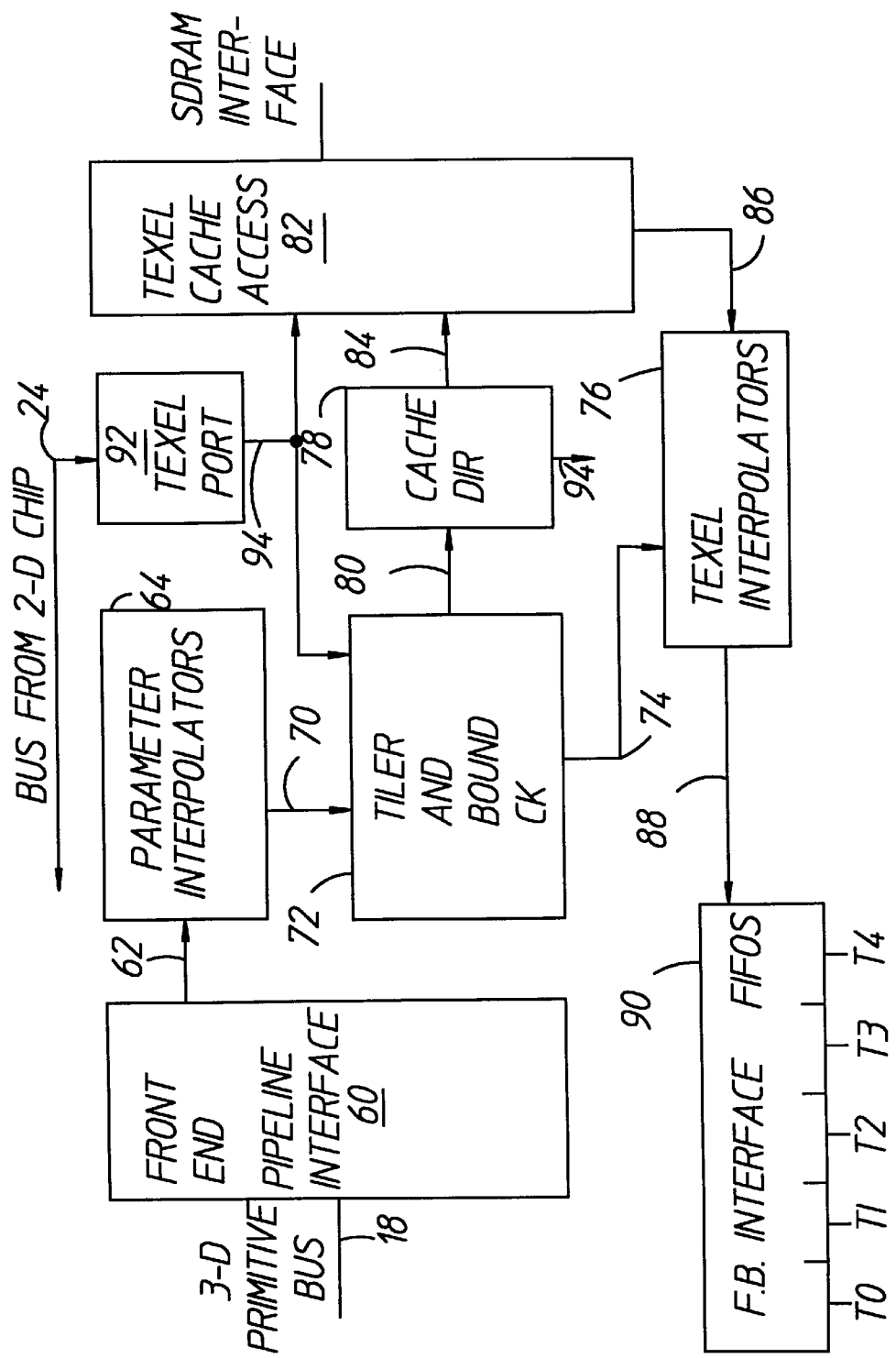
FIG. 3 is a block diagram of the texture mapping hardware of the present invention.

A block diagram of the texture mapping chip 46 is shown in FIG. 3. The chip 46 includes a front end pipeline interface 60 that receives object and texture primitive data from the front end board over 64-bit bus 18. The triangle primitives operated upon the texture mapping chip are defined by up to fifty-two 32-bit digital words but may be defined by words of different lengths. The pipeline interface includes a set of master registers and a set of corresponding slave registers. During rendering, the master registers are filled sequentially with the fifty-two digital words of data that define the primitive. Then, upon receipt of an appropriate rendering command, the data is shifted into the slave registers in the pipeline interface, allowing, in a pipelined fashion, the master registers to be filled with data representing another primitive. The primitive data provided over bus 18 includes the x,y,z vector coordinate data, the S,T texture coordinates and the R,G,B object color data for at least one triangle vertex, as well as data representing the triangle plane equation. As discussed above, the texture mapping chip ignores the object pixel z coordinate and the object color R,G,B values, and stores only the other data in the front end pipeline interface 60.

The slave registers of the pipeline interface 60 transfer the primitive data over bus 62 to a parameter interpolator circuit 64. Parameter interpolator circuit 64 interpolates each primitive triangle to determine, for each display screen pixel coordinate that represents the triangle, the S,T texture map coordinates for the texture map that maps to the pixel, and an S and T gradient value ($\Delta S$, $\Delta T$). The S and T gradients respectively equal changes in the S and T coordinates between adjacent pixels, and are computed in a manner discussed below.

Figure 4:
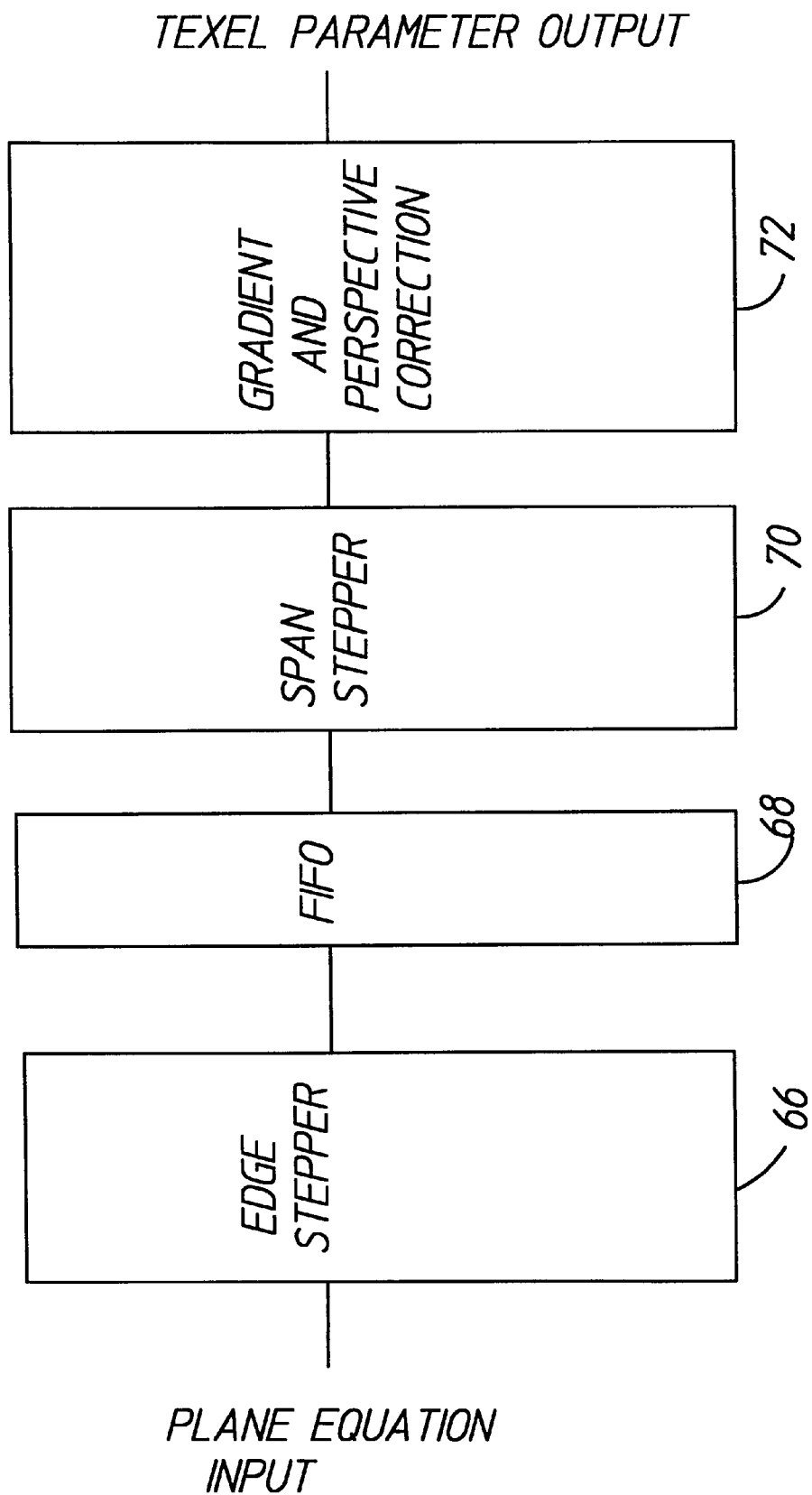
FIG. 4 is a more detailed block diagram of the parameter interpolator element of the texture mapping hardware of the present invention.

The parameter interpolator circuit 64, shown in more detail in FIG. 4, includes an edge stepper 66, a FIFO ("first-in, first-out") buffer 68, a span stepper 70 and a gradient and perspective correction circuit 72, all connected in series. The edge stepper starts at the x,y pixel coordinate of one of the triangle vertices, and utilizing the triangle plane equation, steps the edges of the triangle to determine the pixel coordinates that define the triangle edges. For each pixel coordinate, texture map S and T coordinates are determined, based on the S,T values of the triangle vertices, to identify which texels in the texture map correspond to each display screen pixel coordinate. The pixel and texel coordinates temporarily are stored in the FIFO buffer and then are provided to the span stepper. At each x,y pixel location along an edge of the triangle, the span stepper steps across the corresponding span of the triangle to determine the S,T texel coordinates for each pixel location along the span Each S and T coordinate for a display screen pixel may have an integer portion and a fractional portion if the pixel does not map directly (in one-to-one correspondence) to a single texel in one of the series of MIP maps for the texture. As explained above, when mapped to the texture map, each display screen pixel may lie between multiple texels in one of the series of MIP maps for the texture, and furthermore, may lie between adjacent (in size) MIP maps in the series.

The gradient and perspective correction circuit 72 determines the gradient values of S and T($\Delta S$, $\Delta T$) for each display screen pixel. In one embodiment of the invention, gradient $\Delta S$ is selected to be the larger of gradient $\Delta Sx$ and gradient $\Delta Sy$, wherein gradient $\Delta Sx$ is the change in the S coordinate in the texture map as coordinate x changes between adjacent pixels on the display screen, and gradient $\Delta Sy$ is the change in the S coordinate as coordinate y changes between adjacent pixels. Gradient $\Delta T$ is similarly computed. The gradients $\Delta S$, $\Delta T$ for a display screen pixel indicate the rate of change in coordinate position within the texture map for a change of one pixel on the display screen in the corresponding S,T dimension, and are used to determine which MIP map or maps should be accessed to provide the resultant texture data for the pixel. For example, a gradient equal to two for a display screen pixel indicates that the pixel maps to four (i.e., $2^2$ as discussed below) texels, so that the MIP map reduced in size by two from the base map (e.g., the map 102 in FIG. 1) should be accessed to provide the resultant texture data for the pixel. Thus, as the gradient increases, the size of the MIP map that is accessed to provide the resultant texture data for the pixel is reduced.

In one embodiment of the invention, a single gradient, equal to the larger of $\Delta S$ and $\Delta T$, is used to select the appropriate MIP map for each pixel, such that the gradient equals the largest of $\Delta Sx$, $\Delta Sy$, $\Delta Tx$, and $\Delta Ty$ for the pixel. However, it should be understood that the gradient can alternatively be selected in a different fashion, such as by selecting the smallest of those values, an average of those values, or some other combination. Since a single gradient is selected that indicates the rate of change in only one of the S,T coordinates, the square of the gradient represents the number of texels that map to the corresponding pixel.

From the gradient, the parameter interpolator determines the closest map to which the pixel maps, and a value indicating by how much the pixel varies from mapping directly to that map. The closest map is identified by the whole number portion of a map number, the value indicating by how much the pixel varies from a direct mapping is identified by a fractional component of the map number.

Referring again to the block diagram of the texture mapping chip in FIG. 3, the texel data output from the parameter interpolator circuit 64 is provided over line 70 to a tiler and boundary checker 72, which determines the address of the four texels that are closest to the position in each of the texture maps specified by the texel data, and checks to determine whether each is within the boundary of the texture. The texel data includes the interpolated S, T coordinates (integer and fractional values) as well as the map number and map fraction. The tiler uses the integer portion of the S and T coordinates computed by the parameter interpolator 64, and adds one to the integer portion of each to generate the addresses of the four closest texels. The boundary checker then determines whether the S,T coordinates for any of these four texels fall outside the boundary of the texture map. If a display screen pixel maps to an S,T coordinate position that falls outside the boundary of the texture map, one of several texture mapping schemes is implemented to determine whether any resultant texture data is to be generated for that pixel, and how that data is to be generated. Examples of such schemes include wrapping (a repeat of the texture), mirroring (a repeat of the mirror image of the texture), turning off texture mapping outside the boundary, and displaying a solid color outside the boundary.

The capability of allowing a pixel to map to a location in a texture map that is beyond its boundary provides flexibility in the manner in which textures can be mapped to object primitives. For example, it may be desirable to map a texture to an object in a repeating fashion, such that the texture is mapped to multiple portions of the object. For example, if a texture is defined having S,T coordinates ranging from [0, 0] inclusive through (10, 10) non-inclusive, a user could specify certain portions of the object to map to S,T coordinates [10, 10] inclusive through (20, 20) non-inclusive. The notation of the bracketed inclusive coordinates indicates that those coordinates are included in the portion of the texture mapped to the object, whereas the object maps to only the S,T coordinates up to but not including the non-inclusive coordinates in parentheses. If the wrapping feature is selected for S,T coordinates falling outside the boundary of the texture, pixels having S,T coordinates [10, 10] through (20, 20) would respectively map to the texels at S,T coordinates [0, 0] through (10, 10).

As discussed above, the resultant texture data from a two-dimensional texture map for a single pixel may be the result of a combination of as many as eight texels, i.e., the four closest texels in the two closest MIP maps. There are a number of ways in which the eight texels can be combined to generate the resultant texel data. For example, the single closest texel in the closest map can be selected, so that no averaging is required. Alternatively, the single closest texel in each of the two closest maps can be averaged together based on the value of the gradient. Such schemes do not map the texture as accurately as when the eight closest texels are averaged.

In one embodiment of the invention, trilinear interpolation is supported wherein the resultant texture data for a single pixel may be calculated as a weighted average of as many as eight texels. The gradient representing rates of change of S,T is used to identify the two closest MIP maps from which to access texture data, and the four closest texels within each map are accessed. The average of the four texels within each map is weighted based on which texels are closest to the S,T coordinates of the position in the MIP map that the display screen pixel maps to. The fractional portion of the S and T coordinates for the pixel are used to perform this weighting. The average value from each of the two closest MIP maps is then weighted based upon the value of the gradient. A fractional value is computed from the gradient for use in this weighting process. For example, a gradient of three is half-way between the MIP maps that respectively correspond to gradients of two and four.

The texel interpolation process is performed by the texel interpolators 76. The fractional portions of the S and F coordinates for each display screen pixel are provided from the parameter interpolators, through the tiler/boundary checker, to texel interpolator 76 over lines 74. The fractional portions are used by the texel interpolator to determine the weight afforded each texel during interpolation of the multiple texels when computing resultant texel data.

As discussed above, texture MIP maps associated with a primitive being rendered are stored locally in the cache memory 48 (FIG. 2). In one embodiment of the invention, the cache is fully associative. The cache includes eight SDRAM chips divided into four interleaves, with two SDRAM chips in each interleave. Four separate controllers are provided, with one corresponding to each interleave so that the SDRAM chips within each interleave can be accessed simultaneously. Each SDRAM chip includes two distinct banks of memory in which different pages of memory can be accessed in consecutive read cycles without incurring repaging penalties commonly associated with accessing data from two different pages (i.e., from two different row addresses) in a conventional DRAM.

The texture data (i.e., the MIP maps) is divided into texel blocks of data that each includes 256×256 texels. The cache memory can store as many as sixty-four blocks of data at one time. Each block has an associated block tag that uniquely identifies the block. The cache includes a cache directory 78 that stores the block tags that correspond to the blocks of data currently stored in the cache. As described in greater detail below, each block tag includes a texture identifier (texture ID) that identifies the particular texture that the block of data represents, a map number that identifies the particular MIP map within the texture's series of maps that the block of data represents, and high-order S and T coordinates that identify the location of the block of data within the particular map. The physical location of the block tag within the cache directory represents the location of the corresponding block of data within the cache memory.

MIP maps from more than one texture may be stored in the cache memory simultaneously, with the texture identifier distinguishing between the different textures. Some MIP maps contain fewer than 256×256 texels, and therefore, do not consume an entire block of data. For example, the smaller maps in a series of MIP maps or even the larger maps for small textures may not exceed 256×256 texels. To efficiently utilize memory space, portions of multiple maps may be stored in a single block of texture data, with each map portion being assigned to a sub-block within the block. Each of the multiple maps stored within a single block has an associated sub-texture identifier (ID) that identifies the location of the map within the block.

During rendering, the tiler/boundary checker 72 generates a read cache tag for the block of texture data that maps to the pixel to be rendered. The manner in which the tags are generated is explained in more detail below. The tags are 23-bit fields that include eight bits representing the texture ID of the texture data, a bit used in determining the map number of the texture data, and the seven high-order S and T coordinates of the texture data. The cache directory 78 compares the read cache tag provided from the tiler/boundary with the block tags stored in the directory to determine whether the block of texture data to be used in rendering is in the cache memory. If the block tag of the texture data that maps to the primitive to be rendered is stored in (i.e., hits) the cache directory, then the cache directory generates a block index that indicates the physical location of the block of texture data in the cache that corresponds to the hit tag. The computation of the block index is discussed in greater detail below. A texel address is also generated by the tiler/boundary checker 72 for each texel to be read from the cache and indicates the location of the texel within the block. The texel address includes low-order address bits of the interpolated S,T coordinates for larger size maps, and is computed based on an algorithm described below for smaller size maps. The block index and texel address together comprise the cache address which indicates the location of the texel within the cache. As is described in greater detail below, the LSBs of the S and T coordinates for each texel are decoded to determine in which of four cache interleaves the texel is stored, and the remaining bits of the cache address are provided to the texel cache access circuit 82 along with a command over line 84 to read the texel data stored at the addressed location in the cache.

When the read cache tag does not match any of the block tags stored in the cache directory 78, a miss occurs and the cache directory 78 generates an interrupt control signal over line 94 (FIG. 2) to the distributor chip 30 on the front end board, which generates an interrupt over line 95 to the host computer 15. In response to the interrupt, the processor 19 of the host computer executes a service routine, discussed in more detail below, which reads the missed block tag from the cache directory and downloads the corresponding block of texture data into the cache memory in a manner that bypasses the 3-D primitive pipeline in the front end board 10 and the texture mapping chip 46. The texture data downloaded from the main memory is provided over bus 24, through the texel port 92 (FIG. 3) to the texel cache access circuit 82, which writes the data to the SDRAMs that form the cache memory.

When a cache miss occurs, the texture mapping chip waits for the new texture data to be downloaded before proceeding with processing the primitive on which the miss occurred. However, the stages of the pipeline that follow the cache read continue to process those primitives received prior to the miss primitive. Similarly, the stages of the pipeline that precede the cache read also continue to process primitives unless and until the pipeline fills up behind the cache read operation while awaiting the downloading of the new texture data.

During rendering, the later stages of the pipeline in the frame buffer board 14 do not proceed with processing a primitive until the texture data corresponding to the primitive is received from the texture mapping board. Therefore, when a cache miss occurs and the texture mapping chip waits for the new texture data to be downloaded, the frame buffer board 14 similarly waits for the resultant texture data to be provided from the texture mapping chip. As with the texture mapping chip, the stages of the pipeline that follow the stage that receives the texture mapping data continue to process those primitives received prior to the miss primitive, and the stages of the pipeline that precede the stage that receives texture mapping data also continue to process primitives unless and until the pipeline fills up.

It should be understood that when the pipeline of either the texture mapping board or the frame buffer board backs up when waiting for new texture data in response to a cache miss, the pipeline in the front end board 10 will similarly back up. Because cache misses will occur and will result in an access to the host computer main memory and a downloading of texture data that will take several cycles to complete, it is desirable to ensure that the pipeline in the texture mapping chip never has to wait because the pipeline in the frame buffer board has become backed up. Therefore, in one embodiment of the invention, the frame buffer board is provided with a deeper primitive pipeline than the texture mapping board, so that the texture mapping pipeline should not be delayed by waiting for the frame buffer pipeline to become available.

In one embodiment of the invention, the capability is provided to turn off texture mapping. This is accomplished by software operating on the processor 19 of the host computer to set a register in both the texture mapping board 12 and the frame buffer board 14. When set to turn off texture mapping, these registers respectively inhibit the texture mapping chip 46 from providing texture data to the frame buffer board 14, and instruct the frame buffer board to proceed with rendering primitives without waiting for texture data from the texture mapping board.

As described above, for each display screen pixel that is rendered with texture data from a two-dimensional texture map, as many as four texels from one MIP map (bilinear interpolation) or eight texels from two adjacent MIP maps (trilinear interpolation) may be accessed from the cache memory to determine the resultant texture data for the pixel. The texels read from the cache are provided over bus 86 (FIG. 3) to the texel interpolator 76, which interpolates the multiple texels to compute resultant texel data for each pixel. The interpolation can vary depending upon a mode established for the system. When a point sampling interpolation mode is established, the resultant texel data equals the single texel that is closest to the location defined by the pixel's S,T coordinates in the texture map. Alternatively, when bilinear or trilinear interpolation is employed, the resultant texel data is respectively a weighted average of the four or eight closest texels in the one or two closest maps. The weight given to each of the multiple texels is determined based upon the value of the gradient and the factional components of the S and T coordinates provided to the texel interpolator 76 from the tiler/boundary checker.

The resultant texel data for the display screen pixels is sequentially provided over bus 88 to a frame buffer interface FIFO buffer 90. The frame buffer interface FIFO buffer 90 can store up to sixty four resultant texels.

Each resultant texel is a 32-bit word including eight bits to represent each of R,G,B and $\alpha$. The $\alpha$ byte indicates to the frame buffer board 14 (FIG. 2) the manner in which the R,G,B values of the resultant texture data should be combined with the R,G,B values of the object data generated by the frame buffer board in computing final display screen R,G,B values for any pixel that maps to the texel. The frame buffer interface FIFO buffer outputs T0–T4 are provided to the frame buffer board 14 (FIG. 2) over bus 28. The frame buffer board combines the R,G,B values of the resultant texel data with the object R,G,B values in the manner specified by $\alpha$ to generate final R,G,B values for each display screen pixel.

III. Cache Memory Organization

Figure 5:
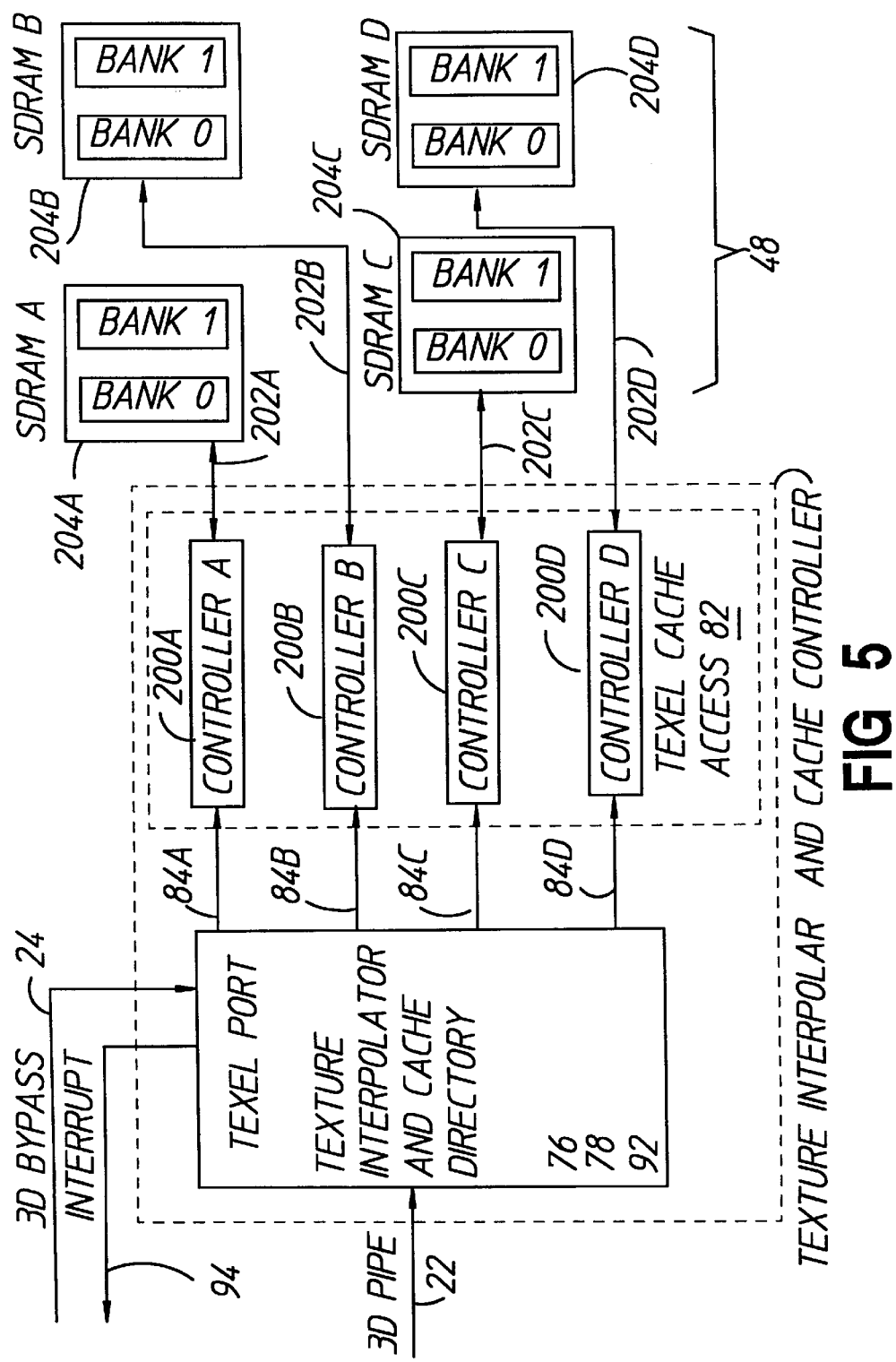
FIG. 5 is a block diagram of the cache memory and a portion of the texture mapping hardware of the present invention.

FIG. 5 is a block diagram of a cache memory implementation according to one illustrative embodiment of the present invention, coupled to portions of the texture mapping chip including the texel port 92, texture interpolator 76, cache directory 78 and the texel cache access circuit 82. In this illustrative embodiment, the cache memory 48 includes four interleaves 204A, 204B, 204C and 204D. Each interleave includes two SDRAM chips (not shown) that can be accessed simultaneously, with each providing eights bits of data during a read cycle. Therefore, each interleave provides sixteen bits of texel data during a single read cycle. Each 32-bit word of texel data is stored in the cache in a single interleave, with eight bits being stored in each of two consecutive locations in each SDRAM in the interleave. Thus, to read a texel from the cache, two read cycles are performed on consecutive locations in the appropriate interleave to provide the thirty-two bits of texel data. As explained below, only one address word (including row and column data) needs to be provided to the SDRAMs within each interleave to yield a burst of data on two consecutive cycles. The burst includes sixteen bits provided on a first cycle from the given address, and sixteen bits provided on a second cycle from an address having the same row, and a column that is incremented by one.

The texel cache access circuit 82 includes four separate controllers labeled controller A (200A), controller B (200B), controller C (200C) and controller D (200D). The four controllers A, B, C and D can simultaneously access data from the four interleaves 204A, 204B, 204C and 204D through parallel buses 202A, 202B, 202C and 202D. The controllers read texel data from the memory 48 in response to commands and at addresses respectively received over buses 84A, 84B, 84C and 84D.

As described above, each pixel can potentially map to four texels from one MIP map, or eight texels from multiple MIP maps. As discussed in more detail below, texel data downloaded to the cache is organized in the main memory of the host computer so that any four adjacent texels in each MIP map are located in separate interleaves so that they can be accessed in parallel. Thus, any four adjacent texels in a MIP map that may be needed to generate resultant texel data through bilinear interpolation can be read in a single read operation. When trilinear interpolation is employed, the two sets of four texels from adjacent MIP maps can be read in two read operations.

Figure 6:
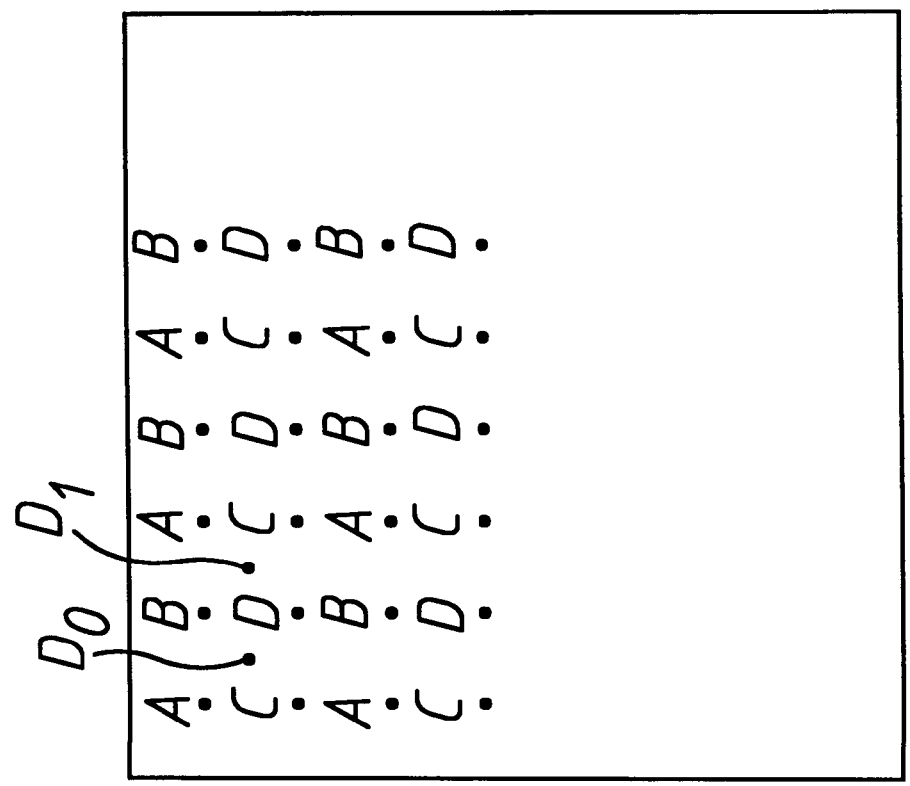
FIG. 6 illustrates an example of the manner in which blocks of texture data are organized to take advantage of a four interleave implementation of the cache memory of the present invention.

FIG. 6 illustrates an example of the manner in which blocks of texture data (only some texels are shown) are organized to take advantage of the four interleave implementation of the cache memory to allow any four adjacent texels in a MIP map to be read simultaneously. Each texel is labeled A, B, C or D to identify the interleave in the cache memory where the texel is stored. The pattern of the A–D labels repeats so that any location in the map falls between four texels labeled A, B, C and D. Thus, for a pixel that maps to any location within the map, the four closest texels will be in separate interleaves A–D so that they can be can be accessed simultaneously by the four independent controllers 200A–D. For example, pixel P0 maps to a location between four texels labeled A, B, C and D, and pixel P1 maps to a location between four texels labeled B, A, D and C.

It should be understood that the above-described cache implementation is provided merely for illustrative purposes, and that alternate implementations can be employed. For example, the cache can be implemented in eight separate interleaves, with eight separate controllers so that when trilinear interpolation is employed, the eight texels can be accessed simultaneously from the cache in a single read operation. Each SDRAM chip in the cache memory is divided internally into two equally-sized banks that can simultaneously maintain separate active pages (i.e., groups of memory locations having a common row address). Thus, data can be accessed on consecutive read cycles from different pages within the two banks of an SDRAM chip without incurring the re-paging penalty commonly associated with consecutively reading data from different pages in a conventional DRAM.

As is explained in greater detail below, the texture data is organized in the cache memory to take advantage of this feature of the SDRAMs to minimize page crossing penalties when trilinear interpolation is performed. The eight texels required for trilinear interpolation include sets of four texels from two MIP maps. Each set of four adjacent texels in a single map is arranged so that one is stored in each of interleaves A, B, C and D in the manner described above so that the four texels can be accessed simultaneously.

Furthermore, common data from adjacent MIP maps in the series of maps for any texture are stored in the cache in different SDRAM banks. When trilinear interpolation is being performed, four texels from one MIP map are simultaneously read from one of the SDRAM banks of interleaves A–D during the two read cycles of a first burst, and four texels from an adjacent MIP map are read from the other SDRAM bank during the two read cycles of a subsequent burst. Because both banks of the SDRAMs can be simultaneously row-active, the two sets of four texels can be accessed in back-to-back bursts without incurring a re-paging penalty. It should be understood that when pixels of an object are being rendered, adjacent pixels will frequently map to the same two MIP maps for the texture, requiring that reads to the cache continuously switch between the cache blocks that store the common data in the two maps. The cache organization of the present invention that allows two pages to remain active within each SDRAM is advantageous because it allows trilinear interpolation to be performed without incurring a re-paging penalty every cycle when switching between two adjacent MIP maps during rendering of display screen pixels.

Figure 7:
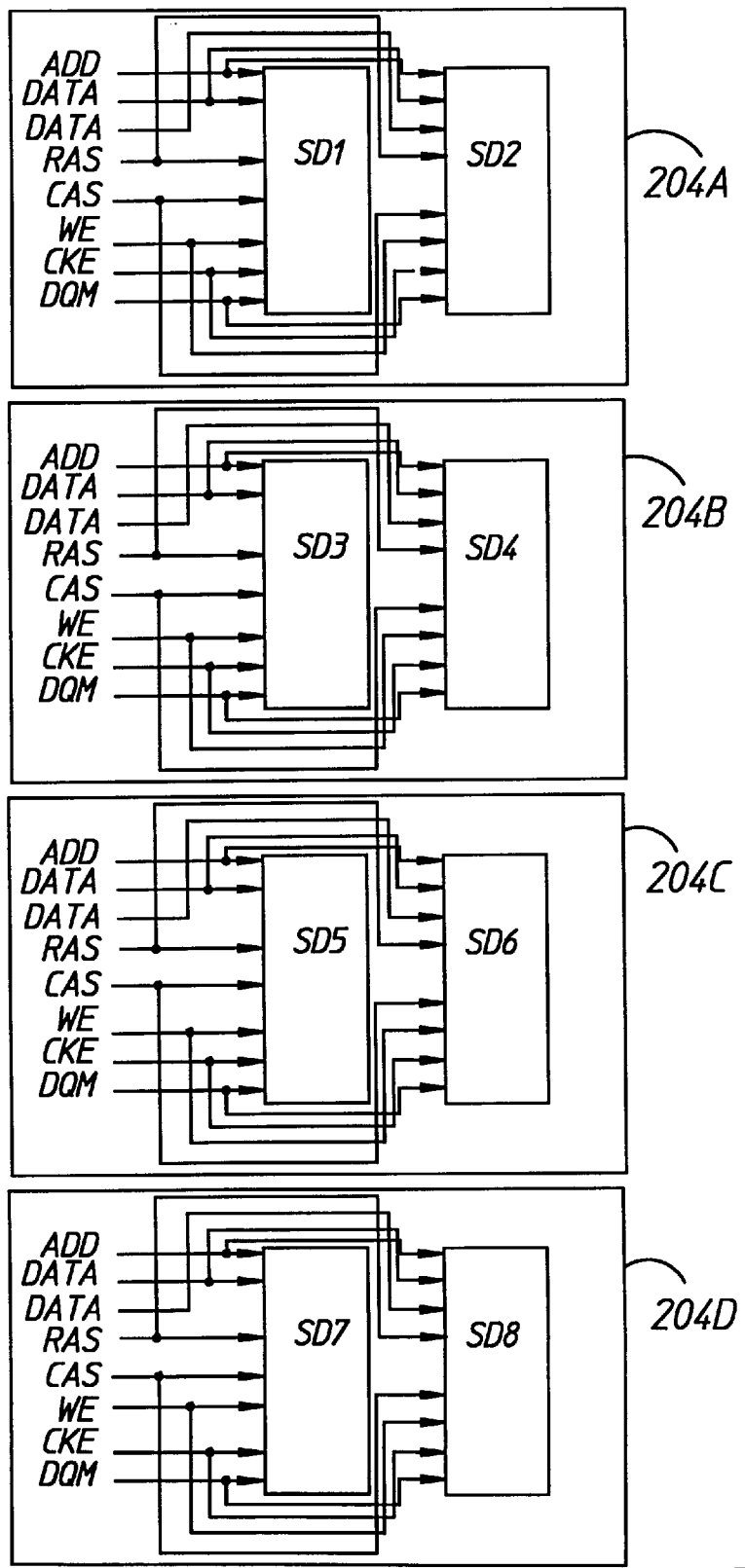
FIG. 7 is a detailed block diagram of the organization of the memory chips that form the cache memory of the present invention.

FIG. 7 is a more detailed block diagram of the above-described illustrative implementation of the cache memory of the present invention. The cache includes eight SDRAM chips labeled SD1–SD8 divided evenly among the four interleaves 204A–204D, with each interleave including two SDRAM chips. The two SDRAMs in each interleave share the following common lines: eleven address lines (ADD), row and column address strobes (RAS and CAS), a write enable (WE), a clock enable (CKE) and a data input/output mask (DQM). The SDRAMs within each interleave are coupled to eight separate data lines through which eight bits of data are respectively read or written during each read or write cycle. Each SDRAM chip includes two banks of memory with each bank storing as many as 1,048,576 8-bit words of texture data.

The two SDRAMs in each interleave can be simultaneously accessed and together provide sixteen bits of data, with one of the SDRAMs providing data bits [15:08] and the other providing data bits [07:00]. As discussed above, two consecutive read cycles of a single burst yield a full 32-bit texel of data from each interleave, with a separate 8-bit word representing each of the R, G, B and α values for the texel.

The SDRAM chips receive twenty address bits multiplexed on the eleven address lines ADD to decode the 1,048,576 8-bit words within each bank. As explained in detail below, a 6-bit block index and a 16-bit texel address are computed for each texel to be accessed from the cache. The block index indicates in which of the sixty-four blocks of data the texel is located and the texel address indicates the precise S,T coordinate address of the texel within the block. Eight S bits and eight T bits comprise the texel address, assuming a square block of data including 256×256 texels. A cache address is a twenty-two bit word including the combination of the block index (six MSBs) and texel address (sixteen LSBs). The cache address indicates the precise location of the texel within the cache.

During rendering, the tiler/boundary checker decodes the LSB S bit and LSB T bit of the texel address (i.e., the LSB S coordinate and the LSB T coordinate) to determine in which of the four interleaves of the cache the texel is stored. The remaining twenty greater address bits of the cache address are provided along the address lines ADD to the two SDRAM chips within the appropriate interleave. Of the twenty address bits provided to the two SDRAMs, nine bits are used to select the column and eleven bits are used to select the row within the SDRAMs to access the texel data. As should be understood by those skilled in the art, the column and row address bits are separately latched into the SDRAMs on different cycles and the RAS and CAS strobes are used conventionally to access the data.

During a two-cycle burst, sixteen bits from the addressed location of the two SDRAMs within the same interleave are provided during the first cycle and then, without providing another address, sixteen bits from another location of the two SDRAMs are provided during the second cycle. The address in the second cycle includes the same row address and a column address that is incremented by one. It also should be understood that once a page (particular row address) is activated, it remains activated until a different row address is provided. Therefore, if consecutive texels to be accessed from the same interleave are in the same page (include the same row address), then the row address needs to be provided only once during the first of the consecutive bursts.

In addition, the RAS, CAS, and WE lines are used to address and write data to the SDRAM chip in a conventional manner. When the clock enable signal CKE signal is deasserted, the internal clock is suspended. The SDRAMs respond to this signal by holding data intact, rendering both banks idle. The data input/output mask DQM signal functions as an output enable during a read cycle, and an input data mask during a write cycle. SDRAMs are conventionally used by determining from which future page subsequent data will be accessed while accessing present data from a current page and activating that future page before the present data read cycle is completed. Because SDRAMs enable two different pages to be simultaneously active, the conventional SDRAM use avoids repaging penalties commonly associated with accessing data from different pages in conventional DRAMs. Conventional SDRAM use does not provide that advantage, however, when data to be read on many consecutive read cycles is located in different pages because more than one cycle is required to look ahead and activate a future page. The texture data storage method of the present invention provides an advantage over conventional SDRAM use by enabling multiple consecutive SDRAM read cycles from different pages to occur without incurring a penalty. Particularly, by storing common data from adjacent MIP maps of a texture (that require accessing during consecutive read cycles when executing trilinear interpolation) in separate banks of the SDRAMs, the data from the separate banks can be accessed in consecutive read cycles without penalty. While the method of the present invention of data storage allocation for improving SDRAM performance has been shown and described with respect to the storage of texture mapping data, it should be understood that the method of the present invention is not so limited. Particularly, the method is applicable to allocate any type of data in which multiple consecutive read cycles access data from different memory locations.

IV. Cache Control FIFOs

Figure 8:
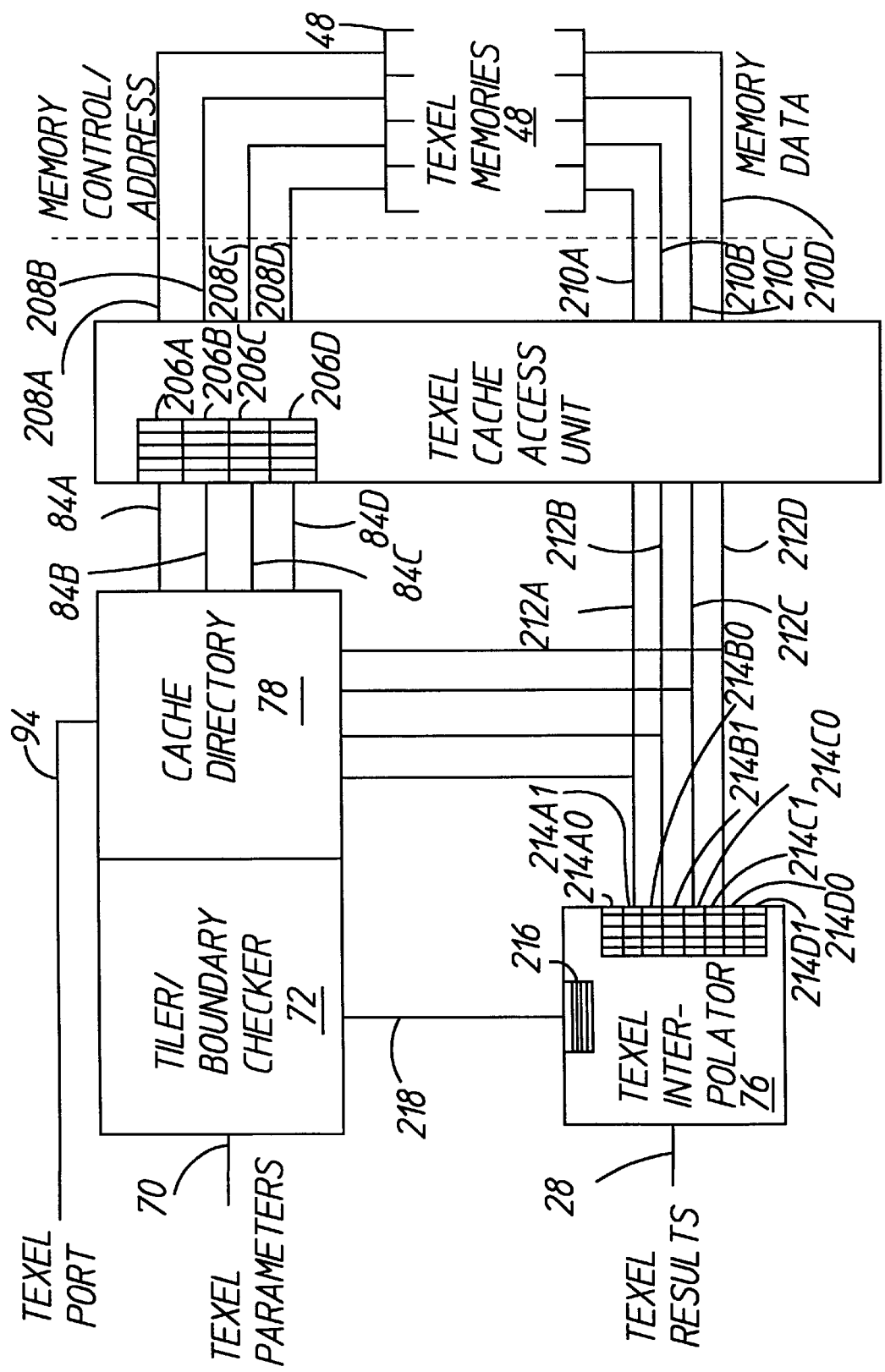
FIG. 8 is a detailed block diagram of a portion of the texture mapping hardware of the present invention.

FIG. 8 is a more detailed block diagram of a portion of the texture mapping chip that includes the boundary checker 72, the cache directory 78, the cache access circuit 82, the cache memory 48 and the texel interpolator 76. The texel cache access unit 82 includes four cache access command FIFOs 206A, 206B, 206C and 206D. The cache access command FIFOs 206A–D store cache access commands respectively received from the boundary checker over 16-bit buses 84A, 84B, 84C and 84D. The cache access command FIFOs 206A–D respectively correspond to the controllers 200A–D shown in FIG. 6. For example, commands in FIFO 206A invoke a cache access of the SDRAMs within interleave 204A. In this embodiment, each cache access command FIFO is capable of temporarily storing eight 16-bit commands. Thus, to enhance the pipelining capability of the system, eight commands can be stored in each of the cache access command FIFOs before the cache access unit acts.

As discussed above, during rendering, boundary checker 72 compares the read cache tag for each block of texture data that maps to the pixel being operated upon with each of the block tags stored in the cache directory 78 to determine whether the texel is in the cache. If a hit occurs, the block index is generated that represents the location of the corresponding block of texture data within the cache. The tiler/boundary checker simultaneously implements a routine to determine the texel address from the interpolated S,T coordinates, the texture ID and the sub-texture ID of the particular texel, as well as the map number of the map from which the texel is to be accessed and the size of the base map of the texture, as explained in detail below. From the block index and texel address (which together comprise the cache address), the optimizer then determines the particular interleave of the cache in which the texel is stored and the column and row address bits of the SDRAM chips of that interleave, as explained above. The address information is provided to the corresponding cache access command FIFO, along with a command to read the cache.

The texel interpolator 76 includes eight texel data FIFOs labeled 214A0, 214A1, 214B0, 214B1, 214C0, 214C1, 214D0 and 214D1. Texel data FIFOs 214A0 and 214A1 correspond to interleave 204A of the cache memory, FIFOs 214B0 and 214B1 correspond to interleave 204B, FIFOs 214C0 and 214C1 correspond to interleave 204C, and FIFOs 214D0 and 214D1 correspond to interleave 204D. As described above, each of the four interleaves of the cache memory can be accessed simultaneously through separate cache access paths. During rendering, when the texel cache access unit 82 accesses texel data from the cache memory 48, texel access control words are provided over buses 208A, 208B, 208C and 208D to the cache memory 48. Four texels are accessed simultaneously from the four interleaves during two back-to-back 16-bit read cycles. The four texels are respectively provided over buses 210A, 210B, 210C and 210D to one of the texel data A FIFOs (214A0 or 214A1), one of the texel data B FIFOs (214B0 or 214B), one of the texel data C FIFOs (214C0 or 214C1) and one of the texel data D FIFOs (214D0 or 214D1). The pair of texel data FIFOs (i.e., zero and one) corresponding to each interleave A–D are loaded in alternating fashion. For example, a first texel read from interleave A is stored in texel data FIFO 214A0, a second texel read from interleave A is stored in FIFO 214A1, a third texel from interleave A is stored in FIFO 214A0, etc. This alternating scheme is employed for reasons that are discussed below.

Each of the texel data FIFOs is thirty-two bits wide, and eight stages deep. In combination, the eight FIFOs 214 store eight pipelined stages, each stage including the eight texels used to determine resultant texel data during trilinear interpolation. Buses 210A, 210B, 210C and 210D are sixteen bits wide. Each SDRAM pair in each interleave provides sixteen bits of data during each read cycle. During each burst, the first sixteen bits are provided from each SDRAM pair into a first 16-bit register (not shown) and the next sixteen bits are provided from each SDRAM pair into a second 16-bit register (also not shown). At the end of the second cycle of the burst, the data from both registers is provided onto the corresponding 32-bit bus 212A, 212B, 212C or 212D. To determine the resultant texel data for any pixel, the texel interpolator 76 accesses the FIFOs to read the next stage of eight texels, and interpolates those texels in the manner described above. The resultant texel data is then provided over bus 28 to the frame buffer board 14 (FIG. 2) where it is used in the rendering the display screen pixel in the manner discussed above.

When trilinear interpolation is performed, the resultant texel data for any pixel is interpolated from four texels in one MIP map and four texels in an adjacent MIP map. Adjacent display screen pixels are generally rendered in succession. Often, adjacent display screen pixels will map to adjacent locations in a texture MIP map. As a result, it is common that some common texel data may be used in interpolating resultant texel data for consecutively rendered primitives. In one embodiment of the invention, when common texel data is accessed multiple times within a number of closely spaced read cycles, the cache is only accessed for the first read, saving cache read cycles for each successive read. The most recently read texels are stored within the texel data FIFOs. Thus, subsequent accesses to those texels are made from the FIFOs rather than the cache. This reduces the number of cache accesses required, thereby increasing system bandwidth.

For each of the texel data paths A, B, C and D, if the texel data most recently written to one of the texel data FIFOs 0 or 1 for a previous pixel matches the texel data for a pixel currently in the pipeline position for accessing the cache, then a cache access command is not provided to the corresponding cache access FIFO 206A, B, C or D. Instead, a command is sent to the texel interpolator to indicate that the texel data is stored in the most recently written location of the corresponding texel data FIFO 214A, B, C or D. For any of paths A, B, C and D wherein the texel data corresponding to the pixel currently in the pipeline position for accessing the cache does not match that data in the most recently written location of the corresponding texel data FIFO, a texel cache access command is provided to the corresponding texel cache access command FIFO to read that texel data from the cache memory 48.

It should be understood that a different result may occur for some of the interleaves A–D for any pixel currently in the pipeline position for which a cache access must be considered. For example, common texel data for consecutive pixels may exist for interleave A but not for interleaves B–D. In such a circumstance, texel data will be read from interleaves B–D for the second of the consecutive pixels in the pipeline position for accessing texel data from the cache, but the texel data from interleave A for that second pixel will be read from the same location of one of the texel data FIFOs 214A0 or 214A1. The present scheme provides bandwidth savings when texels are re-read from the texel data FIFOs for multiple pixels without accessing the cache.

The texel interpolator 76 includes a texel interpolator command FIFO 216 that receives 53-bit commands from the boundary checker 72 over 53-bit bus 218. The texel interpolator command FIFO can store up to sixteen commands that indicate to the interpolator which texel data FIFO locations contain the texel data to be used in interpolating the resultant texel data during each cycle. The interpolator commands also indicate the mode of interpolation (i.e., point sampling, bilinear or trilinear), and include the gradient and fractional values of the S and T coordinates, which specify the manner in which each texel should be weighted in the interpolation. The commands include data indicating from which texel data FIFOs 214A0, A1, B0, B1, C0, C1, D0, or D1 each of the four (bilinear) or eight (trilinear) texels are to be read, and whether the texel data is new or old. Texel data is new when it is different from the texel data stored in the most recently written to location of either texel data FIFO of that path. When new, a cache read is required. Texel data is old when it is the same as that stored in the most recently written location of either texel data FIFO. When old, a cache read is not required. When the texel data is new, the FIFO read pointer must be moved to a next location within the FIFO, whereas when the texel data is old, the same data is read from the same FIFO location and the read pointer need not be moved.

Figure 9:
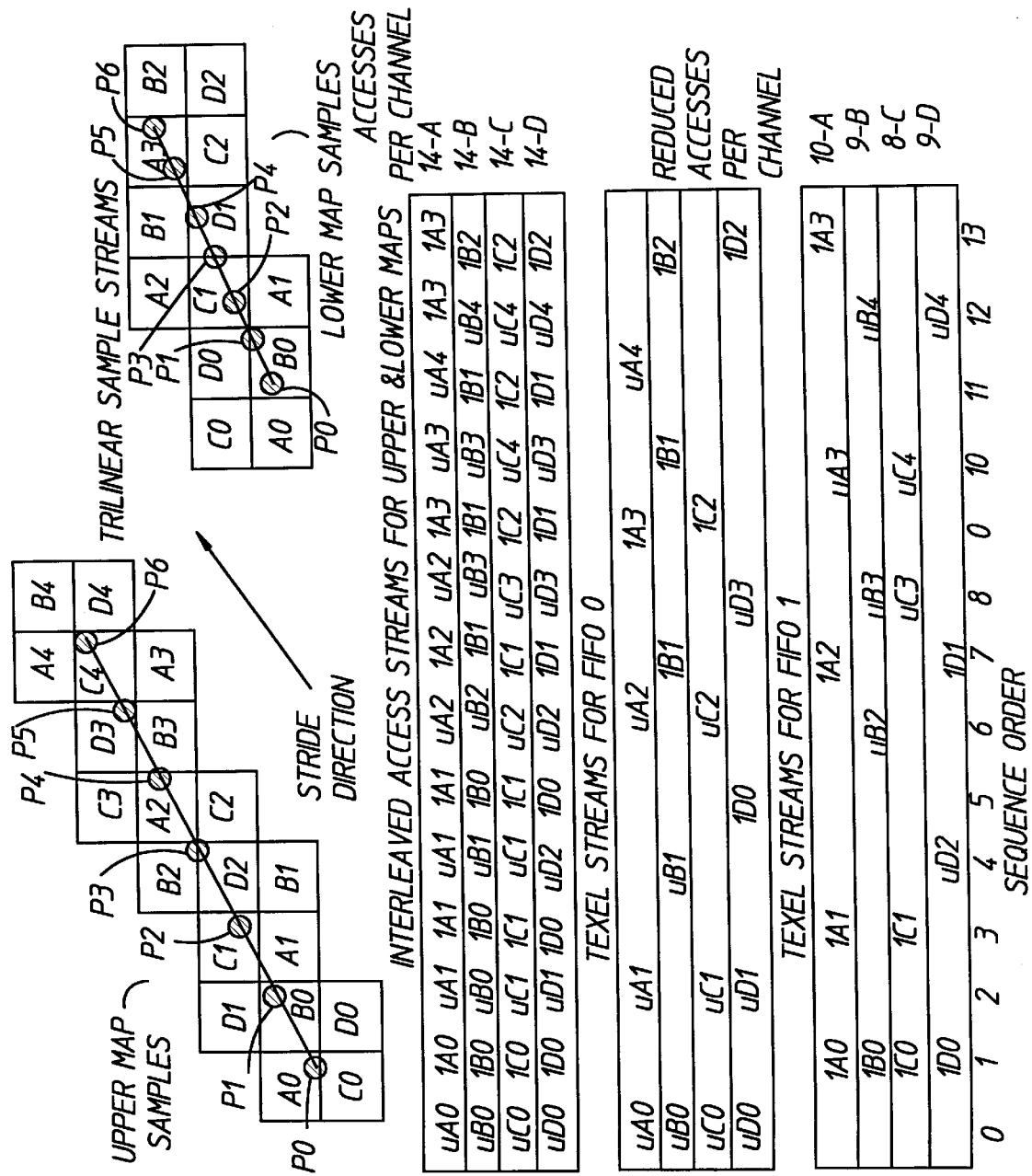
FIG. 9 is a diagram and chart illustrating an example of texels accessed from adjacent MIP maps for each of a stream of pixels according to a texture mapping scheme of the present invention.

The following example explained with reference to FIGS. 9 and 10 further illustrates the operation of the texel access circuit shown in FIG. 8. FIG. 9 shows multiple texels of an upper MIP map and multiple texels of a lower (smaller in size) MIP map. The texels are labeled An, Bn, Cn and Dn (wherein n represents an integer) in accordance with the labeling scheme previously described with respect to FIG. 7. Seven pixels to be rendered are labeled P0, P1, . . . P6. As shown, the pixels to be rendered do not map directly to the texels of the MIP maps. In this example, trilinear interpolation is performed such that four texels from the upper map and four texels from the lower map are to be accessed and interpolated for each pixel. The stride direction is the direction of rendering and corresponds to the numeric numbering of the pixels.

Figure 10:
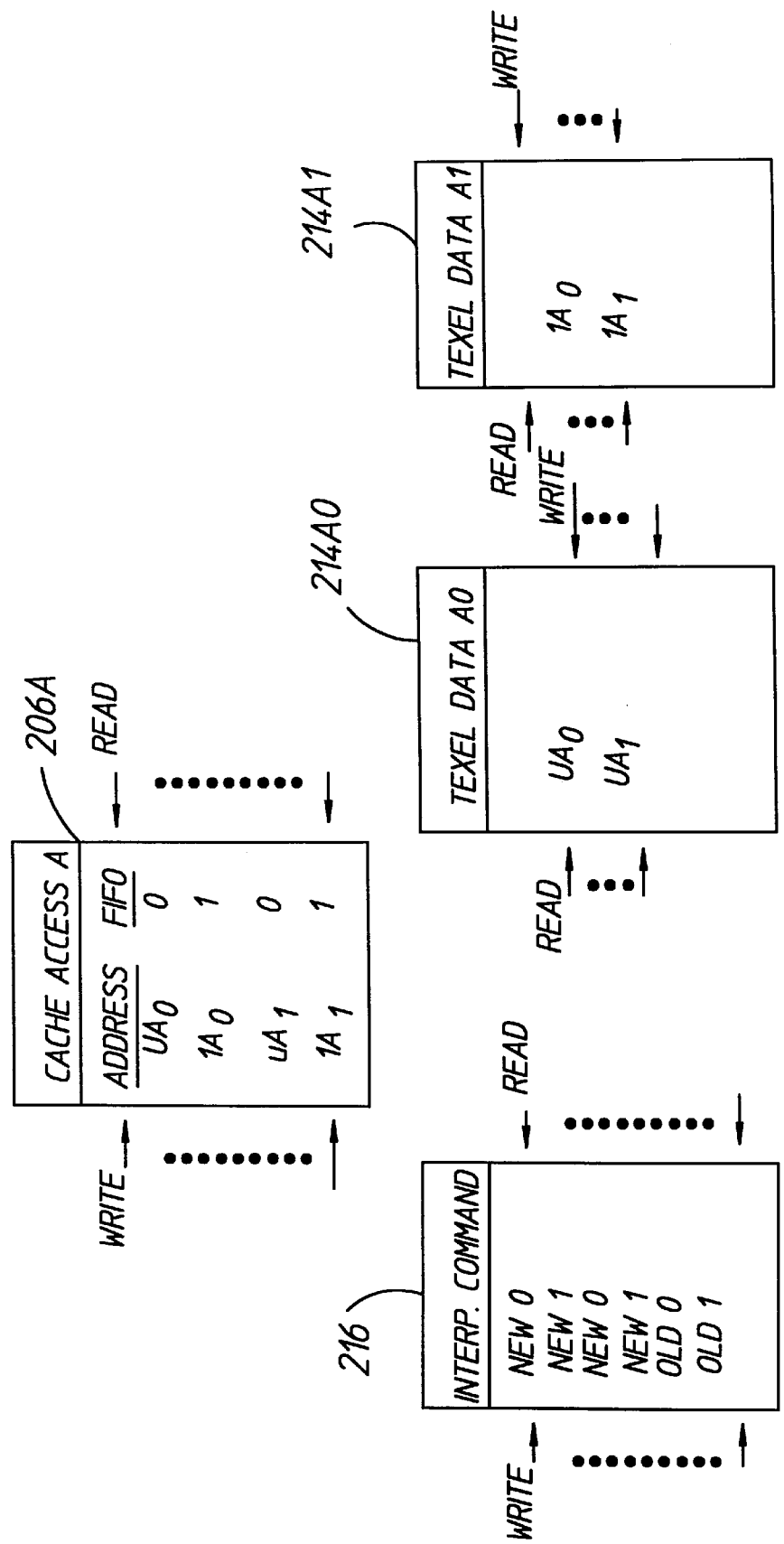
FIG. 10 is a diagram of texture mapping hardware buffers and associated data entries according to the example of FIG. 9.

FIG. 10 illustrates the cache access command FIFO (206A), the texel data FIFO A0 (214A0), texel data FIFO A1 (214A1) and the texel interpolator command FIFO 216. Only the FIFOs associated with the texel data A path are shown for convenience because the FIFOs for each of the other texel data paths B, C and D operate in the same manner. Each FIFO buffer includes a write pointer and a read pointer that respectively point to single locations within the FIFO to which data should be written and from which data should be read. The pointers can move one location at a time in this illustrative embodiment.

Pixel P0 maps to texels A0, B0, C0 and D0 in the upper map and texels A0, B0, C0 and D0 in the lower map, so these eight texels are interpolated to generate the resultant texel data for pixel P0. For pixel P0, the address of texel A0 in the upper map (i.e., uA0) is written to a first location in the cache access command FIFO 206A, along with an address indicating that texel data FIFO 214A0 should be written with the texel data read from the cache at that address. Next, the write pointer of cache access command FIFO 206A is moved by one location, and the address of texel A0 in the lower map (i.e., lA0) is written to that FIFO next location, along with an address indicating that texel data FIFO 214A1 should be written with the texel data read from the cache at that address. In this manner, the texel data FIFOs 0 and 1 are alternated for the reasons discussed above. The cache access command FIFOs 206B–D are updated in a similar manner relating to texels B0, C0 and D0 in the upper and lower maps.

For pixel P1, texels A1 in the upper and lower maps, respectively stored at addresses uA1 and lA1, need to be interpolated. Since texels A1 in the upper and lower maps are new texels and do not correspond to texels from the previous pixel P0, they will be accessed from the cache. Thus, the texel addresses for these texels are added to the next two locations of the cache access command FIFO 206A, along with the corresponding addresses respectively indicating that the texel data read from those addresses is to be stored in texel data FIFOs 214A0 and 214A1. FIG. 10 represents the cache access command FIFO 206A after having been updated with this information.

Because there are no common A addressed texels for the first two pixels P0 and P1, the cache memory will be accessed to retrieve the texel data for both. The first command is read from the cache access command FIFO 206A, causing the texel data at address uA0 to be read from the cache memory and written to the first location of the texel data FIFO 214A0. Then, the next command is read from the cache access command FIFO and texel data at address lA0 is accessed from the cache and written to the first location of the texel data FIFO 214A1. The next command then is read from the cache access command FIFO and texel data at address uA1 is accessed from the cache and written to the next location in the texel data FIFO 214A0. Finally, the fourth command is read from the cache access command FIFO and the texel data at address lA1 is accessed from the cache and written to the next location of the texel data FIFO 214A1.

For the next pixel P2 to be rendered, texels at addresses uA1 and lA1 need to be interpolated. Because these texels were accessed for previously rendered pixel P1, they are respectively stored in the most recently written entries in texel data FIFOs 214A0 and 214A1. Thus, no new cache access commands for those texels are provided to the cache access command FIFO 206A. Rather, after the resultant texel data for pixel P1 is interpolated, the texel data stored at addresses uA1 and lA1 can respectively be accessed by the texel interpolator from the most recently read locations of the texel data FIFOs 214A0 and 214A1, without having to access the cache. Reading data directly from a FIFO buffer is less time consuming than accessing data from a cache memory. Therefore, the FIFO buffers of the present invention that reduce cache accesses increase system bandwidth.

As discussed above, the texel data FIFOs 214 corresponding to each of interleaves A–D includes separately controlled FIFOs zero and one. The FIFOs are divided in this manner to efficiently implement trilinear interpolation. As should be appreciated from the foregoing, in the above-described embodiment, the texel data FIFOs 214 each provides access to its most recently read entry by maintaining its read pointer to point to the same entry for consecutive reads. Thus, although each interleave alternates between reads of two maps during consecutive read cycles, the separate FIFOs can perform consecutive reads within a single map, allowing the read pointer to point to the same texel data in consecutive accesses to the FIFO.

As each pixel is being operated upon by the tiler/boundary checker 72 and commands are being provided to the cache access command FIFO, commands also are written to the texel interpolator command FIFO 216. For example, when the command to access the texel at address uA0 is provided to the cache access command FIFO for pixel P0, the command New0 is provided to the first location of the texel interpolator command FIFO 216. The command New0 indicates to the texel interpolator that the next texel data from interleave A will be accessed from the cache and provided to the texel data FIFO 214A0, indicating that in order to read the texel data from the FIFO, the texel interpolator should move the FIFO read pointer by one location from the location most recently read.

For the next command provided to the cache access command FIFO that corresponds to texel address lA0, the command New1 is provided to the next location of the texel interpolator command FIFO. The command New1 indicates to the texel interpolator that the next texel data from interleave A is also new and should be read from texel data interpolator 214A1. Similarly, for the commands associated with texel addresses uA1 and lA1 that correspond to pixel P1, the commands New0 and New1 are respectively written to the next two locations of the texel interpolator command FIFO 216.

For pixel P2, since the texel data at addresses uA1 and lA1 is identical to data written to the FIFOs for the previous pixel P1, the commands written to the next two locations of the texel interpolator command FIFO 216 are Old0 and Old1, respectively indicating to the texel interpolator that the next texel data should be re-read from the most recently read locations of the texel data FIFOs 214A0 and 214A1. The Old0 and Old1 commands indicate that in order to read the next texel data from the FIFOs, the texel interpolator should not move the FIFO read pointer from the location most recently read.

FIG. 9 lists three tables: the first table indicating the texels that need to be interpolated for each of the pixels, the second table listing the separate texel data values that need to be stored in the texel data FIFOs A0, B0, C0 and D0; and the third table listing the separate texel data values that need to be stored in the texel data FIFOs A1, B1, C1 and D1. The blank spaces indicate shared texel data previously read from the cache that need not be again read from the cache, and that instead can be accessed from FIFOs. As this chart indicates, when resultant texel data for multiple pixels is interpolated, a large number of cache accesses can be saved by the FIFO scheme of the present invention, resulting in an increase in system bandwidth.

Figure 11:
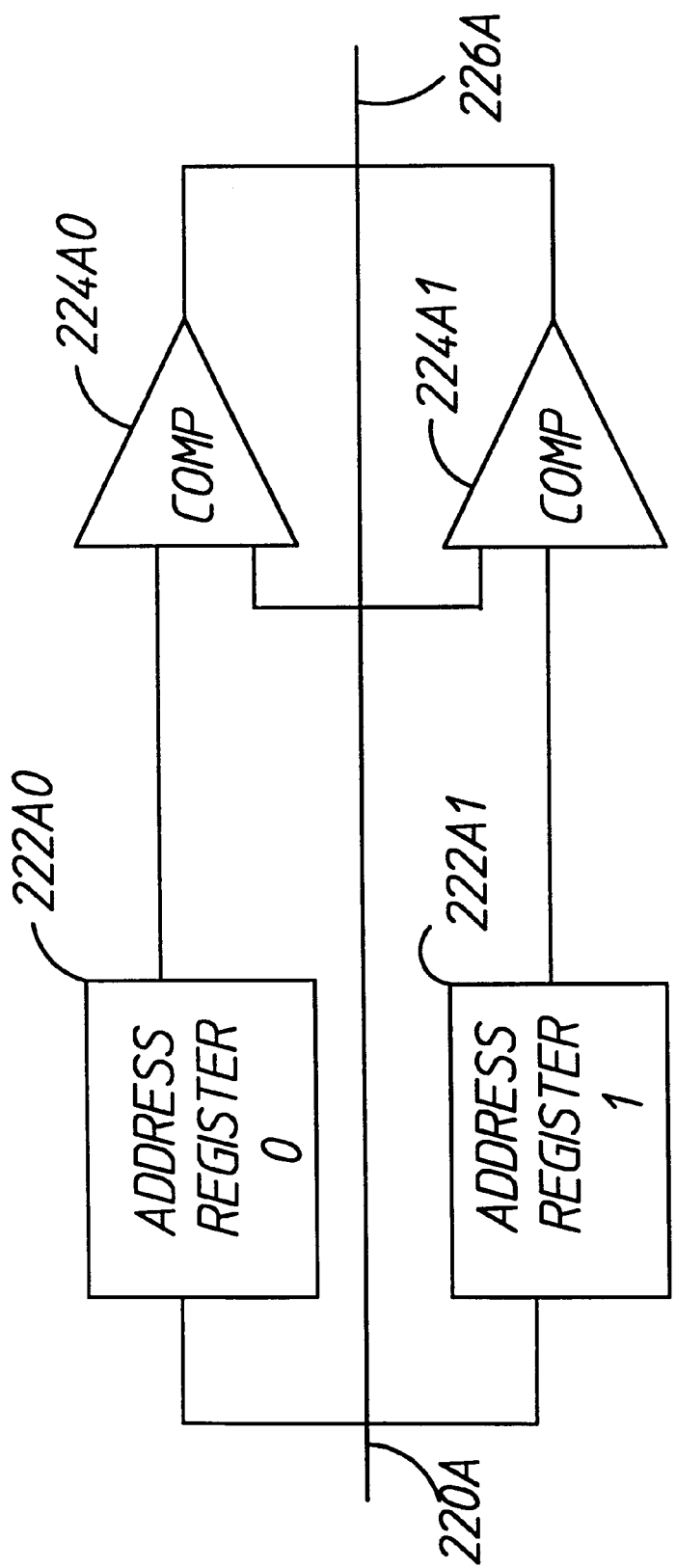
FIG. 11 is a block diagram of a circuit employed by the texture mapping hardware of the present invention.

FIG. 11 is a block diagram of a circuit used by the texture mapping chip to determine whether, in each interleave, texel data to be read for a pixel was read for the most recently rendered pixel. This circuit is used to determine whether to write a new command to one of the cache access command FIFOs to cause new data to be read from the cache or to write a command to the texel interpolator command FIFO indicating that the texel data is old and should be read from one of the texel data FIFOs. FIG. 11 shows only a single circuit that corresponds to interleave A. However, similar circuits are also provided for interleaves B, C and D. The circuit is located within the optimizer element of the tiler/boundary checker. From the interpolated S,T value received by the tiler/boundary checker for each texel to be interpolated, the optimizer provides a texel address (including the block tag and texel address) on bus 220A. The address of the most recently processed texels assigned to texel data FIFOs 214A0 and 214A1 are respectively stored in address registers 222A0 and 222A1. The current texel address is respectively compared with the texel addresses stored in registers 222A0 and 222A1 by comparators 224A1 and 224A1.

When the present texel address does not match either of the addresses stored in registers 222A0 and 222A1, texel data corresponding to that texel address needs to be accessed from the cache memory, and the appropriate command is written to the cache access command FIFO. However, when the texel address matches the address stored in address register 222A0 or 222A1, the texel data will be respectively stored in texel data FIFO 212A0 or 212A1 in the location that will be read by the texel interpolator immediately before accessing the texel data corresponding to the address. Therefore, no cache access command is written to the cache access command FIFO, and a command is written to the corresponding texel interpolator command FIFO indicating that the texel data is old, and should be accessed from the most recently read FIFO location without moving the read pointer.

V. Organization of Blocks of Texture Data

Figure 1:
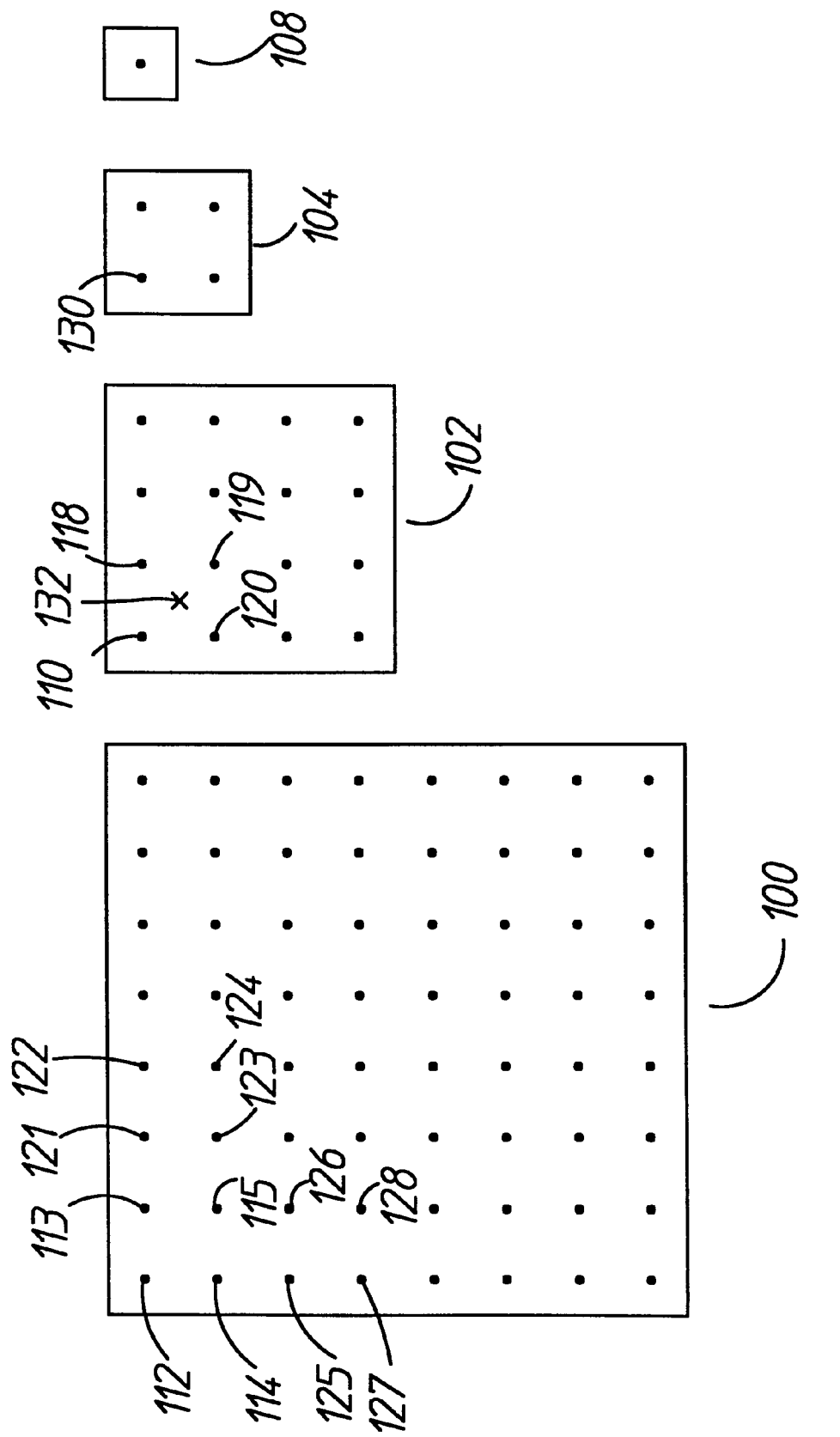
FIG. 1 is a graphical illustration of a set of texture MIP maps.

FIG. 1 shows a series of square texture MIP maps that includes a base map 100 of 8×8 texels. From the base map, each successive map is filtered in size to a smallest size map 108 (i.e., including only one texel). The smallest size map 108 is assigned a map number of zero, and the map number for each successively larger map is incremented by one so that the base map 100 in this example has a map number of three. The map number is used in determining the block tag for each block of texture data in a manner that is described below. According to this map numbering scheme, assuming a square texture base map, a map number of ten corresponds to a map of 1024×1024 texels, a map number of nine represents a 512×512 texel map, a map number of eight represents a 256×256 texel map, and so on. If the texture base map is not square, then a map number of ten corresponds to a map having a larger dimension of 1024 texels. While this discussion assumes a square texture base map, rectangular maps also are possible. If rectangular, the map number is determined by the number of texels of the longer dimension of the map. For example, a rectangular map having a map number of ten has a longer dimension with 1024 texels. It also should be understood that other map numbering schemes can alternatively be used.

A square 1024×1042 texel map that has a map number of ten requires ten bits of S coordinates S[9:0] and ten bits of T coordinates T[9:0] to uniquely identify the location of each texel within the map. Similarly, a map having a map number of nine requires nine bits of both S and T coordinates to identify the location of each texel, a map having a map number of eight requires eight bits of both S and T coordinates to identify the location of each texel, and so on. The S and T coordinates that uniquely identify the location of a texel in a MIP map that correspond to any pixel are interpolated in the manner described above.

As described in greater detail below, texture data is stored in the main memory 17 of the host computer 15 (FIG. 2) in blocks of 256×256 texels. When a cache miss occurs, a read cache tag identifying the block of texture data that missed in the cache is read by the host computer, and that block of texture data is then downloaded to the cache memory 48 of the texture mapping board. In the illustrative embodiment of the invention described, sixty-four blocks of texture data can be stored in the cache memory at any one time. These sixty-four blocks of texture data can include data from multiple MIP maps of one or more textures. Each block has an associated block tag that uniquely identifies it. MIP maps having a map number of nine or larger include greater than 256×256 texels, and therefore are stored in multiple blocks. The high-order S,T coordinates for any map that is stored in multiple blocks are included in the block tag for the blocks of data that store the map.

For example, MIP maps having a map number of nine have one dimension equal to 512 texels and, if square, are 512×512 texels in size. The map is divided into four blocks of 256×256 texels (assuming a square texture map). Therefore, the block tag for each of those blocks includes one high-order S coordinate bit and one high-order T coordinate bit (i.e., S[8] and T[8]) that identify the location of the block within the map. Similarly, MIP maps having a map number of ten are 1024×1024 texels in size, and are divided into sixteen blocks of data. Therefore, the block tags for each of those blocks includes two high-order S coordinate bits and two high-order T coordinate bits (i.e., S[9:8] and T[9:8]) that identify the location of the block within the map.

As described below, in order to reduce system bandwidth during trilinear interpolation, the texture MIP maps are subdivided and stored in memory so that the same portions of adjacent MIP maps are stored in opposite SDRAM banks. In addition, to provide for efficient use of memory space within the cache memory, multiple maps smaller than 256×256 texels can be stored in a single block of cache memory.

Figure 12:
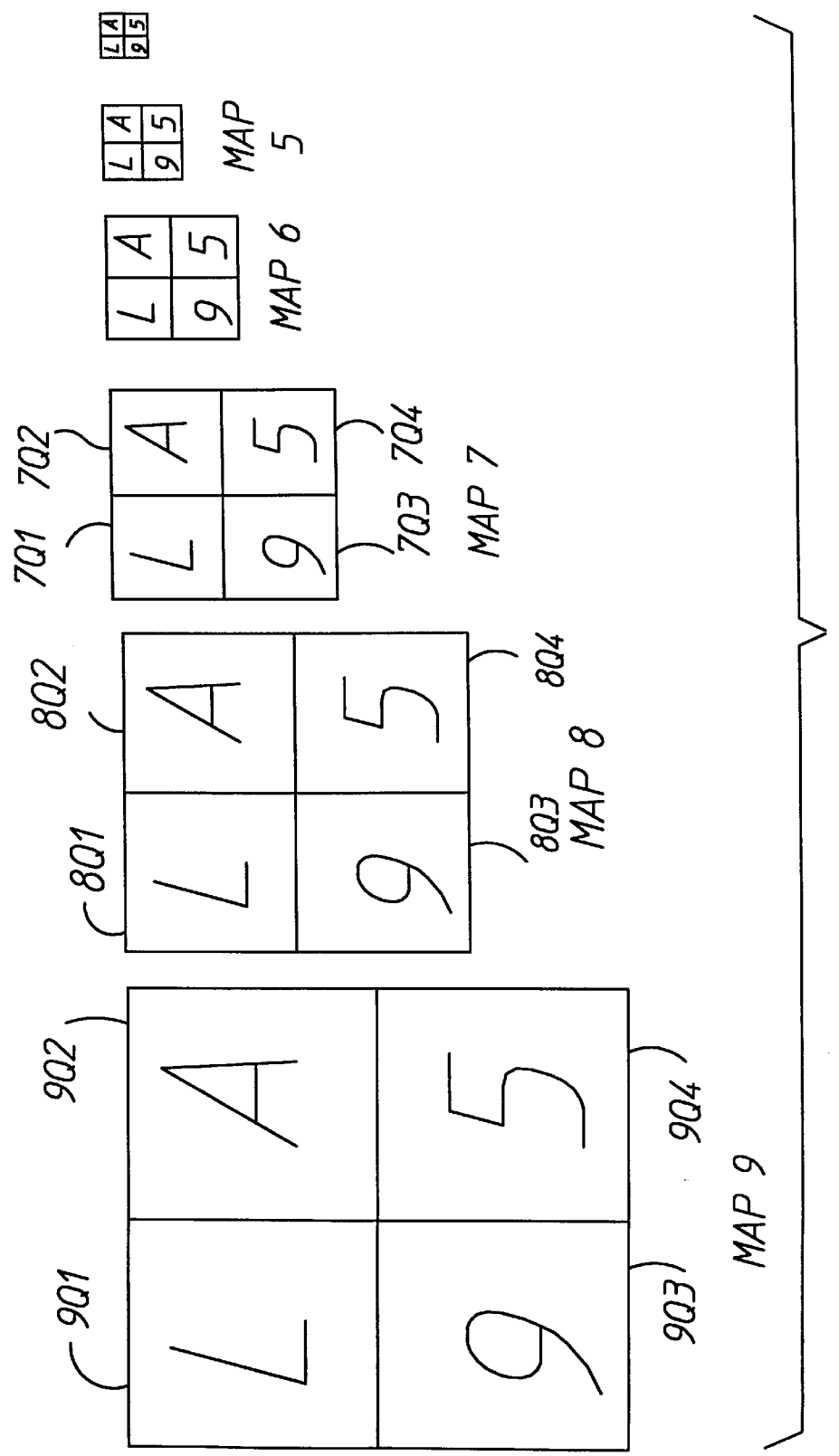
FIG. 12 is a diagram of an example of a set of texture MIP maps.

FIG. 12 shows a set of texture MIP maps for a particular texture including the surface image:

| LA |
|---|
| 95 |

As shown in FIG. 12, each MIP map in the series of MIP maps for a texture is divided into four quadrants that are of equal size for a square texture map. In the example shown in FIG. 12, the base map has a map number of nine, and is divided into quadrants 9Q1 (including image L), 9Q2 (including image A), 9Q3 (including image 9) and 9Q4 (including image 5). Similarly, map number eight is divided into quadrants 8Q1, 8Q2, 8Q3, 8Q4, respectively including images L, A, 9 and 5. Likewise, map number seven is divided into quadrants 7Q1, 7Q2, 7Q3, 7Q4 respectively including images L, A, 9 and 5. The smaller maps are similarly subdivided into quadrants.

Figure 13:
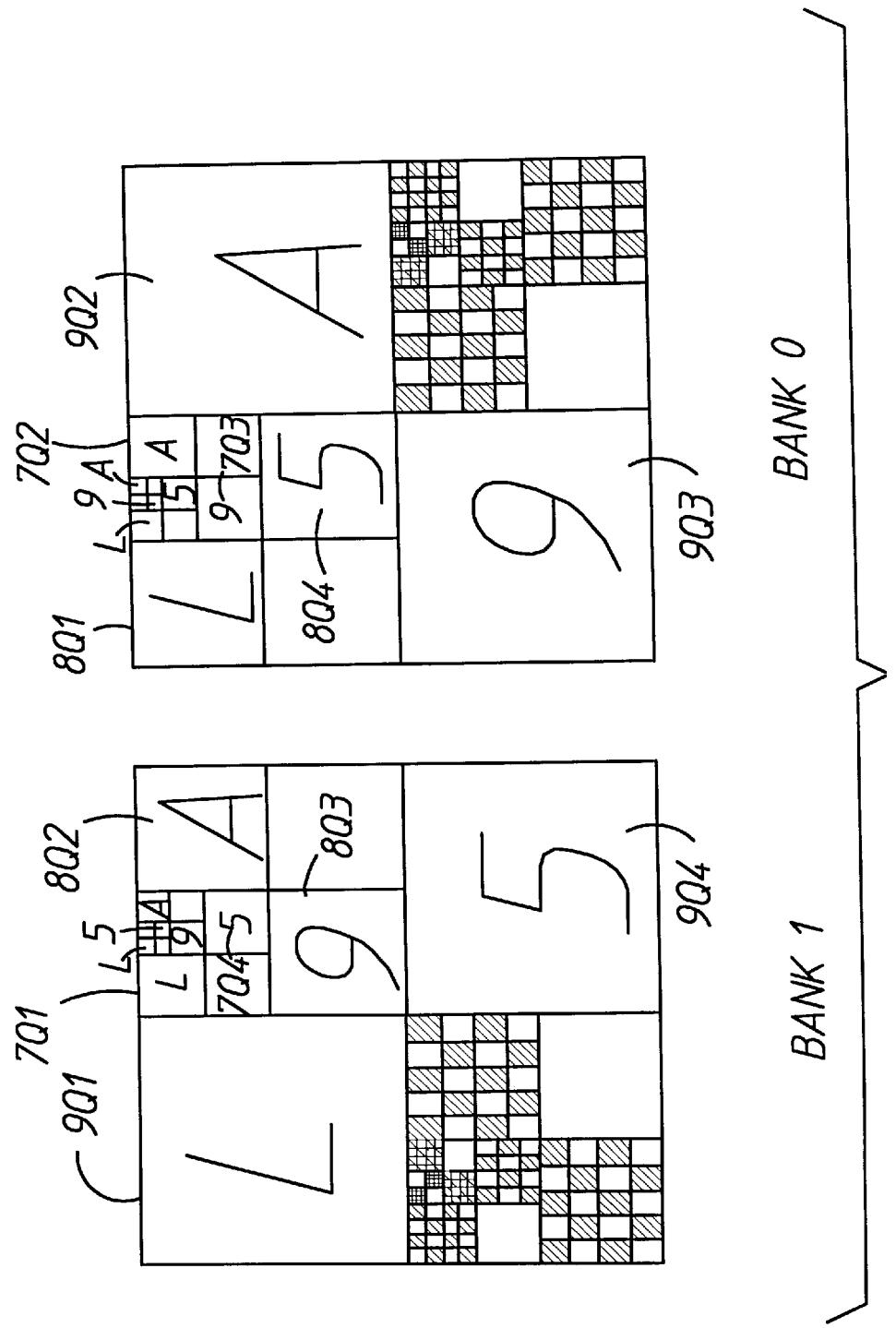
FIG. 13 is a diagram illustrating how the MIP maps of the example of FIG. 12 are stored in memory according to a memory storage scheme of the present invention.

Two quadrants of each MIP map are stored in one bank of the SDRAMs that form the cache, while the other two quadrants are stored in the opposite bank. According to the texture data allocation scheme of the invention, for textures having a base map with a number greater than or equal to eight (being greater than or equal to 256×256 texels in size), the memory locations within the blocks of memory space for all of the quadrants of all of the MIP maps of that texture are predefined. For example, quadrants 9Q1 and 9Q4 of map number nine are stored in separate blocks within cache bank one, and quadrants 9Q2 and 9Q3 are stored within separate blocks of cache bank zero, as shown in FIG. 13. The corresponding quadrants of adjacent MIP maps are stored in blocks within opposite banks. Thus, in this example, quadrants 8Q1 and 8Q4, which respectively include the box filtered texture data of quadrants 9Q1 and 9Q4, are stored in the same block within cache bank zero. Similarly, quadrants 8Q2 and 8Q3, that respectively include the box filtered texture data of quadrants of 9Q2 and 9Q3, are stored in the same block within cache bank one. FIG. 13 is not drawn to scale with respect to FIG. 12. It should be understood that the map quadrants of FIG. 12 are the same size as those of FIG. 13 as they are identical.

Because of the respective sizes of the maps, each quadrant of map number nine occupies a complete block of 256×256 texels, whereas the quadrants of map number eight each occupies only ¼ of a block. Therefore, quadrants 8Q2 and 8Q3 together occupy ½ of the same block and quadrants 8Q1 and 8Q4 occupy ½ of another block within the opposite bank. To efficiently allocate the cache memory space, the unoccupied locations within each of those blocks is occupied by appropriate quadrants of maps having a map number of seven or less. Therefore, all of the maps having numbers zero to eight together occupy two blocks, each of the two blocks being in a separate bank. The locations of the quadrants for the maps having map numbers of eight or less (given a base map having a map number of eight or greater) are predefined in the manner shown in FIG. 13. As shown, the upper right quadrant 8Q2 and lower left quadrant 8Q3 maintain the same physical relationship and respectively occupy the upper right and lower left quadrants of a first block, and the upper left quadrant 8Q1 and lower right quadrant 8Q4 also maintain the same physical relationship and respectively occupy the upper left and lower right quadrants of a second block that is in a different bank from the first block. Also, quadrants 7Q1 and 7Q4 maintain the same physical relationship and respectively occupy the upper left quadrant of the first block, and quadrants 7Q2 and 7Q3 maintain the same physical relationship and respectively occupy the upper right quadrant of the second block.

During trilinear interpolation, if a pixel maps to a position in the texture map that is between four texels in one MIP map and four texels in an adjacent MIP map, then all eight texels are accessed from the cache. The texels accessed from both MIP maps include common texture data, with the data from the smaller map being a filtered version of the data from the larger map. As discussed above, when pixels of an object are being rendered, adjacent pixels will frequently map to the same two MIP maps for the texture, requiring that reads to the cache continuously switch between the cache blocks that store the two maps. By storing common data from adjacent MIP maps in different banks of the cache SDRAM chips, re-paging penalties are not incurred when cache reads switch between the two MIP maps during consecutive read cycles. This provides for efficient implementation of trilinear interpolation.

As should be appreciated from the foregoing, when a texture includes a base map having a map number of eight or greater, the allocation of the MIP maps among the blocks for that texture is predefined in accordance with the described illustrative embodiment of the invention. This is so because two quadrants of a map having a map number eight occupy certain predefined locations of a first block within one of the banks, and the other two quadrants of the map having a map number eight occupy certain opposite predefined locations within another block of the opposite bank, as discussed above and shown in FIG. 13. However, for textures having a base map with a map number of seven or less, multiple locations within the two blocks of memory (one block in each bank) are available to store the maps, and are selected by the host computer. When portions of multiple maps share a single block of data, a sub-texture identification (ID) is assigned in a manner described below to identify the location of each map within the shared block.

In addition to the organization of the series of MIP maps of FIG. 12, FIG. 13 also shows the manner in which a second series of MIP maps from a different texture (i.e., a checkerboard pattern) is allocated among the memory blocks. The MIP maps of this second texture are subdivided and stored in separate blocks of data in the same manner as the first texture. Although the organization of FIG. 13 shows the MIP maps of the different textures as being organized in separate blocks, it should be understood that texture data from two different textures can be stored within the same block.

As discussed above, in one illustrative embodiment, the cache memory can store up to sixty-four blocks of texture mapping data, with each block including 256×256 texels. The cache memory is divided into two banks, with blocks 0–31 lying in bank zero, and blocks 32–63 lying in bank one. The cache directory includes up to sixty-four block tag entries that correspond to the blocks in the cache. The physical location of each block tag within the cache directory identifies the physical location of the corresponding block of texture data within the cache memory. A block index is generated from the block tag that indicates the location of the block. The cache address for any texel in the cache is formed from the block index for the block, and the texel address within the block. The texel address includes the low-order interpolated S,T coordinates for the texel, and may also include bits from the sub-texture ID as discussed below.

FIG. 14 shows an example of a texture MIP map having a map number of nine that is subdivided into quadrants. The MIP map is 512×512 texels in size, and therefore, each quadrant is 256×256 texels in size and corresponds to a single block of memory. In accordance with one embodiment of the present invention, a simple scheme is implemented by the host computer to determine the bank in the cache to which each quadrant of the MIP map should be assigned. As explained below, for each MIP map quadrant, the results of a logical exclusive OR operation on the values of the most significant bits of the S and T coordinates for the quadrant dictate the SDRAM bank in the cache to which the quadrant is assigned.

For a map of 512×512 texels, nine S coordinate bits S[8:0] and nine T coordinate bits T[8:0] specify the location of each texel within the map. The quadrant boundaries are established at the halfway point of the map in both the S and T dimensions, represented by the most significant S and T coordinate bits S[8] and T[8]. Therefore, to determine the cache banks for each of the four quadrants of a MIP map having a map number of nine, an exclusive OR operation is performed for each quadrant on the values of its corresponding most significant S and T coordinate bits S[8] and T[8]. Similarly, for a MIP map having a map number of ten, the cache bank for each quadrant is determined by an exclusive OR operation on the corresponding values of its most significant S and T coordinate bits S[9] and T[9]. For MIP maps having an odd map number, the result of the exclusive OR operation is inverted so that common data from adjacent maps are stored in different banks.

In the example shown in FIG. 14, the blocks labeled block1–block4 correspond respectively to the upper left quadrant, the upper right quadrant, the lower left quadrant and the lower right quadrant of the 512×512 texel map. For block1–block4, bits S[8], T[8] are respectively equal to [0,0], [1,0], [0,1] and [1,1]. Therefore, for block1 the result of the XOR operation S[8] XOR T[8] equals zero. Because the map has an odd map number (i.e., nine), the inverse of this result (equaling one) is used to indicate that block1 is to be stored in bank one of the cache. For block2, the inverse of the result of the XOR operation S[8] XOR T[8] equals zero, indicating that block2 is to be stored in bank zero in the cache. For block3 and block4, the inverse of the result of the XOR operation S[8] XOR T[8] respectively equals one and zero, indicating that block3 is to be stored in bank one and block4 is to be stored in bank zero.

For a map having a map number of ten for the same texture as shown in the example of FIG. 14, the map would be split into sixteen blocks of 256×256 texels each, because the map is 1024×1042 texels in size. For each block, the results of S[9] XOR T[9] would indicate the bank number for that particular block. Note that the result of the XOR operations for each block of the map having a map number of ten are not inverted as they were for the adjacent map having a map number nine, so that the corresponding quadrants in the two maps are stored in different cache banks.

Depending on the size of the map, the block tag for blocks of texture data that represent the map may include at least one high-order S coordinate bit and one high-order T coordinate bit that indicates the location of the block within the particular MIP map. For a 512×512 texel MIP map having a map number of nine, only one S coordinate bit and one T coordinate bit would be required in the block tag to indicate the location of each block within the MIP map. For a 1024×1042 texel MIP map having a map number of ten and including sixteen blocks of data, two S coordinate bits and two T coordinate bits would be required in the block tag to indicate the location of each block within the MIP map. For maps having a map number of eight or smaller, no S and T bits are required in the block tag. When downloading texture MIP map data from the main memory of the host computer to the cache memory, the host computer decodes the upper level S and T coordinate bits of the block tag using the above-discussed exclusive OR scheme to determine the particular bank to which each block of data should be written.

To allocate texture data so that unused memory space is minimized, each block of data can be further subdivided into sixteen sub-blocks of 64×64 texels. Each sub-block of texture data includes a sub-texture ID that identifies the location of the particular sub-block within the block. The sub-texture ID includes two S bits S[1:0] and two T bits T[1:0]. Multiple sub-textures from one or more MIP maps of one or more textures can be stored in a single block.

FIG. 15 illustrates block1 and block2, respectively assigned to banks zero and one of the cache, each subdivided into sixteen sub-textures of 64×64 texels in size. The sub-textures of each block are labeled ST0–ST15, and are identified by a sub-texture ID that includes two S coordinate bits and two T coordinate bits. The sub-textures have consistent labeling but mirror locations within the two cache banks to be consistent with the memory allocation scheme described above. The size of the sub-textures of 64×64 texels is selected to be exemplary and can be altered. For example, a smaller sub-texture would enable more textures to be packed within the same blocks. It should be understood that the sub-texture ID would need to include more bits as the size of the sub-texture is decreased.

During rendering, for each stream of texels to be interpolated, the texture ID, sub-texture ID and 8-bit word representing the size of the base map for that texture associated with those texels is provided through the 3-D pipeline to the tiler/boundary checker which temporarily stores the data in a 20-bit register (not shown). When a texel to be interpolated has a different sub-texture ID or texture ID, the new data is provided to the tiler/boundary checker and stored in the register. The sub-texture ID may be used as part of the texel address, as explained below.

Whether the texel address includes S,T coordinate bits of a sub-texture ID depends on the size of the map being addressed and the size of the base map of that texture. If the map being addressed has a map size of seven or smaller and its corresponding base map is also of size seven or smaller, then certain upper address bits of the texel address include bits from the sub-texture ID to address the location of the sub-texture within the block, as explained in detail below. As explained above, when the base map has a map number of eight or greater, the locations of all of the MIP map quadrants for that texture within their respective blocks of data are predefined. Therefore, when a texel is accessed from one of the maps for that texture having a map number of seven or less, those predefined locations are known and are used to generate the upper bits of the texel address for each quadrant without using the sub-texture ID. However, when the base map of a texture has a map number of seven or less, the locations of the MIP map quadrants are not predefined and the sub-texture ID bits are used as upper bits of the texel address to determine the location of the sub-texture.

As stated above, multiple maps from different textures can be stored within different sub-textures of a single block of data so long as the base map from that texture is small enough. When this occurs, the texture address for each map includes sub-texture ID bits. For example, if four different maps having map numbers of seven from four different textures are allocated among different sub-textures within a block, and the map number for the base map of each texture is seven, then one S coordinate bit and one T coordinate bit from the sub-texture ID would be part of the texel address to distinguish between the textures. The routine by which the tiler/boundary checker computes the texel address is described below with reference to FIG. 17.

In the illustrated embodiment of the invention, texture MIP map data is downloaded one block at a time. However, it should be appreciated that alternatively, a sub-texture ID can be included in the block tag so that sub-textures could be downloaded from the main memory. Also, the sizes of the blocks and sub-textures described in this embodiment are intended solely to be exemplary and can be altered to suit any application.

VI. Cache Block Tag and Block Index

The cache directory includes a block tag for each of its sixty-four entries, and identifies a corresponding block index for each entry. The block index identifies the physical location in the cache where the beginning of the corresponding block of texture data is stored. The block tag is a 23-bit identifier that uniquely identifies each block of texture data in the manner shown in FIG. 16.

To uniquely identify any texel of texture data, the texture to which it corresponds must be identified. In one embodiment of the invention, the texture mapping hardware supports an 8-bit texture ID that uniquely identifies a texture. Additionally, for texture data from different textures stored within the same block, an additional 4-bit sub-texture ID is supported by the hardware to identify the textures. Thus, the texture mapping hardware of the present invention supports $2^{12}$ or four thousand ninety-six unique textures that can be active at any one time.

As discussed above, each texture is represented by a series of MIP maps, and in one embodiment of the invention, each of the MIP maps is provided with a map number indicating its position in the series of MIP maps. Thus, any texel of data is identified not only by the texture ID, sub-texture ID, and size of the base map for that texture, but also by the map number of the MIP map to which it corresponds. Finally, the texel is uniquely identified within the MIP map by its S and T coordinates (i.e., its interpolated S,T value).

Other than the sub-texture ID and the texture map base size, the above-described parameters that uniquely identify a texel are used to generate the 23-bit block tag. With respect to the map number and the S and T coordinates, in one embodiment of the present invention the hardware used to generate the S and T coordinates is limited to fifteen bits. Therefore, for this embodiment, the largest texture map supported by the hardware has a 15-bit S field [14:0] and a 15-bit T field [14:0], resulting in a maximum texture map that is 32K×32K texels in size. As discussed above, each block of texel data includes 256×256 texels. Thus, the low-order S and T bits (i.e., T[7:0] and S[7:0]) are used to identify a particular texel within a block of texel data. Only the high-order S and T bits (T[14:8] and S[14:8]) are used in the block tag to identify a particular block of texel data.

As stated above, each MIP map is assigned a map number uniquely identifying it within the series of maps for its corresponding texture. Irrespective of the number of MIP maps in the series of maps for a texture, the smallest MIP map in the series (i.e., one texel in size) is assigned to be map number zero. Since the largest series of MIP maps for a 32K×32K texture includes sixteen MIP maps, the largest map number supported is fifteen.

The manner in which the block tag is formed is shown in the table of FIG. 16. The high-order eight bits of the block tag [22:15] correspond to the texture ID of the texture represented by the block of texture data. The low-order bits of the block tag [13:00] correspond to the high-order T and S coordinates, T[14:08] and S[14:08]. Block tag [14] corresponds to a map bit that in conjunction with the values in the high-order T coordinate field, enables the identification of the map number. It should be understood that maps smaller than the maximum 32K×32K do not employ the full S and T address fields, such that the smaller the map, the more high-order S and T address bits that are unused. As shown in FIG. 16, for maps having a map number greater than eight, the block tag bit corresponding to the least significant unused T coordinate bit is set to logical "0", and the block tag bits corresponding to the remaining high-order T coordinate bits and the map bit are set to logical "1". For map number fifteen, which uses all of the T coordinate bits, the map bit is set to logical "0". By reading block tag bits [14:07] that correspond to the map bit and the high-order T coordinate bits [14:8], the position of the first logical "0" encountered reading left to right indicates the map number represented by the block tag. If a logical "1" is included in all of block tag bits [14:08], then map numbers eight and less are represented. As described above, all of the maps of a particular texture having a map number of eight or less are stored within two blocks of data, each block being located within a different bank of the cache. Two quadrants, or one half, of each of the maps having map numbers of eight and less are stored within each of the two blocks. Block tag bit [07] represents in which of the two blocks each one-half portion of the maps having map numbers of eight and less is stored. Thus, for each of the maps having a map number of eight or less, the block tag bit [07] has a value of "0" for the one-half (two quadrants) of that map (that is stored in the bank zero block) and has a value of "1" for the other one-half (two quadrants) of that map (that is stored in the bank one block). It should be understood that because all of the maps from a particular texture having a map number of eight or less are stored within two blocks, then only one block tag bit is used to identify those two blocks. The particular map number for each of the maps having a number eight and lower therefore is not stored as part of the block tag field.

The value of block tag bit [07] for each quadrant of each of the maps having a map number of eight or less is computed based on the scheme for determining the bank in which the quadrant should be stored. This scheme includes the logical exclusive OR operation of the values of the MSB bits for each quadrant of even numbered maps and the inverse of the operation for each quadrant of odd numbered maps.

As shown in FIG. 16, the block tag bits [6:0] that correspond to the high-order S address bits are set to logical "0" for small maps when the S address bits are unused, so that if any of these bits is detected as a logical "1" in conjunction with a map number indicating that they should be equal to a logical "0", it can be used to indicate that there is no valid data included in the cache directory entry.

As discussed above, for each MIP map quadrant, the results of a logical exclusive OR (XOR) operation on the values of the most significant S and T coordinates for the quadrant dictate the SDRAM bank in the cache to which the quadrant is assigned. The bank number is equal to this XOR operation for maps having an even map number, and is equal to the logical inverse of the XOR operation for maps having an odd map number. This is shown in the right-hand column of the table of FIG. 23, wherein the symbol "^" indicates an XOR operation, and the symbol "!" indicates a logical inverse. For maps having a map number of nine or greater, each quadrant consumes at least one full block of data, and each block is stored in the bank dictated by the XOR operation shown in the last column of the table of FIG. 16. For maps having a map number of eight or less, all of those maps occupy two blocks of data, one block in each bank. The last two rows of the table of FIG. 16 correspond to different halves (two quadrants) of any map having a map number of eight or less. The block tag bit [07] represents in which of the bank zero block or bank one block the half map is stored. The value of that bit [07] is computed based on the XOR operation described. For example, for a map having a map number eight, for each quadrant of the map, the block tag bit [07] would equal S[7] XOR T[7]. For each quadrant of a map having a map number seven, the block tag bit [07] would equal the inverse of S[6] XOR T[6]. The block tag bit [07] is similarly computed for each quadrant of smaller maps with the result of the XOR operation being inverted for odd numbered maps only. It should be appreciated from the foregoing that because two quadrants of each map (having a map number of eight or less) are stored in the same block, those two quadrants of each map would have the same block tag bit [07].

When a hit occurs between interpolated S,T coordinates (addressing a texel to be accessed) and one of the 23-bit block tags in the cache directory, the cache directory generates a block index identifying the physical location in the cache memory where the cache block containing that texel is stored. The cache stores sixty-four blocks of texel data at any one time. Therefore, to identify a block address in the cache memory, a 6-bit block index ($2^6$=64) is provided which serves as the high-order address bits to the cache, as described above. The texel address is a 16-bit word including bits S[7:0] and T[7:0] that indicates the location of the texel to be accessed within the 256×256 texel block. The texel address is computed from the interpolated S,T coordinates, the map number of the map to be accessed, the texture and sub-texture IDs, and the base map size of the texture, in accordance with a routine discussed below with reference to FIG. 17. As discussed above, the LSB S bit and LSB T bit of the texel address are decoded to determine the appropriate interleave in which the texel is stored. The remaining fourteen bits of the texel address in conjunction with the six block index bits serve as the cache address (with the six bits of the block index being the six MSBs of the cache address) provided to the SDRAM pair within the decoded interleave of the cache.

VII. Texel Address Computation

During rendering, the tiler/boundary checker element 72 receives from the parameter interpolator 64 the interpolated S,T value of the texel to be accessed as well as a 4-bit word that represents the map number of the map from which the texel should be accessed. Each of the interpolated S and T coordinate values received from the parameter interpolator includes sixteen integer bits and eight fractional bits. The 4-bit word representing the map number includes maps ranging from map number zero (one texel in size) to map number fifteen (32 k×32 k texels in size) and is computed from the gradient, as described above. A comparison of the interpolated S,T value with the block tag entries in the cache directory then is performed. If a hit occurs with one of the block tags, then the block index is generated. At the same time as the cache directory search is being performed, the texel address is computed in accordance with the routine described below with reference to the flowchart of FIG. 17.

The texel address is computed by the tiler/boundary checker based on the texture ID, sub-texture ID, map number, base map number and interpolated S,T coordinates of the texel. The tiler boundary checker has all of this information. For each unique texel to be accessed, the tiler/boundary checker receives from the parameter interpolator the interpolated S,T coordinates (including sixteen integer and eight fractional bits for each of S and T) as well as a 4-bit word representing the map number from which the texel is to be accessed. In addition, through the 3-D pipeline (which also comes through the parameter interpolator) is received a command including the 8-bit texture ID, the 4-bit sub-texture ID and an 8-bit word representing the size of the base map for that texture. The 8-bit word that represents the size of the base map includes four S bits and four T bits which correspond to the map numbering scheme of the invention and respectively define the size of the S dimension and T dimension of the base map. For example, each of the 4-bit S and T words can have a value ranging from zero (which corresponds to a dimension of one texel) to fifteen (which corresponds to a dimension of 32 k texels). The twenty bits of data including the texture ID, the sub-texture ID and base map number are temporarily stored in a 20-bit register (not shown) within the tiler/boundary checker until replaced with new and different data for a subsequent texel to be accessed from the cache. With this information, the tiler/boundary checker computes the texel address for each texel.

As explained above, for textures having a base map with a map number greater than or equal to eight (corresponding to a base map of 256×256 texels or greater), the quadrants of each map within that texture have a predefined location within the blocks of texture data and cache memory banks. Thus, each bit of the texel address for any texel of such a texture can be computed in accordance with this known predefined allocation scheme. For textures having a base map with a map number of seven or less (corresponding to a base map of 128×128 texels or smaller), however, a number of distinct memory locations are available for each quadrant of the maps of that texture, and therefore, certain upper level bits of the texel address will include some or all bits (or the inverse of those bits) of the sub-texture ID.

Figure 17:
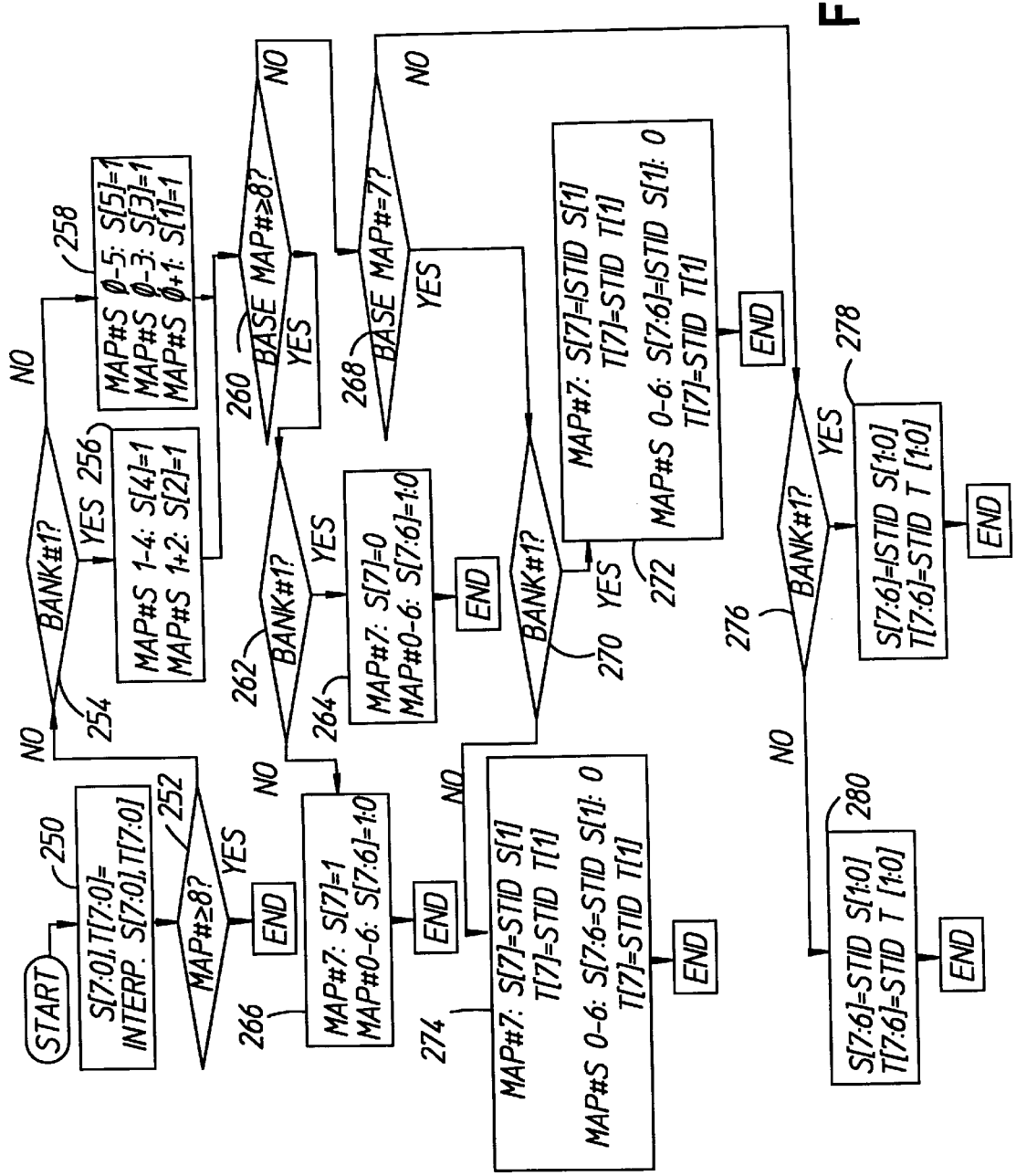
FIG. 17 is a flowchart illustrating a method for determining the texel address with a corresponding texture data block from interpolated texel provided data.

The routine implemented by the tiler/boundary checker to compute the texel address is illustrated by the flowchart of FIG. 17. The routine requires one cycle to complete. The routine may be implemented by a set of logic gates (not shown) that form the boundary checker portion of the texture mapping chip. It should be appreciated by those skilled in the art how to implement the logic gates to perform the routine outlined by the FIG. 17 flowchart. For example, the routine can be written in a software simulation language such as Verilog, and then converted into a logic gate circuit by a synthesis tool such as Synopsys™ operating on a general purpose processor. The routine alternatively can be written in software and performed by a processor.

The routine starts at step 250 where the texel address bits S[7:0], T[7:0] are preset to be equal to the interpolated S,T coordinate bits S[7:0], T[7:0]. Each of the bits of the texel address will remain at the value to which it is preset (equal to the corresponding S or T coordinate) in this step unless reset later in the routine. Then the routine proceeds to step 252 where it is determined whether the particular map within which the texel being interpolated is stored has a map number of greater than or equal to eight. If so, then the routine ends for such a texel and the bit values for the texel address remain as preset equal to the interpolated S,T coordinates.

If the map number is not greater than or equal to eight, then the routine proceeds to step 254 where it is determined whether the texel is stored in bank number one or bank number zero. As described above, it is known whether the texel is stored in bank number one or bank number zero by examining the value of block tag bit [07].

If the texel is stored in bank number one, then the routine proceeds to step 256 where certain texel address bits are reset from their preset values. For maps having map numbers one to four, texel address bit S[4]=1, and for maps having map numbers one and two, texel address bit S[2]=1. If the texel is stored in bank zero, then the routine proceeds to step 258 where, for maps having map numbers zero to five, texel address bit S[5]=1, for maps having map numbers zero to three, texel address bit S[3]=1, and for maps having map numbers zero and one, texel address bit S[1]=1.

From either of steps 256 and 258, the routine proceeds to step 260 where it is determined whether the base map has a map number that is greater than or equal to eight. If so, then the routine proceeds to step 262 where it is determined whether the texel is stored within bank zero or bank one. If the texel is stored in bank one, then the routine proceeds to step 264 where, for a map having a map number of seven, texel address bit S[7]=0 and, for maps having map numbers zero to six, texel address bits S[7:6]=0:1. The routine is then finished for such a texel. For a texel stored in bank zero, the routine proceeds to step 266 where, for a map having a map number of seven, texel address bit S[7]=1 and, for maps having map numbers zero to six, texel address bits S[7:6]=1:0. The routine is then finished for such a texel.

If the base map does not have a map number greater than or equal to eight, then the routine proceeds to step 268 where it is determined whether the base map has a map number equal to seven. If so, then the routine proceeds to step 270 where it is determined whether the texel is stored in bank zero or one. If the texel is stored in bank one, then the routine proceeds to step 272 where, for map number seven, texel address bit S[7] equals the inverse of the subtexture ID bit S[1] and texel address bit T[7] equals subtexture ID bit T[1] and, for maps having map numbers zero to six, texel address bits S[7:6] equal the inverse of subtexture ID bit S[1] and 1, respectively, and texel address bit T[7] equals subtexture ID bit T[1]. The routine then ends for such a texel. If the texel is stored in bank zero, then the routine proceeds to step 274 where, for a map having a map number seven, texel address bit S[7] equals subtexture ID bit S[1] and texel address bit T[7] equals subtexture ID bit T[1] and, for maps having map numbers zero to six, texel address bits S[7:6] equal subtexture ID bit S[1] and 0, respectively, and texel address bit T[7] equals subtexture ID bit T[1]. The routine then ends for such a texel.

If the base map of the texture does not have a map number greater than or equal to eight (determined in step 260), nor a map number equal to seven (determined in step 268), then it is of course known that the base map of the texture has a map number less than or equal to six and the routine proceeds to step 276 where it is determined whether the texel is stored in bank zero or bank one. If the texel is stored in bank one, then the routine proceeds to step 278 where the texel address bits S[7:6] are set equal the inverse of the subtexture ID bits S[1:0] and texel address bits T[7:6] are set equal the subtexture ID bits T[1:0]. The routine then is complete for such a texel. If the texel is stored in bank zero, then the routine proceeds to step 280 where the texel address bits S[7:6] equal the subtexture ID bits S[1:0] and texel address bits T[7:6] equal the subtexture ID bits T[1:0]. The routine is then complete for such a texel.

VIII. Texture Data Organization Examples

The following example describes the procedure by which the host computer organizes texture data in accordance with the above-described embodiment of the invention. For a particular application, a primitive A to be rendered may map to a texture A, and a primitive B may map to a texture B. One possibility would be for the host computer to organize texture A into a plurality of blocks of texture data, and then organize texture B into different sub-textures within the same blocks as texture A. The host computer would download the blocks of texture data including textures A and B into the cache memory before rendering primitives A and B.

Alternatively, the host can organize texture A into a plurality of blocks of texture data, and then download the blocks including texture A into the cache memory. The host computer could then organize texture B in the main memory within different sub-textures in the same blocks as texture A. In this situation, the host computer would issue a command to halt the operation of the texture mapping chip 46 (FIG. 2), and would download the newly organized blocks of texture data (including textures A and B in the same blocks) to the cache memory of the texture mapping system. As should be understood, if the HALT condition were not implemented and the newly organized data from the main memory were not downloaded into the cache memory of the texture mapping system, false texture mapping data could be accessed during the rendering of primitive B. This is so because when rendering primitive B, a hit would occur in the cache directory because the read cache tag for the block of data including texture B would match the block tag corresponding to the blocks of data in the cache that store texture A. However, the blocks of data in the cache store only texture data relating to texture A, not texture B.

IX. Bypass of Three-Dimensional Primitive Pipeline and Interrupt Scheme for Downloading Texture Maps As discussed above, one feature of the present invention enables a MIP map for a new texture to be downloaded to the local memory in the texture mapping hardware through a data path that is separate from the pipeline for handling 3-D primitive data. Referring to the illustrative embodiment disclosed in the figures, the texture mapping board 12 (FIG. 2) and the texture mapping chip 46 (FIG. 3) each has separate ports for respectively receiving 3-D primitive data and texture data. The 3-D primitive data is received from the concentrator chip 36 via bus 18, whereas the texture data is received from the 2-D geometry accelerator chip 34 via bus 24. Therefore, when new texture data is downloaded from the host computer 15 to the texture mapping chip 46, the 3-D primitive pipeline through the front end board 10 and the texture mapping chip 46 need not be flushed, thereby providing increased bandwidth when compared with conventional texture mapping systems which require a flushing of the 3-D primitive pipeline whenever new texture data is downloaded to the local memory in the texture mapping hardware.

The separate data path for downloading texture data that bypasses the 3-D primitive pipeline is particularly beneficial in connection with the above-described embodiment of the present invention wherein the local memory on the texture mapping board 12 is implemented as a cache. As discussed above, when new texture data is downloaded to the cache, only the portion of the MIP map required is downloaded, rather than the entire series of MIP maps for the texture. Thus, the 3-D pipeline bypass enables cache misses to be handled without flushing the pipeline.

As discussed above, in one embodiment of the invention shown in FIG. 2A, portions of the graphics system are duplicated to increase system bandwidth. The texture mapping board 12 is provided with two texture mapping chips 46A and 46B, and two cache memories 48A and 48B. In this embodiment, both cache memories 48 maintain the same texture data at all times, because both of the two texture mapping chips typically operate simultaneously on primitives using the same texture data. Therefore, by updating both caches anytime a miss is received from one, this embodiment of the present invention conserves system bandwidth by ensuring that the same texture data need not be downloaded in separate operations to the two caches.

In the dual texture mapping chip embodiment of FIG. 2A, each cache memory is updated only with texture data downloaded from the host computer, and is not written locally from the texture mapping hardware. Therefore, consistency between the two cache memories is maintained by ensuring that whenever texture data is downloaded from the host computer in response to a miss from one of the caches, both caches are updated with the new texture data. When a cache miss occurs from one of the texture mapping chips 46 and an interrupt is generated, both texture mapping chips 46 are halted so that both cache memories can be updated with the downloaded texture data. Thus, each texture mapping chip is responsive to the generation of a cache miss signal from any of the texture mapping chips to halt operation. Additionally, the present invention supports simultaneous cache misses from the two texture mapping chips 46 to different cache blocks, and responds by downloading both new blocks of texture data to both caches in response to the misses.

In the illustrative embodiment shown in FIG. 2, the bypassing of the 3-D primitive pipeline is accomplished by employing the 2-D primitive pipeline through the 2-D geometry accelerator chip 34 to download texture data. It should be understood that the data path for downloading texture data to the texture mapping chip 46 can be implemented in a number of alternative ways while still bypassing the 3-D primitive pipeline. For example, a dedicated data path can be provided from the host computer to the texture mapping board.

The host computer of the graphics system of the present invention may employ an operating system, such as UNIX, that can have multiple processes operating simultaneously, and that provides some scheme for allowing a process to lock certain system resources, such that a process cannot be interrupted when locked. By using the locking scheme, a process that uses certain hardware resources can ensure that the process will not be swapped out until it unlocks those resources.

In one embodiment of the invention, two types of locks are provided for use by processes, i.e., fast lock and slow lock. When a fast lock is employed, a process being swapped in checks the appropriate hardware resources to determine whether it was the last process to use those resources. If it was, then the process simply continues without restoring the state of the hardware resources. However, if the process was not the last one to use the resources, then a slow lock is requested, which results in the restoration of the hardware resources to the state they were in when the process was last swapped out. It should be understood that a number alternative techniques can be employed to achieve the same results.

In the embodiment of the present invention wherein the 2-D primitive pipeline is used to download texture data while rendering 3-D primitives, 2-D and 3-D processes are not operated simultaneously. This restriction is met by ensuring, through the use of the locking scheme provided by the operating system of the host computer, that no 2-D process begins unless the 3-D pipeline is empty, and that no 3-D process begins unless the 2-D pipeline is empty. When a 3-D process begins, it asserts a lock, and when the preceding process was a 2-D process, waits until the 2-D pipeline is empty before beginning. Similarly, when a 2-D process begins it asserts a lock, and when the preceding process was a 3-D process, waits until the 3-D pipeline is empty before beginning.

Some processes perform both 3-D and 2-D operations, and may switch between 3-D primitives and 2-D primitives without giving up the slow lock. Such processes also implement a scheme for ensuring that the 3-D pipeline is empty before downloading 2-D primitive data to the hardware, and similarly ensuring that the 2-D pipeline is empty before downloading 3-D primitive data. To accomplish this result, register status bits may be provided that indicate whether each of the 2-D and 3-D primitive pipelines is empty. Any process that employs both 2-D and 3-D primitive data reads this status register to ensure that the pipelines are empty before switching between 2-D and 3-D primitive data.

It should be understood that although the illustrative embodiment of the invention disclosed in the figures includes a local memory on the texture mapping board that is implemented as a cache, the invention is not so limited. The texture mapping system can alternatively be implemented so that the local memory on the texture mapping board is not a cache, and other techniques are employed to ensure that each block of texture mapping data needed to render a primitive is downloaded, through a path separate from the 3-D primitive pipeline, before the primitive is rendered, so that the texture mapping data is available from the local memory when the primitive is rendered.

Furthermore, it should be understood that the scheme of the present invention for generating an interrupt to a host computer to update blocks of data in a local memory can be used with many other applications, and is not limited to use in a texture mapping hardware system. This scheme is useful in any data processing system that includes a host computer with a main memory that stores blocks of data to be processed, and data processing hardware having a local memory that stores blocks of data being processed.

X. Cache Block Replacement Scheme

As discussed above, when a miss occurs for a block of texture data that is not in the cache, the host computer downloads to the cache 48 (FIG. 2) the requested block of texture data. If the cache was full when the miss occurred, then one of the cache blocks is replaced by the newly downloaded block of texture data. In one embodiment of the invention, a determination is made as to which cache block was used least recently, and that block is selected for replacement to keep active blocks in the cache. The determination of which cache block to replace is made by a software routine stored in memory 17 in the host computer (15), and operating on a processor 19 in the host computer. The texture mapping chip 46 includes two sets of registers that support the software routine in determining which cache block to replace. When a cache miss occurs, these registers are read by the host computer through the 3-D bypass data path and used in determining which cache block to replace.

The first set of registers includes two 32-bit most recently used registers MRU0 and MRU1 (collectively MRU), which respectively correspond to banks zero and one of the cache 48. Each bit in these registers corresponds to one of the thirty-two cache blocks contained within its corresponding cache bank. Each time a hit occurs to a block in the cache, the corresponding bit in MRU0 or MRU1 is set so that the most recently used registers accumulate hits for the cache.

The second set of registers includes two 32-bit currently used registers CU0 and CU1 (collectively CU), which also respectively correspond to banks zero and one of the cache. When a bit is set in either CU0 or CU1, it indicates that the corresponding cache block is currently in a mini-directory of the cache and should not be replaced. The cache mini-directory is described in detail below.

Figure 18:
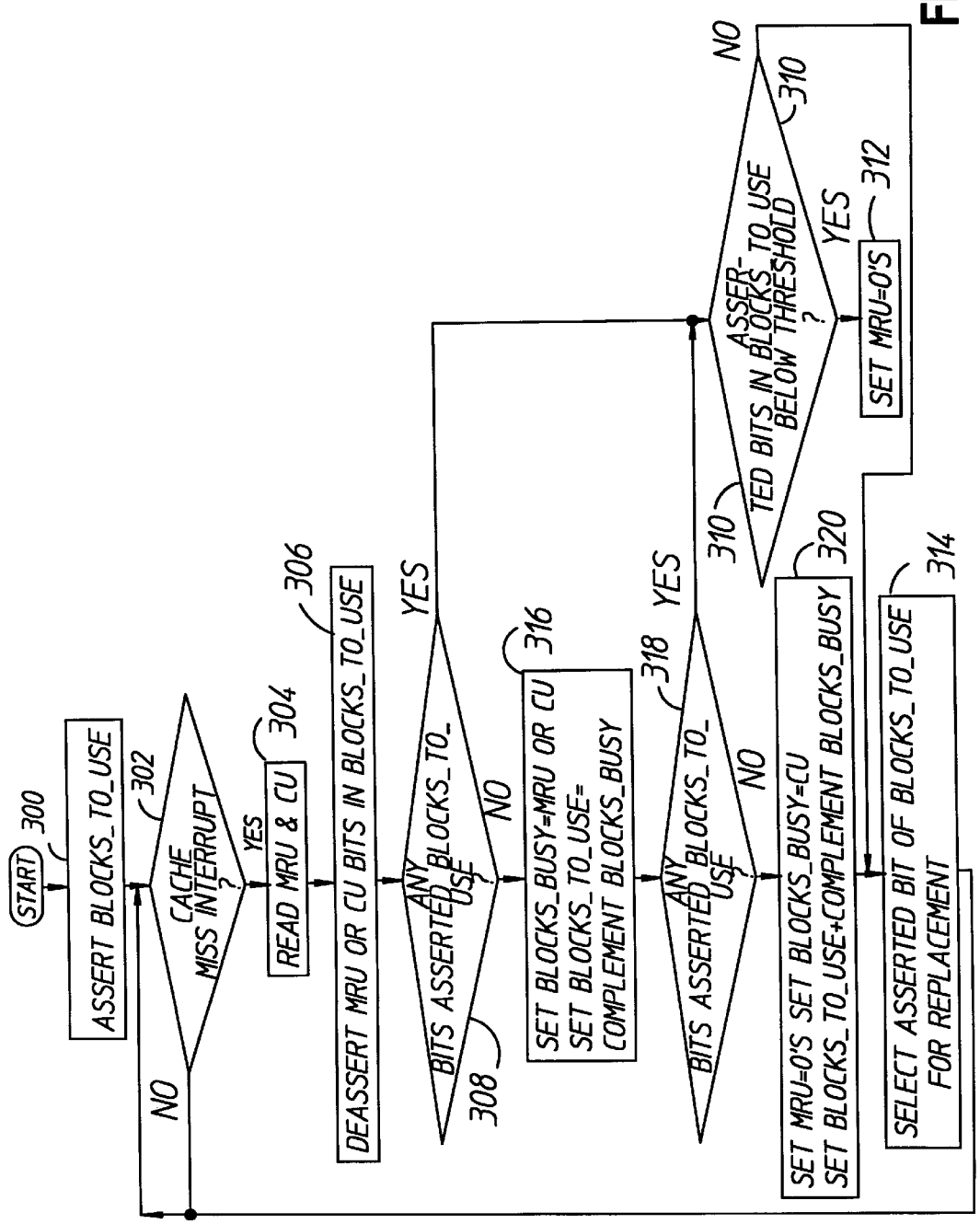
FIG. 18 is a flowchart representing a method for determining which cache block should be replaced when a cache miss occurs.

When a cache miss occurs and interrupts the host computer, the software routine, illustrated in the flowchart of FIG. 18, is executed by processor 19 of the host computer to determine which cache block should be replaced with the one containing the requested texture data to be downloaded. The software routine maintains two 64-bit status words (i.e., BLOCKS_TO_USE and BLOCKS_BUSY) that are used in implementing the replacement routine. Each of the sixty-four status bits in these status words corresponds to one of the sixty-four cache blocks.

As shown in step 300, BLOCKS_TO_USE is initialized such that each of its bits is asserted, indicating that each is initially available for replacement. In step 302, the method continually checks to determine whether a cache miss interrupt has been received, and when one is detected, the method proceeds to step 304. In step 304, the method reads registers MRU and CU through the 3-D bypass data path. As discussed above, in the embodiment of the invention wherein two texture mapping chips are employed, the cache memories in the two chips maintain the same texture data at all times. Thus, if the system includes two texture mapping chips 46, the registers MRU and CU are read from both so that the method can select a cache block least recently used in either texture mapping chip for replacement. In step 306, the method deasserts the bits in BLOCKS_TO_USE that correspond to the bits asserted in either MRU or CU. In the embodiment wherein two or more texture mapping chips are employed, a logical OR of the MRUs and CUs is used to determine which bits in BLOCKS_TO_USE are deasserted.

In step 308, a determination is made as to whether any bits are asserted in BLOCKS_TO_USE, and when at least one is, the method proceeds to step 310, wherein a determination is made as to whether the number of asserted bits in BLOCKS_TO_USE is below a predetermined threshold. This step is performed to assist in the maintenance of a history of cache block usage over multiple cache misses, and to ensure the proper handling of future cache miss interrupts in the manner discussed below. When the number of asserted bits in BLOCKS_BUSY is below the predetermined threshold, the method proceeds to step 312, wherein all of the bits in the MRUs are deasserted. As a result, the MRUs will begin to accumulate hits in the cache that occur only subsequent to the cache miss currently being processed by the method. In one embodiment of the invention, the threshold is established at eleven bits asserted in BLOCKS_TO_USE, indicating that eleven cache blocks are available for replacement.

After the MRUs are cleared in step 312, or when it is determined at step 310 that the number of asserted bits in BLOCKS_TO_USE has not fallen below the predetermined threshold, the method proceeds to step 314, wherein one of the bits asserted in BLOCKS_TO_USE is selected for replacement with the new block of texture data to be downloaded. The block selected for replacement in step 314 is replaced by the new block of texture data in a manner discussed below in connection with the method of FIG. 20. After the block to be replaced is selected in step 314, the method returns to step 302 to await another cache miss interrupt.

When it is determined at step 308 that no bits are asserted in BLOCKS_TO_USE, the method proceeds to step 316, wherein BLOCKS_BUSY is set equal to a logical OR of the MRUs and CUs. Thus, the only bits asserted in BLOCKS_BUSY correspond to those asserted in any of the MRU or CU registers. Thereafter, BLOCKS_TO_USE is set equal to the complement of BLOCKS_BUSY. In this manner, each bit in BLOCKS_TO_USE is asserted, except for those that correspond to the bits asserted in the MRUs and CUs, indicating that those blocks should not be selected for replacement.

After BLOCKS_TO_USE has been set equal to the complement of BLOCKS_BUSY in step 316, the method proceeds to step 318, wherein a determination is made as to whether any bits are asserted in BLOCKS_TO_USE. When at least one bit is asserted in BLOCKS_TO_USE, the method proceeds to steps 310–314, wherein the MRUs are cleared if the number of asserted bits in BLOCKS_TO_USE has fallen below the clearing threshold, and one of the asserted bits in BLOCKS_TO_USE is selected for replacement in the manner described above.

When it is determined at step 318 that no bits are asserted in BLOCKS_TO_USE, the method proceeds to step 320, wherein three actions are taken. First, the MRUs are cleared because the number of bits asserted in BLOCKS_TO_USE has necessarily fallen below the predetermined threshold. Second, BLOCKS_BUSY is set equal to the CU registers. As stated above, each CU register indicates the cache blocks that are currently maintained in its corresponding cache mini-directory, and therefore, should not be replaced. When two or more texture mapping chips are employed, BLOCKS_BUSY is set equal to the logical OR of the CU registers. Finally, BLOCK_TO_USE is set equal to the complement of BLOCKS_BUSY. As a result, each bit of BLOCKS_TO_USE is asserted, except for those that correspond to the blocks of data currently maintained in the cache mini-directory of one of the texture mapping chips. The method then proceeds to step 314, wherein one of the asserted bits in BLOCKS_TO_USE is selected for replacement. In this manner, any of the blocks in the cache other than those in the mini-directory can be selected for replacement.

The embodiment of the present invention shown in FIG. 18 employs a replacement scheme that replaces a least recently used cache block when a cache miss occurs. It should be understood that various modifications can be made to this scheme without departing from the scope of the present invention. For example, in the embodiment shown in FIG. 18, the MRU hardware register is used to collect hits in the cache over a period of time that can potentially include multiple cache misses, and the MRU register is only cleared once the number of bits asserted in BLOCKS_TO_USE has fallen below the predetermined threshold. Additionally, the software status word BLOCKS_BUSY is only updated in step 316 or 320 when it is determined that no bits are asserted in BLOCKS_TO_USE. The replacement scheme can alternatively be implemented by updating BLOCKS_BUSY from the MRU register each time a cache miss interrupt is received, and then clearing the MRU register. In this manner, the software status word BLOCKS_BUSY can be used to accumulate the history of hits in the cache over a period of time that can potentially include multiple cache misses, and the hardware register MRU can be used to only accumulate hits between misses.

Furthermore, although the threshold of asserted bits in BLOCKS_TO_USE that results in the clearing of the MRUs is set at eleven available blocks in the illustrative embodiment described above, it should be understood that this number can obviously be altered. This threshold affects the number of times that the routine will encounter, in step 308, a situation wherein none of the bits in BLOCKS_TO_USE is asserted. It is desirable to avoid that situation, because it results in updating BLOCKS_TO_USE (in step 316 or 320) with only the most recent history of cache block usage, i.e., the history subsequent to the previously processed cache miss. It is preferred to provide a higher degree of resolution, such that the bits asserted in BLOCKS_TO_USE reflect blocks that have not been used through the processing of multiple cache misses, if any such blocks exist. Thus, by controlling the threshold of asserted bits in BLOCKS_TO_USE that results in the clearing of the MRUs, the number of passes through the method wherein none of the bits of BLOCKS_TO_USE will be asserted at step 308 can be minimized, providing a desirable level of resolution in determining a least recently used cache block.

It should be understood that the above-described block replacement scheme, implemented by a software routine executing on a host computer, is not limited to use with a cache memory. This replacement routine can be used in any data processing system wherein a local memory includes blocks of data being processed, and wherein when additional blocks of data are downloaded to the local memory from a host computer, blocks of data within the local memory are replaced.

XI. Disabling Cache Operation

In one embodiment of the invention, a capability is provided to disable the cache operation of the local memory 48 on the texture mapping board by disabling cache misses, so that texture data for any 3-D primitive is downloaded into the memory 48 before it is required during rendering of the primitive. Each texture mapping chip 46 includes a status bit indicating that operation of its local memory as a cache is enabled. When this status bit is asserted, cache misses result in an interrupt of the host computer, and a halting of the texture mapping chip. However, when the status bit is deasserted, the local memory 48 on the texture mapping board does not operate as a cache, and the texture data for any primitive is downloaded into the memory 48 before it is needed by the primitive so that misses to the memory do not occur. In one embodiment of the invention, when the operation of the local memory as a cache is disabled, texture data is downloaded to the local memory on the texture mapping board through the 3-D primitive pipeline to facilitate synchronization of the texture data with the corresponding 3-D primitive data.

XII. Texel Port Registers that Support the Scheme for Downloading Texture Data in Response to a Cache Miss As discussed above, the texture mapping chip 46 (FIG. 2) includes a texel port 92 (FIG. 3) that is used to receive texture data downloaded from the host computer 15. The texel port includes a number of registers that support the downloading of texture data. Some of these registers have been discussed above, including registers MRU and CU. The other texel port registers include a command register, a status register, a texel data register, a directory tag register, a cache address register and a pipe tag register, each of which performs functions discussed below.

Access is provided to the texel port registers to allow them to be written through the 3-D primitive pipeline. The texel port registers can be written even when the 3-D pipeline is busy, with the data for writing the registers being simply placed into the pipeline. Furthermore, the texel port registers may also be accessed through the 3-D pipeline bypass provided over 24-bit bus 24 (FIG. 2). When accessing the texel port registers, eight bits of bus 24 are used as a register address to specify which texel port register is to be read or written, and when data is being written to a texel port register, the other sixteen bits of the bus provide the data.

The organizations of the texel port registers are shown in FIG. 19. In one embodiment of the invention, each of the texel port registers includes 32-bits, even though a number of the bits in some of the registers is unused.

A. Texel Command Register

The texel command register includes a number of bits used by the host computer software routine, discussed in more detail below, that services cache misses. A halt bit 350 is set by the software interrupt handling routine and instructs the texture mapping chip to halt its operation. As stated above, in the embodiment of the invention wherein two texture mapping chips are provided, both texture mapping chips are updated with the same texture data in response to a cache miss from either so that the caches remain consistent. Thus, when a miss is received from either texture mapping chip, both are halted by setting the halt bit 350 in their respective texel command registers. The halt bit is cleared by the software routine that handles the cache miss by writing to the command register to clear the bit after new texture data has been downloaded from the host computer in response to the cache miss.

An interrupt enabled bit 352, when asserted, enables interrupts from the texel port when a cache miss occurs. This bit is deasserted to provide the above-described capability of having the local memory 48 on the texture mapping board 12 (FIG. 2) not operate as a cache.

Write Loki0 and write Loki1 bits 354 and 356 are write enables for the texel port registers. Loki is a shorthand name used to identify the texture mapping chip 46. In the embodiment of the invention where two such chips are used, the chips are respectively referred to as Loki0 and Loki1. When only a single texture mapping chip is employed, it is identified as Loki0. When a command is received over the texel port bus 24 to write to any of the texel port registers, each texture mapping chip (i.e., Loki0 and Loki1) checks its command register to determine whether its write bit is enabled, and if it is, updates its texel port registers in accordance with the received write command. Thus, by controlling the values of the write Loki0 and write Loki1 bits 354 and 356, a software routine operating on the host computer can write to the texel port registers in the two texture mapping chips either separately, or in combination.

Loki read bit 358 enables reads of the texel port registers of one of the texture mapping chips. When a command is received over the texel bus 24 to read a texel port register, only one of the texture mapping chips responds at a time to provide the contents of its texel port register onto the bus. In the embodiment wherein two texture mapping chips are provided, each may be provided with a pin that is hard wired to indicate whether the chip is Loki0 or Loki1. When the Loki read bit is set by software, it indicates that reads are enabled from Loki1, and when the read bit is deasserted, it indicates that reads are enabled for Loki0. It should be appreciated from the foregoing that the format of the texel command register allows it to be written to both texture mapping chips (Loki0 and Loki1) simultaneously with the same data, thereby requiring only a single write cycle to write both command registers.

B. Texel Status Register

The texel port status register includes a dual Loki bit 360 which, when asserted, indicates that the system includes two texture mapping chips. An interrupt enabled bit 362 is asserted whenever bit 352 is asserted in the command register, and indicates that the local memory in the texture mapping chip is operating as a cache that will generate misses that interrupt the host computer when texture data is needed that is not in the cache. This bit is included in the status register as well as the command register so that the status of the texel port can be read by simply reading the status register.

An interrupt valid bit 364 is asserted when an interrupt has occurred from the texture mapping chip and the chip is waiting for new texture data to be downloaded. This bit is cleared when the cache directory tag register (discussed below) is written with a cache tag that matches the cache read tag stored in the pipe tag register (discussed below) which is the tag that missed in the cache.

The status register includes two bits that support the halting of the texture mapping chip when a cache miss occurs. Halt enabled bit 368 is set and cleared by the software routine operating on the host computer whenever the halt bit 350 is respectively set and cleared in the command register, and instructs the texture mapping chip to halt itself when the bit is asserted. This bit is provided in the status register as well as the command register so that the status of the texture mapping chip is stored in a single register. Interrupt valid 368 is set by hardware in the texture mapping chip when a cache miss has occurred and the cache directory is waiting for data to be downloaded. This bit is cleared when the cache directory tag register (discussed below) is written with a cache tag that matches the block tag that missed in the cache.

C. Pipe Tag Register

The pipe tag register stores the last block tag that was indexed by the pipeline in the texture mapping chip. When a cache miss occurs, the pipe tag register stores the block tag 370 that missed in the cache. Thus, by reading the pipe tag register over the texel port bus 24, the software responding to the cache miss interrupt can determine the tag for the cache block that should be downloaded to the cache in response to the miss.

D. Texel Data Register

The texel data register is used to download texture data to the cache 48 when a cache miss occurs. As stated above, each texel is represented by thirty-two bits of data, with one byte 372 representing alpha, one byte 374 representing the red value, one byte 376 representing the green value and one byte 378 representing the blue value.

E. Texel Cache Address Register

The texel cache address register is used to write texel data to the cache and block tags to the cache directory. As discussed above, the cache stores sixty-four blocks of texture data, with each block including an array of 256×256 texels. The texel cache address register includes a 6-bit block index field 380 that identifies the particular one of the sixty-four blocks in the cache to be read or written. In addition, the register includes a 16-bit block address field 382 that identifies the particular texel address being read or written within the block identified in the block index field. When data is downloaded to the texture memory in response to a cache miss, the block index will be set by the software routine using the least recently used replacement scheme discussed above, and the block address field 382 will be initialized to zeros to write the first texel in the block. The cache address register automatically increments the block address field 382 whenever the texel data register is accessed. Thus, the block address field can be incremented through all of the block addresses within the cache block to write the new block of texel data into the cache.

F. Texel Directory Tag Register

The texel directory tag register includes a 23-bit block tag field 384 that represents the cache block tag, and is used to write the cache directory entry defined by the block index field 380 in the cache address register. As discussed above, the twenty-three bits of the cache block tag represent eight bits of texture ID, seven bits of S coordinates, seven bits of T coordinates, and an additional bit that identifies the map number in the series of MIP maps of the map represented by the block of texture data corresponding to the block tag. When a new block of texture data is downloaded from the host computer in response to a cache miss, its block tag is loaded into the directory tag register over the texel bus 24. From the directory tag register, the block tag is written into the cache directory in the entry identified by the block index field 380 of the cache address register. As stated above, when a block tag is written into the directory tag register that matches the tag in the pipe tag register (which is the one whose read resulted in a cache miss) the cache miss interrupt is cleared.

XIII. Software Routine for Servicing Cache Miss Interrupts

Figure 20:
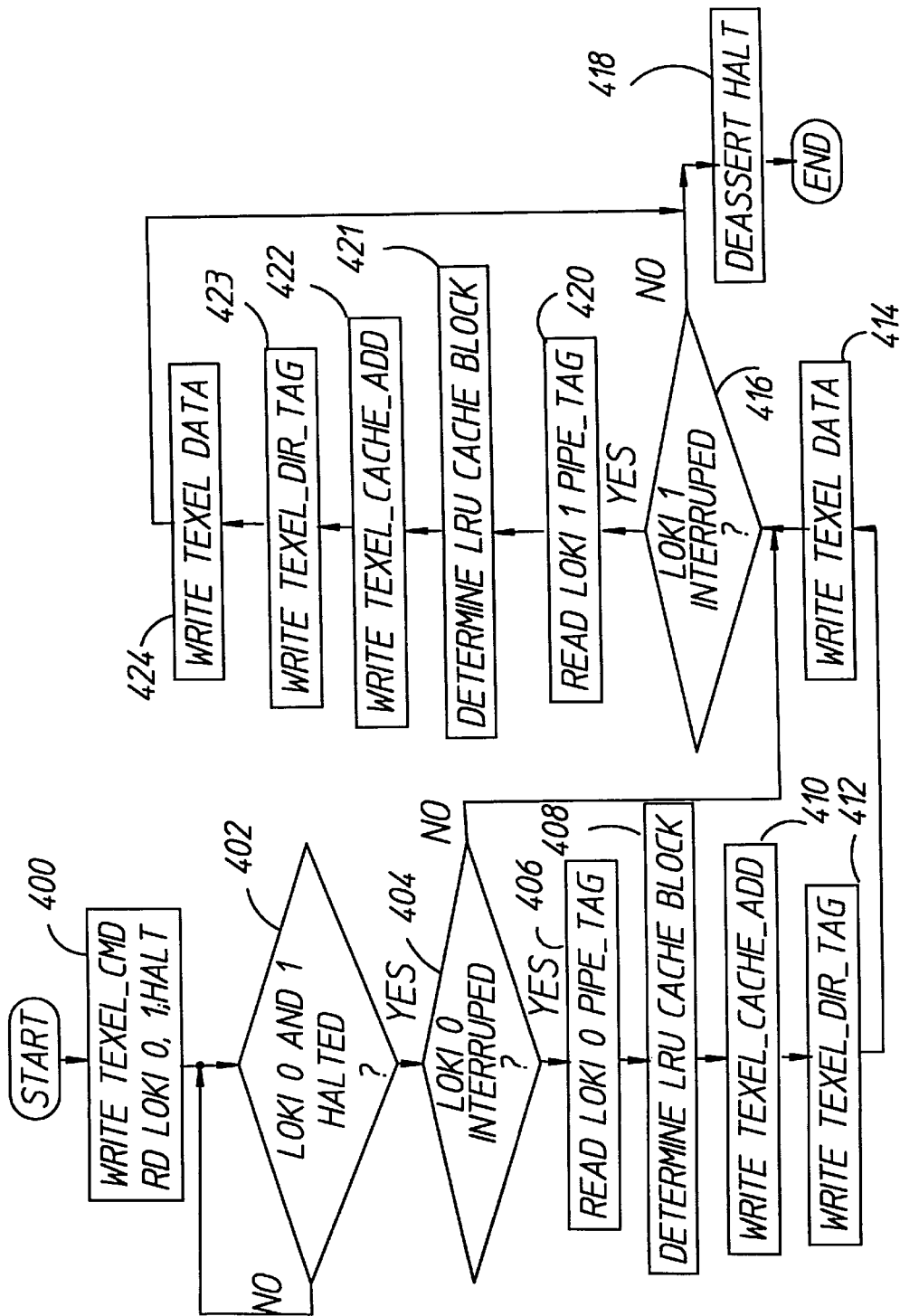
FIG. 20 is a flowchart illustrating a method for servicing cache miss interrupts in the host computer.

As should be appreciated from the foregoing, the texel port registers are used by a software routine, operating on the host computer 15, that services cache miss interrupts to download the necessary texture data. A flowchart of this software routine is shown in FIG. 20. In step 400, the texel command register for both Loki0 and Loki1 is written to set the halt bit 350 in both. The method then proceeds to step 402 to read the halted bit 368 in the texel status registers to determine whether both Lokis have halted. The method continually reads the status registers of Loki0 and Loki1 until it is determined that both have halted, and then proceeds to step 404. When the system includes only a single texture mapping chip 46 (i.e., Loki0), Loki0 also responds to requests to read the texel port registers of Loki1 by providing the contents of its registers on the texel bus 24. Thus, when the software routine checks in step 402 to determine whether both Lokis have halted, Loki0 responds to reads of Loki1, such that when Loki0 has halted, the method will proceed to step 404.

In step 404, interrupt valid bit 364 in the texel status register of Loki0 is read to determine whether Loki0 has interrupted to cause the cache miss, and when it has, the method proceeds to step 406 wherein the pipe tag register of Loki0 is read to identify the block tag of the block of texture data that missed in the cache. The software routine uses this block tag to access the corresponding block of texture data in the memory 17 (FIG. 2) of the host computer, and proceeds to step 408 to determine which block in the cache should be replaced with the new block of texture data to be downloaded. This determination is made using the least recently used scheme described above in connection with FIG. 18.

As stated above, when the system includes two texture mapping chips, the caches in each are maintained to have identical entries. Therefore, texture data downloaded from the host computer in response to a cache miss from one of the texture mapping chips is written to the caches in both chips. Thus, once the cache block to be replaced has been identified, the method proceeds to step 410 wherein the cache address register in Loki0 and Loki1 (if Loki1 exists) is written with the block index determined during step 408. In step 412, the directory tag register is written with the block tag of the block of texture data to be downloaded to the texture cache in response to the cache miss, and in step 414, the texture data is written to the texel data register. In this manner, the method responds to the cache miss by downloading the block of texture data missed in the cache and writing this block of data to the cache.

After the block of texture data is downloaded to Loki0 and Loki1 in steps 406–414, or if it is determined at step 404 that Loki0 did not interrupt, the method proceeds to step 416 wherein a determination is made as to whether the interrupt valid bit 364 in the Loki1 status register has been set, indicating that a cache miss occurred in Loki1. As discussed above, if the system includes only a single texture mapping chip, Loki0 responds to reads of the Loki1 texel port registers. When Loki0 responds to a read of the status register of Loki1, it masks its interrupt valid bit 364 so that the software routine will determine at step 416 that Loki1 did not interrupt. This masking is done so that the software routine will not re-process the interrupt from Loki0 by again downloading the block of texture data that was downloaded in steps 406–414. Therefore, in a system wherein only a single texture mapping chip is provided, the method will determine at step 416 that Loki1 did not interrupt, and will proceed to step 418 wherein the command register in Loki0 will be written to deassert the halt bit 350, enabling the texture mapping chip to proceed with processing the primitives in its pipeline.

When the system includes two texture mapping chips, the method will determine at step 416 whether Loki1 has interrupted, and if it has not, will also proceed directly to step 418 wherein the halt bit will be deasserted in both texture mapping chips, allowing them to proceed with processing primitives. However, when it is determined at step 416 that Loki1 has interrupted in response to a cache miss, the method proceeds through steps 420–424 to process the interrupt in the same manner as was discussed in connection with steps 406–414 for handling the interrupt from Loki0. The method then proceeds to step 418 wherein the halt bits in both texture mapping chips are deasserted.

It should be understood that in a system wherein two texture mapping chips are provided, both chips can generate a cache miss interrupt simultaneously for the same block tag, or for different block tags. When both texture mapping chips generate cache miss interrupts for the same block tag, the interrupt will be processed in steps 400–414. Therefore, in step 416, the method will not detect an interrupt from Loki1, because the interrupt from Loki1 will be cleared by the writing of the missed block tag to the directory tag register of both Lokis in step 412. Thus, the method shown in FIG. 20 is capable of responding to an interrupt from either texture mapping chip individually, or from both simultaneously.

XIV. Cache Mini-Directory and Main Directory

As stated above, in one embodiment of the invention, the cache includes sixty-four blocks of 256×256 texels of data, and a fully associative cache directory that includes sixty-four entries of 23-bit block tags. When the present invention is operating in trilinear interpolation mode, eight texel reads are performed to determine the resultant texel data for a pixel, with four texels in one map being simultaneously read in one read operation, and four texels in the other map being read simultaneously in a second read operation. If the pixel being operated upon maps to a location in a map that is adjacent to a cache block boundary, the four texels read from the cache to generate the resulting texel data within one map can each be in a different cache block. Thus, the simultaneous reading of four texels from the cache for each pixel could require four separate comparisons with the sixty-four block tag entries in the cache directory.

Conventional fully associative caches operate in one of two ways. First, some provide separate hardware comparators for each cache tag entry so that a read tag can be compared with every cache tag entry in a single cycle. Such a technique would incur a large hardware cost in the present invention wherein four reads are done simultaneously, and would require two hundred fifty-six (i.e., 4×64) 23-bit comparators. A second technique employed by conventional fully associative caches uses a single cache tag comparator, and each cache entry is compared serially with the read tag. Such a technique would negatively impact system bandwidth in the present invention, wherein potentially two hundred fifty-six read cycles would be required of the cache directory to determine whether each of the four texels read during a single read operation were present in the cache.

Figure 21:
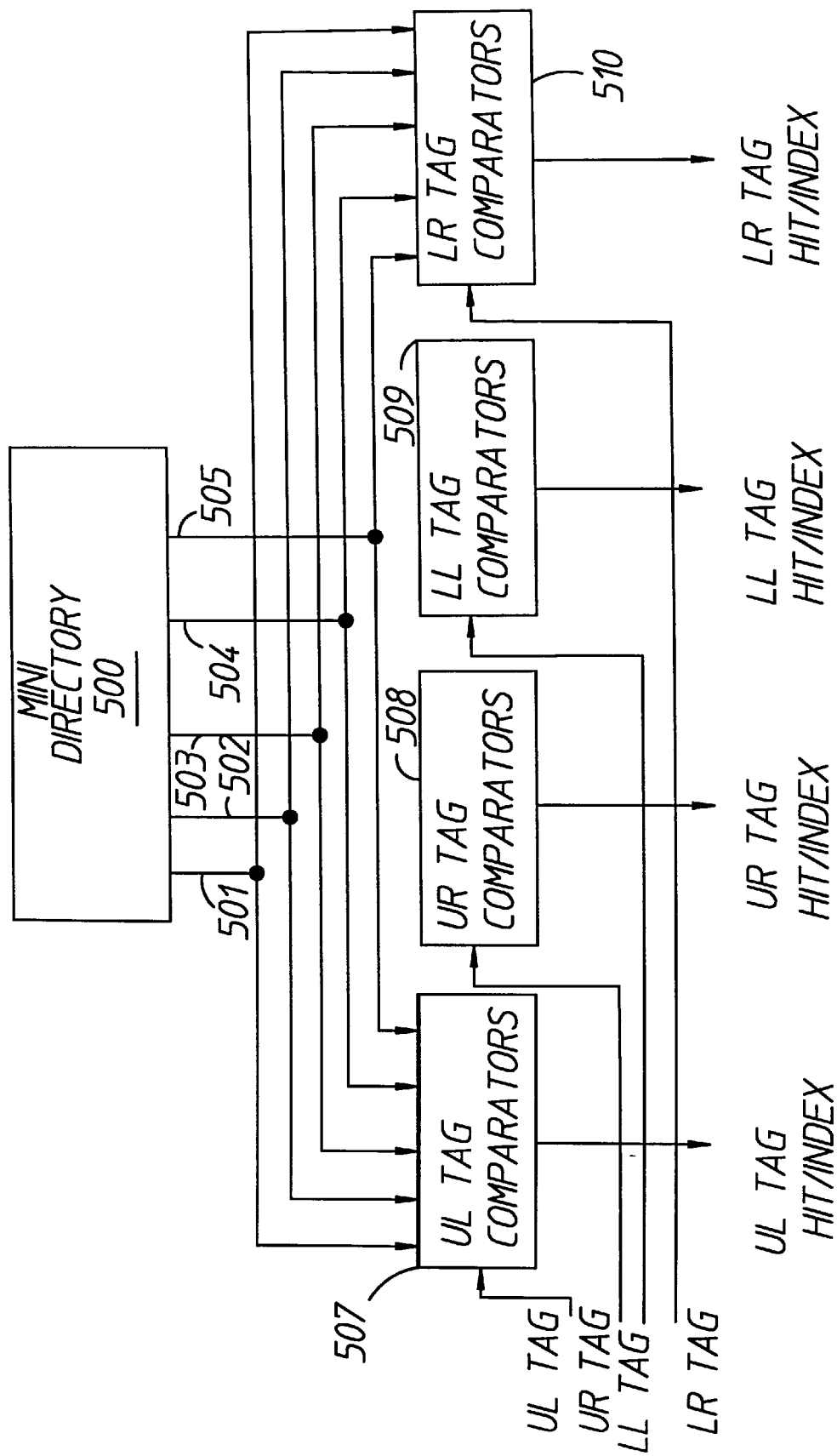
FIG. 21 is a block diagram of the cache mini-directory.
Figure 22:
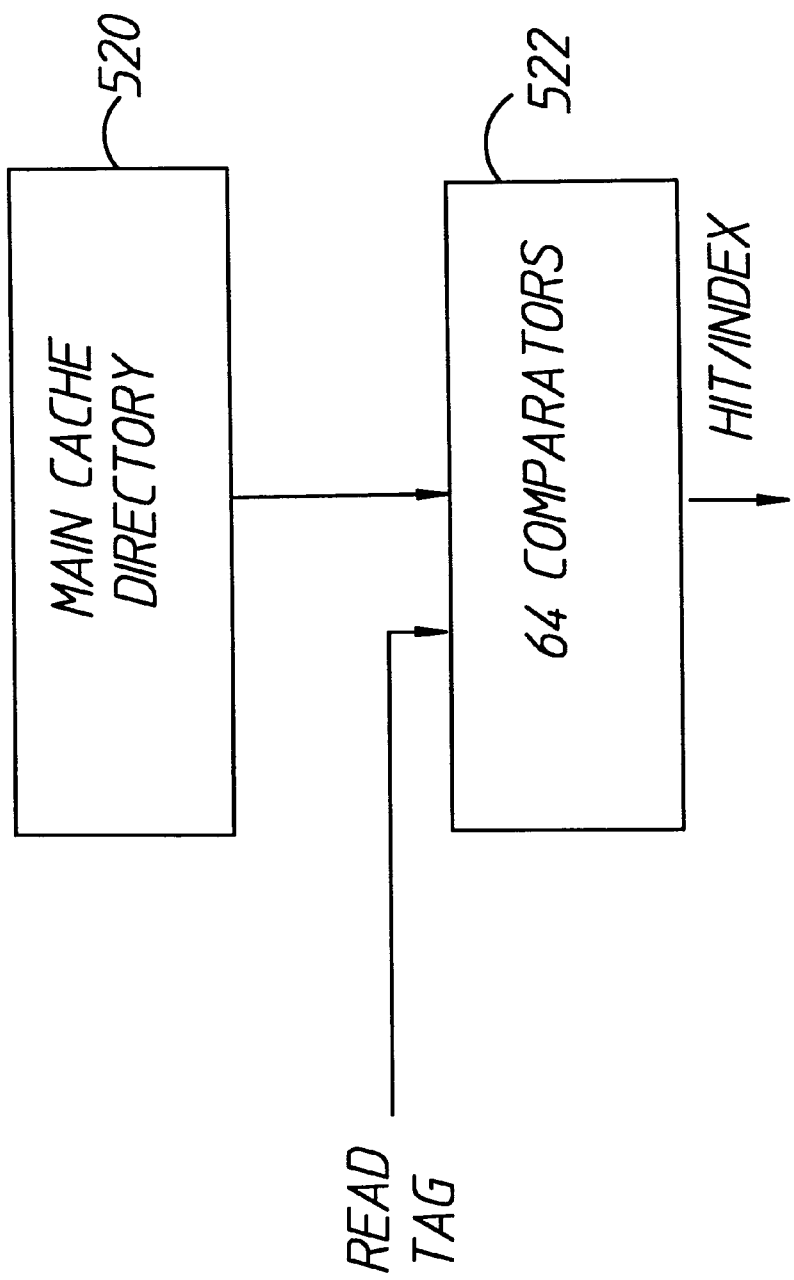
FIG. 22 is a block diagram of the cache main directory.

To overcome these problems, the cache system of the present invention includes both a mini-directory (FIG. 21) and a main directory (FIG. 22). The mini-directory is fully associative and includes the five most recently read cache block tags, as well as a corresponding block index for each. As shown in FIG. 21, the mini-directory 500 includes five entries that are respectively output from the mini-directory over outputs 501–505, each of which is coupled to four groups of tag comparators 507–510. Each group of tag comparators 507–510 includes five 23-bit comparators (not shown), and corresponds to one of the four cache read tags performed in a single read operation when performing bilinear or trilinear interpolation. Thus, the fully associative nature of the mini-directory is implemented with twenty 23-bit comparators, equal to the number of tags simultaneously read, multiplied by the number of entries in the mini-directory.

The four cache read tags read simultaneously for a pixel identify the cache blocks that include the four texels that are closest to the location in the map that the pixel maps to, and are referred to as an upper left (UL) tag, an upper right (UR) tag, a lower left (LL) tag and a lower right (LR) tag. The cache read tags for the upper left, upper right, lower left and lower right texels are respectively connected to groups of upper left, upper right, lower left and lower right tag comparators 507–510. Each group of tag comparators 507–510 compares its corresponding cache read tag against the five block tags stored in the mini directory, and produces a hit output indicating whether the tag matches one of the mini-directory entries, and when it does, also outputs a block index indicating the location in the cache wherein the corresponding block of texel data is stored.

As should be appreciated from the foregoing, if each of the four cache read tags (UL, UR, LL, LR) is in the mini-directory, only a single directory access is required to determine the block indexes identifying the locations in the cache wherein the corresponding four blocks of texel data are stored. Access is made to the main cache directory only if one or more of the read tags is not in the mini-directory. The mini-directory 500 is updated each time a cache read tag misses in the mini-directory, so that at all times the mini-directory 500 includes the block tags of the five most recently accessed blocks of texture data.

If one or more of the four cache read tags does not hit in the mini-directory, access is made to the main cache directory 520 (FIG. 22). As stated above, the main directory includes sixty-four entries, each including a block tag. The main directory is provided with sixty-four 23-bit comparators 522 so that a cache read tag can be compared with the entire main directory in a single cycle. The comparators 522 provide a signal indicating whether the cache read tag has hit one of the entries in the main directory, and when it has, the location of the comparator that matched the read tag is also used to generate a block index identifying where the corresponding block of texel data resides in the cache. If the read tag does not match any of the entries in the main cache directory, a cache miss is generated, causing the host computer to be interrupted to download the requested block of texture data in the manner described above.

Figure 23:
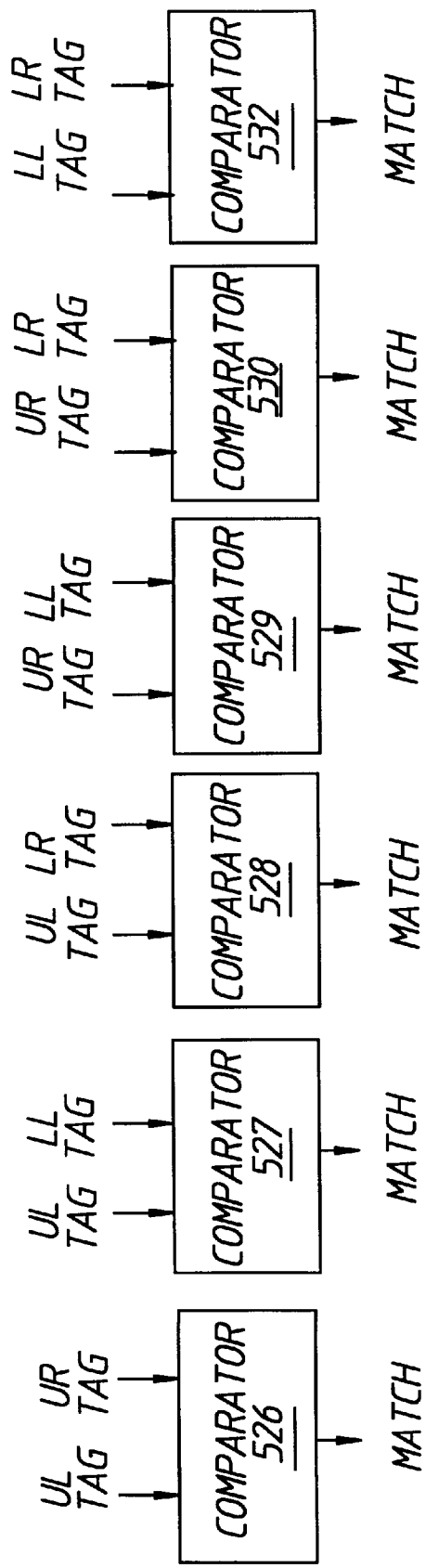
FIG. 23 is a block diagram of a series of comparators provided to reduce performance penalties when a cache read tag misses the mini-directory.

As stated above, the main cache directory 520 is only accessed when one or more of the four cache read tags (UL, UR, LL, LR) does not hit the mini-directory. If two or more of the cache read tags miss the mini-directory, it is desirable to reduce the performance penalty that would be incurred if the main directory needed to be accessed in separate cycles for each cache read tag. To achieve this result, a group of six additional comparators 526–530 is provided in one embodiment of the invention, as shown in FIG. 23. The six comparators compare each of the four cache read tags that are accessed simultaneously against the others to determine whether any are identical. The comparators include comparator 526 that compares the UL tag against the UR tag, comparator 527 that compares the UL and LL tags, comparator 528 that compares the UL and LR tags, comparator 529 that compares the UR and LL tags, comparator 530 that compares the UR and LR tags, and comparator 532 that compares the LL and LR tags.

The comparisons performed by comparators 526–532 can be performed in parallel with other comparisons so as to not incur any performance penalty. For example, these comparisons can be performed during the cycle when the cache read tags are compared to the mini-directory, or during the cycle when a first cache read tag that missed in the mini-directory is compared to the main directory. When it is determined that at least two cache read tags do not hit the main directory and are equal, the outputs of comparators 526–532 are used to indicate that the main directory need only be accessed once for these at least two cache read tags. In this manner, multiple cycles need not be incurred in accessing the main directory for tags that are identical, thereby minimizing the impact on system bandwidth when two or more cache read tags miss the mini-directory.

As should be appreciated from the foregoing, the embodiment of the present invention that utilizes the cache mini-directory effectively balances the competing goals of employing a relatively small amount of hardware to implement the cache directory, while achieving high system bandwidth. The performance penalties incurred when two or more cache read tags miss the mini-directory are application dependent. Although it is possible that two unique sets of four cache read tags may be processed through the mini-directory every two cycles, it is believed that typically only one or two unique block tags will appear in each set of four cache read tags. As discussed above, when pixels of an object are being rendered and trilinear interpolation is employed, adjacent pixels will frequently map to the same two maps for the MIP map, requiring that reads to the cache continuously switch between the cache blocks that store the two maps. In the illustrative embodiment shown in FIG. 21, the mini-directory stores five block tags to ensure that even if four unique cache tags for a currently processed set of read tags is resident in the mini-cache, at least one tag accessed in the previous set of read tags will remain in the mini-directory. Thus, even when switching between two sets of four unique cache tags during trilinear interpolation, at least one of the read cache tags for each set will remain in the mini-directory so that four cache tags will not need to be compared against the main directory in a serial fashion.

During rendering of texels when trilinear interpolation is employed, consecutive reads to the cache will read a first set of four texels in one map, and a second set of four texels in another. As a primitive is rendered, adjacent texels within each of two maps will each be accessed every other cycle, and two or more of the texels will generally be located within a single cache block. Therefore, if only one or two unique tags appear in each set of four cache read tags, a large number of pixels can be rendered with each cache read tag hitting the mini-directory 500. If only one cache read tag in each set of four misses the mini-directory, no performance penalty is incurred because that tag can be compared against the main directory while the next set of four read tags is being compared to the mini-directory.

It should be understood that the cache directory of the present invention, which includes both a main directory and a smaller mini-directory, can be used with many other applications, and is not limited to use in a texture mapping hardware system. The mini-cache directory scheme of the present invention is particularly useful in implementing a fully associative cache and reducing the cost of directory tag comparisons when multiple cache read tags are processed simultaneously, and when cache read tags are correlated to consecutively accessed previously used tags. For example, for a cache memory that stores X tags at any one time, and wherein N cache read tags are compared against the directory block tags simultaneously, it is sufficient to maintain a mini-directory including M tags, wherein M is greater than or equal to N. Each of the M mini-directory tags is compared against the N cache read tags in a single read operation. The main directory is accessed serially for any cache read tag that does not hit in the mini-directory Such read tags are compared against the main directory tags in a single cycle. The hardware savings in terms of comparators from a system wherein each of the X tags in the main directory is compared against the N read tags in a single read operation is dependent on the ratio of $(X+M*N)/(X*N)$.

The performance penalty incurred to achieve this hardware savings is application dependent, based on the behavior of the sequence of tags accessed in consecutive read operations. If no more than one tag in each read set misses the mini-directory, no penalty is incurred as the missed tag can be compared against the main directory in parallel with the next set of read tags being compared against the mini-directory.

With respect to the above-described comparators 526–530 that are used to reduce performance penalties when two or more cache read tags miss in mini-directory, six are used because four read tags are accessed simultaneously. The number of comparators employed to compare each cache read tag against the others is dependent upon the number N of read tags accessed simultaneously, and is equal to a summation of integers from one through N–1.

One illustrative implementation of a cache directory that includes the mini-directory and the main directly of FIGS. 21–23 is shown in FIG. 24. It should be understood that the implementation shown in FIG. 24 is provided merely for illustrative purposes, and that other implementations can also be employed.

The mini-directory entries 501–505 (FIG. 21) are split into a tag component stored in tag registers 501T–505T, and an index component stored in index registers 501I–505I. As discussed above, the cache directory receives a set of four read cache tags that correspond to the four texels (i.e., UL, UR, LL and LR) that are closest to the location in a MIP map that a pixel being operated upon maps to. Each of the four read tags is provided to six tag comparators 541–546. Five of the comparators (i.e., 542–546) are each also respectively coupled to one of the five mini-directory tag registers 501T–505T. For example, comparator 542 is coupled to the tag register 501T for mini-directory Entry1, and produces an output that indicates whether the tag in that entry of the mini-directory matches the tag of any of the read cache tags UL, UR, LL or LR. The comparators 543–546 operate in a similar manner, and respectively compare the read cache tags UL, UR, LL and LR against the tag registers 502T–505T that respectively store the tags for mini-directory Entry2–Entry5. Each new set of four read cache tags is compared against the mini-directory in a single cycle. At the end of that cycle, the four tags UL, UR, LL and LR are respectively stored in registers 550–553. As shown in FIG. 24, each of registers 550–553 is also coupled to a control circuit 559 that receives the outputs of the mini-directory tag comparators 542–546. At the end of the cycle wherein a new set of four read tags is compared against the mini-directory tags, each of registers 550–553 is also loaded with data identifying whether its corresponding tag (i.e., UL, UR, LL, LR) matched one of the mini-directory entries, and if so, which entry was matched.

As discussed above, if only a single cache read tag misses in the mini-directory, that tag is compared against the main directory while a next set of four texel read tags is compared against the mini-directory. When a miss occurs in the mini-directory, the mini-directory is updated to include the tag that missed so that the mini-directory always reflects the five most recently accessed cache tags. During the cycle wherein a read cache tag that missed in the mini-directory is compared against the main directory while a next set of four read tags is compared against the mini-directory, the mini-directory tag registers 501T–505T have not yet been updated to include the cache tag that missed the mini-directory in the previous cycle. Therefore, when the next set of read cache tags is compared against the mini-directory, a sixth comparator 541 is used to compare the four read tags (UL, UR, LL and LR) against the tag that missed in the mini-directory in the previous cycle and is being compared against the main directory. If more than one unique tag in the set of four cache read tags (UL, UR, LL and LR) misses the mini-directory, the pipeline through the cache directory is halted because multiple comparisons will occur with the main directory. However, if only one unique tag misses the mini-directory, the pipeline continues in the following manner so that the cache directory receives a new set of four cache read tags each cycle.

As stated above, the read tags that were compared against the mini-directory in the previous cycle are stored in registers 550–553. The outputs of these registers are coupled to a four-to-one multiplexer 555, which selects one of those registers at a time to be compared against the main directory, and to be loaded into the mini-directory at the end of the cycle so that the mini-directory is updated with the most recently received read cache tags. The output of multiplexer 555 is also coupled to the sixth comparator 541, so that the cache read tag that missed the mini-directory in the preceding cycle is compared against each of the new set of read tags UL, UR, LL and LR. In combination with the comparators 542–546, comparator 541 ensures that the mini-directory compares each set of four cache read tags received by the cache directory against the five most recently received read tags.

As stated above, the cache read tag output from the multiplexer 555 is also loaded into one of the mini-directory tag registers 501T–505T at the end of the cycle wherein it is compared against the main directory. Thus, the mini-directory is updated to include the most recently accessed cache tags. The determination of which entry is written with the new cache tag from multiplexer 555 is made by a replacement scheme discussed below.

The set of six comparators 526–532 discussed above in connection with FIG. 23 is shown as a single comparator block in FIG. 24 for convenience. The outputs of these comparators, as well as the outputs of comparators 541–546, each is provided to control circuit 559, which performs several functions. When a miss to the mini-directory occurs, the control circuit 559 determines which entry in the mini-directory is to be replaced with the new read cache tag. The control circuit 559 does not replace any entry that was hit by one of the four newly received read cache tags being compared against the mini-directory, or the last read cache tag compared against the main directory, and assigns these entries a highest priority for being maintained in the mini-directory. In addition, the control circuit 559 stores state information regarding which mini-directory entries where hit by the preceding set of four read tags, and assigns them the next highest priority for being maintained in the mini-directory. The remaining entries are assigned a lower priority.

The control circuit 559 selects an entry for replacement that is in the lowest priority group that includes at least one entry. Thus, if there is at least one entry in the lower priority group that was not hit by one of the four newly received read cache tags being compared against the mini-directory, was not the last read cache tag compared against the main directory, and was not in the preceding set of four read tags, one of the entries in the lower priority group is selected for replacement. However, if there are no entries in the lower priority group, a larger group of entries is selected that excludes only the highest priority entries (i.e., those hit by one of the four newly received read cache tags and the last read cache tag compared against the main directory), and an entry from that group is selected for replacement.

Once the group of lowest priority available mini-directory entries is identified, a determination of which entry in the group should be replaced is made in accordance with a replacement scheme that cycles through each of the five mini-directory entries each time one is replaced. This can be done in a number of ways. In one embodiment of the invention, the five mini-directory entries are labeled one through five. The entry to be replaced is selected from the lowest priority group by first identifying the highest number entry that is not in the group, and then selecting for replacement the next highest number entry that is in the group. When entry five is not in the lowest priority group, the scheme wraps around so that entry one is treated as the next highest number entry. Through this replacement scheme, the control circuit 559 cycles through the mini-directory entries each time one must be replaced, and controls the loading of the selected mini-directory tag register 501T–505T.

The control circuit 559 also decodes the outputs of comparators 541–546 to generate data for each of the four read tags (UL, UR, LL and LR) indicating whether the read tag matched an entry in the mini-directory, and if so, which entry was matched. This data is stored in the corresponding register 550–553 for each of the read tags UL, UR, LL and LR. For example, if the read tag UL matched mini-directory Entry3, the data decoded by the control circuit 559 would be stored in the UL register 550 to indicate that read tag matched mini-directory Entry3. As discussed below, that data is passed through the cache directory pipeline and indicates that the block index for the UL texel is stored in register 503I, which holds the block index for mini-directory Entry3. When only one unique tag for the set of read tags UL, UR, LL and LR misses the mini-directory, each of the registers 550–553 that stores that read tag is loaded with data indicating that the block index for the corresponding texture data is not in the mini-directory. During the next cycle, the output of one of registers 550–553 that stores the missed tag is compared against the main directory 520, and the block index for the read tag is loaded from the main directory into a register 561 that stores the main directory block index. The data indicating that the block index does not correspond to any entry in the mini-directory is also stored in the register 561 from input 562 that is provided from the output of multiplexer 555.

As described above, the cache memory includes four interleaves A–D so that four texels can be accessed simultaneously. The set of four texel read tags UL, UR, LL and LR can correspond in any manner to interleaves A–D. The data stored in registers 550–553 that identifies which mini-directory entry stores the block index corresponding to each of texels UL, UR, LL and LR is passed through a barrel shifter 563, which is controlled to correlate each of texels UL, UR, LL and LR to its corresponding interleave A–D. The outputs of the barrel shifter are loaded into interleave index control registers 565–568, which respectively correspond to interleaves A–D, and which each identifies the mini-directory entry, if any, that stores the block index for the interleave. When only a single unique read cache tag misses the mini-directory, the shifting of the outputs from registers 550–553 and the loading of registers 565–568 occurs in parallel with the access to the main directory 520.

As stated above, the data loaded into registers 565–568 identifies which, if any, mini-directory entry stores the block index for the corresponding interleave. This data is used to control a plurality of interleave index multiplexers, identified at 571, that select the corresponding block index for each interleave from one of mini-directory index registers 501I–505I and main directory block index register 561. The plurality of interleave index multiplexers 571 represents four independent six-to-one multiplexers. One multiplexer corresponds to each interleave and selects between the five mini-directory index registers 501I–505I and the main directory block index register 561. Each interleave index multiplexer is controlled by the one of registers 565–568 that corresponds to the same interleave and identifies which mini-directory entry stores the block index for the interleave. When this data indicates that the block index for an interleave is not found in any mini-directory entry, the corresponding multiplexer selects the index provided from the main directory block index register 561, which stores a block index read from the main directory following a miss to the mini-directory. The block index for each of interleaves A–D is provided over lines 580–583 and is used to address the cache SDRAMs in the manner described above.

As discussed above, when more than one of the set of read cache tags UL, UR, LL and LR misses the mini-directory but includes only a single unique cache tag, the main directory 520 is only accessed once to provide the block index for that read tag. This process is also controlled by control circuit 559, which uses the outputs of comparators 526–532 to identify whether any two of the four read tags match. If two or more of the set of four read tags miss the mini-directory but include the same cache tag, each of the corresponding registers 550–553 is set by control circuit 559 to indicate that the block index is not included in any mini-directory entry. Thus, when the data corresponding to those read tags is passed into interleave index registers 565–568, each will select the main directory block index control register 561 to be passed through its corresponding interleave index multiplexer 571.

The control circuit 559 also sets a directory control register 573 that controls which of read tag registers 550–553 is to be compared against the main directory. The register 573 controls the multiplexer 555 to select one of the registers 550–553 to be compared against the main directory at a time. If more than one of the read tags UL, UR, LL, LR misses the mini-directory but share a common tag, the control register 573 is set to indicate that only one of the registers should be compared against the main directory. In this manner, the main directory is accessed only once when the set of four read cache tags includes only a single unique tag that misses the mini-directory.

If the set of four read cache tags (UL, UR, LL, LR) includes more than one unique tag that misses the mini-directory, the above-described flow through the cache directory pipeline is altered, and the cache directory becomes busy and does not receive a new set of read tags in the next cycle. The directory indicates that it is busy so that each of the registers 550–553 that includes a read tag that missed the mini-directory can be compared against the main directory and will not be overwritten with a new read tag. Furthermore, the flow through the directory pipeline is altered so that the main directory can be accessed for each read tag that missed the mini-directory, and the block index that corresponds to those can be loaded from the main directory into one of registers 501I–505I or 561. The pipeline is arranged to inhibit the data in any of registers 550–553 from being passed through the barrel shifter 563 until all of the block indexes for the set of read tags (UL, UR, LL, LR) have either been read from the main directory or are already present in the mini-directory. Thus, the set of texels UL, UR, LL and LR are correlated to their corresponding interleaves as a group.

When more than one unique tag in a set of read tags misses the mini-directory, the missed tags are processed serially. During the first cycle (i.e., when the set of tags is compared against the mini-directory), the control circuit 559 determines which entry in the mini-directory is to be replaced by a first missed read tag, and the corresponding register 550–553 is loaded with data indicating that its block index will be stored in that mini-directory entry. When the output of the register 550–553 that stores the first processed miss tag is compared against the main directory 520 during a second cycle, the main directory block index register 561 is updated with the data indicating which mini-directory index register 501I–505I is to be replaced. During a third cycle, the corresponding block index is loaded from the register 561 into the register 501I–505I that corresponds to the mini-directory entry selected for replacement.

Each of the subsequently processed unique tags that missed the mini-directory is handled in the same manner until the last miss tag to be processed, which can be a second miss tag if only two unique tags missed the mini-directory, or can be a third or fourth miss tag. The last miss tag processed through the cache directory is handled as if it were the sole unique tag in the set of read tags to miss the mini-directory. When processing of the last miss tag begins, the directory deasserts the signal indicating that it is busy so that it can receive a new set of read tags.

For the last processed miss tag, the control circuit 559 loads its corresponding register 550–553 with data indicating that the block index for the tag is not stored in any mini-directory entry. This can be done during the first cycle wherein all the read tags are compared against the mini-directory, or in parallel with the processing of the other miss tags. During the cycle wherein the last miss tag is compared against the main directory, the data in registers 550–553 is passed through the barrel shifter 563 and loaded into interleave control registers 565–568, and the block index for the miss tag is loaded from the main directory into the main directory block index register 561. Finally, in the last pipeline stage of the directory, the outputs of the interleave index control registers 565–568 are used to control their corresponding interleave index multiplexers 571, so that the index for the last processed miss tag is provided from the main directory block index register 561, and the block index for each of the other read tags in the set is provided from its corresponding mini-directory index register 501I–505I. It should be understood that by accessing the block index for the last processed miss tag from the main directory block index register 561, a cycle is saved by not waiting for the block index for this tag to be loaded into its mini-directory index register.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A method for allocating data among first and second banks of at least one SDRAM, the data including first, second, and third word sequences to be accessed during consecutive read operations, the method comprising the steps of:

storing the first and third word sequences in a common page within the first bank, the first and third word sequences belonging to a first set of data; and storing the second word sequence within the second bank, the second word sequence belonging to a second set of data, wherein the first set has a predefined correlation to the second set such that the first, second and third word sequences always will be accessed in that order.

2. The method as claimed in claim 1 wherein the step of storing within the first bank includes the step of storing common texture data from every other MIP map of at least one series of texture MIP maps.

3. The method as claimed in claim 2 wherein the step of storing within the second bank includes the step of storing texture data common to the texture data stored in the first bank and from MIP maps adjacent to the every other MIP map.

4. The method as claimed in claim 3 further including, before the steps of storing, dividing each MIP map of the at least one series of MIP maps into at least two map portions.

5. The method as claimed in claim 4 further including, after the step of dividing, the step of allocating the map portions of all of the maps into a plurality of equally-sized blocks of texture data.

6. The method as claimed in claim 5 wherein the steps of storing include the steps of storing the blocks within the first and second banks.

7. A method for accessing first, second and third word sequences from a data storage system respectively during first, second and third consecutive read operations, the method comprising the steps of:

accessing the first word sequence from a page of a first bank of at least one SDRAM during the first read operation;

accessing the second word sequence from a second bank of the at least one SDRAM during the second read operation; and accessing the third word sequence from the page of the first bank of the at least one SDRAM during the third read operation, wherein the first and third word sequences belong to a first set of data, the second word sequence belongs to a second set of data, and the first set has a predefined correlation to the second set such that the first, second and third word sequences always will be accessed in that order.

8. The method as claimed in claim 7 wherein the steps of accessing the first and third word sequences includes accessing texels from one of a plurality of texture MIP maps and wherein the step of accessing the second word sequence includes accessing a texel from a MIP map adjacent to the one MIP map.

9. The method as claimed in claim 7 wherein each step of accessing includes simultaneously accessing a plurality of word sequences from at least one SDRAM within each of a plurality of interleaves of the data storage system.

10. The method as claimed in claim 9 wherein each step of simultaneously accessing includes separately accessing a plurality of texels from one of a plurality of texture MIP maps.

11. A system for storing data including first, second and third word sequences to be accessed during consecutive read operations, the system comprising:

at least one SDRAM, each SDRAM having first and second banks;

wherein the first bank stores the first and third word sequences in a common page and the second bank stores the second word sequence, and wherein the first and third word sequences belong to a first set of data, the second word sequence belongs to a second set of data, and the first set has a predefined correlation to the second set such that the first, second and third word sequences always will be accessed in that order.

12. The system as claimed in claim 11 further including a plurality of separately accessible interleaves, each interleave including at least one SDRAM.

13. The system as claimed in claim 12 further including a plurality of controllers, at least one controller coupled to each interleave, wherein the controllers operate in parallel to separately access data from each of the interleaves.

14. The system as claimed in claim 11 wherein the data further includes a plurality of texture MIP maps, the first and third word sequences including texture data from a first map and a second word sequence including texture data common to that of at least one of the first and third word sequence and from a second map adjacent to the first map.

15. A method for allocating the first and second sets of data among first and second banks of at least one SDRAM comprising the steps of:

dividing each of the first and second sets of data into at least first and second sub-sets of data;

storing the first sub-set of the first set of data and the second sub-set of the second set of data within the first bank; and storing the second sub-set of the first set of data and the first sub-set of the second set of data within the second bank;

wherein the first sub-set of the first set of data has a predefined correlation to the first sub-set of the second set of data such that the data always will be accessed sequentially from the first bank, then from the second bank, then again from the first bank without incurring a re-paging penalty of the SDRAM.

* * * * *